US011584986B1

(12) United States Patent
Abelson et al.

(10) Patent No.: US 11,584,986 B1
(45) Date of Patent: Feb. 21, 2023

(54) AREA SELECTIVE CVD OF METALLIC FILMS USING PRECURSOR GASES AND INHIBITORS

(71) Applicant: The Board of Trustees of the University of Illinois, Urbana, IL (US)

(72) Inventors: John R. Abelson, Urbana, IL (US); Elham Mohimi, Urbana, IL (US); Gregory S. Girolami, Urbana, IL (US); Sumeng Liu, Urbana, IL (US); Zhejun Zhang, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 763 days.

(21) Appl. No.: 16/178,213

(22) Filed: Nov. 1, 2018

Related U.S. Application Data

(60) Provisional application No. 62/580,240, filed on Nov. 1, 2017.

(51) Int. Cl.
*C23C 16/04* (2006.01)
*C23C 16/455* (2006.01)
(Continued)

(52) U.S. Cl.
CPC .......... *C23C 16/04* (2013.01); *C23C 16/0272* (2013.01); *C23C 16/45553* (2013.01);
(Continued)

(58) Field of Classification Search
CPC ................ C23C 16/04; C23C 16/0272; C23C 16/45553; H01L 21/76843;
(Continued)

(56) References Cited

U.S. PATENT DOCUMENTS 5,641,545 A 6/1997 Sandhu
5,654,245 A 8/1997 Allen
(Continued)

FOREIGN PATENT DOCUMENTS

EP 0 989 203 3/2000

OTHER PUBLICATIONS

Silverstein ("pKa Values in the Undergraduate Curriculum: What is the Real pKa of Water?", Silverstein et al, J. Chem. Educ. 2017, 94, 690-695, accessed online Jan. 28, 2022) (Year: 2017).*
(Continued)

*Primary Examiner* — Michael B Cleveland
*Assistant Examiner* — Michael G Miller
(74) *Attorney, Agent, or Firm* — Leydig, Voit & Mayer, Ltd.

(57) ABSTRACT

Provided herein are methods for forming a layer on a substrate wherein the layer is formed selectively on a first region of the substrate relative to a second region having a composition different than the first region. Methods of the invention include selectively forming a layer using an inhibitor agent capable of reducing the average acidity of a first region of the substrate having a composition characterized by a plurality of hydroxyl groups. Methods of the invention include selectively forming a layer by exposure of the substrate to: (i) an inhibitor agent comprising a substituted or an unsubstituted amine group, a substituted or an unsubstituted pyridyl group, a carbonyl group, or a combination of these, and (ii) a precursor gas comprising one or more ligands selected from the group consisting of a carbonyl group, an allyl group, combination thereof.

36 Claims, 16 Drawing Sheets

(51) Int. Cl.
*C23C 16/02* (2006.01)
*H01L 21/28* (2006.01)
*H01L 21/285* (2006.01)
*H01L 21/768* (2006.01)
*H01L 21/02* (2006.01)

(52) U.S. Cl.
CPC .. *H01L 21/02271* (2013.01); *H01L 21/28194* (2013.01); *H01L 21/28562* (2013.01); *H01L 21/76843* (2013.01); *H01L 21/76849* (2013.01); *H01L 21/76895* (2013.01)

(58) Field of Classification Search
CPC ......... H01L 21/28194; H01L 21/76849; H01L 21/28562; H01L 21/02271; H01L 21/76895
See application file for complete search history.

(56) References Cited

U.S. PATENT DOCUMENTS

| | | | |
|---|---|---|---|
| 5,851,367 | A | 12/1998 | Nguyen et al. |
| 6,110,530 | A | 8/2000 | Chen et al. |
| 6,245,655 | B1 | 6/2001 | Moslehi |
| 6,391,769 | B1 | 5/2002 | Lee et al. |
| 6,537,905 | B1 | 3/2003 | Chen et al. |
| 6,613,695 | B2 | 9/2003 | Pomarede et al. |
| 6,638,859 | B2 | 10/2003 | Sneh et al. |
| 6,676,756 | B1 | 1/2004 | Li et al. |
| 6,984,591 | B1 * | 1/2006 | Buchanan ............. H01L 21/288 257/E21.174 |
| 7,041,596 | B1 | 5/2006 | Dalton et al. |
| 7,592,254 | B2 | 9/2009 | Abelson et al. |
| 7,943,527 | B2 | 5/2011 | Kumar et al. |
| 8,110,503 | B2 | 2/2012 | Kumar et al. |
| 8,362,220 | B2 | 1/2013 | Girolami et al. |
| 8,846,146 | B2 | 9/2014 | Abelson et al. |
| 10,103,057 | B2 | 10/2018 | Abelson et al. |
| 2004/0130029 | A1* | 7/2004 | Raaijmakers ....... C23C 16/0272 257/E21.171 |
| 2005/0233562 | A1 | 10/2005 | Adetutu et al. |
| 2006/0029745 | A1 | 2/2006 | Sandhu |
| 2007/0154385 | A1* | 7/2007 | Min ......................... C01G 9/02 423/622 |
| 2008/0223287 | A1* | 9/2008 | Lavoie ............. H01L 21/28562 117/94 |
| 2009/0098343 | A1 | 4/2009 | Arena et al. |
| 2009/0166867 | A1 | 7/2009 | Simka et al. |
| 2010/0048029 | A1 | 2/2010 | Kumar et al. |
| 2010/0078821 | A1* | 4/2010 | Kahlert ............. H01L 21/76849 257/E23.145 |
| 2010/0166981 | A1* | 7/2010 | Dominguez ........ C23C 16/4581 427/576 |
| 2012/0107503 | A1 | 5/2012 | Abelson et al. |
| 2014/0363638 | A1* | 12/2014 | Lobez Comeras ... H01L 21/288 257/E21.174 |
| 2015/0299848 | A1* | 10/2015 | Haukka ..................... C01G 9/02 423/622 |

OTHER PUBLICATIONS

Abelson (Nov. 12, 2014) "Utilizing Inhibitor Molecules in Low Temperature CVD to Control Thin Film Nucleation, Surface Morphology and Conformality in Deep Features," In; The 61st AVS International Symposium & Exhibition. Baltimore, MD.
Ahmed et al. (2000) "CVD Diamond: Controlling Structure and Morphology," Vacuum 56: 153-158.
Alshwawreh et al. (2010) "Recrystallization of Electrodeposited Copper Thin Films During Annealing," Journal of Electronic Materials. 39(11): 2476-2482.
Ang et al. (1995) "Thermal-reactions of MO(CO)$_6$ on metal-oxide surfaces," Journal of the Chemical Society—Dalton Transactions (23): 3753-3758.
Argyle et al. (Feb. 2015) "Heterogeneous Catalyst Deactivation and Regeneration: A Review," Catalysts 5(1): 145-269.
Aron et al. (1982) "Some Properties of R.F.-Sputtered Hafnium Nitride Coatings," Thin Solid Films. 96: 87-91.
Asakura et al. (1990) "Structure and behaviour of Ru$_3$(CO)$_{12}$ supported on inorganic oxide surfaces, studied by EXAFS, infrared spectroscopy and temperature-programmed decomposition," Journal of the Chemical Society, Faraday Transactions 86(14): 2645-2655.
Aspnes (1984) "The Characterization of Materials by Spectroscopic Ellipsometry," Proc. Soc. Photo-Opt. Instrument. Eng. 452: 60-70.
Au et al. (2011) "Filling Narrow Trenches by Iodine-Catalyzed CVD of Copper and Manganese on Manganese Nitride Barrier/Adhesion Layers," Journal of the Electrochemical Society 158(5): D248-D253.
Auroux et al. (1990) "Microcalorimetric study of the acidity and basicity of metal oxide surfaces," The Journal of Physical Chemistry 94(16): 6371-6379.
Auroux et al. (2001) "Acid sites investigation of simple and mixed oxides by TPD and microcalorimetric techniques," Thermochimica Acta 379(1): 227-231.
Awaya et al. (1995) "The Effect of Adding Hexafluoroacetylacetone on Chemical Vapor Deposition of Copper Using Cu(I) and Cu(II) Precursor Systems," Journal of the Electrochemical Society. 142(9): 3173-3179.
Babar et al. (2013) "Growth Inhibitor To Homogenize Nucleation and Obtain Smooth HfB$_2$ Thin Films by Chemical Vapor Deposition," Chem. Mat. 25(5): 662-667.
Babar et al. (2014) "Chemical Vapor Deposition of Copper: Use of a Molecular Inhibitor to Afford Uniform Nanoislands or Smooth Films," ECS J. Solid State Sci. and Tech. 3(5): Q79-Q83.
Babar et al. (2014) "Role of nucleation layer morphology in determining the statistical roughness of CVD-grown thin films," Journal of Vacuum Science & Technology A: Vacuum, Surfaces, and Films 32(6): 060601-1-060601-5.
Babar et al. (Apr. 2015) "Surface-Selective Chemical Vapor Deposition of Copper Films through the Use of a Molecular Inhibitor," ECS J. Solid State Sci. Technol. 4(7): N60-N63.
Baker et al. (2011) "Nucleation and Growth of Pt Atomic Layer Deposition on Al$_2$O$_3$ Substrates Using (Methylcyclopentadienyl)-Trimethyl Platinum and O$_2$ Plasma," Journal of Applied Physics 109(8): 084333-1-084333-10.
Bales et al. (1991) "Macroscopic Model for Columnar Growth of Amorphous Films by Sputter Deposition," J. Vac. Sci. Technol. A. 9(1): 145-149.
Barthes-Labrousse (2002) "Acid-base characterisation of flat oxide-covered metal surfaces," Vacuum 67(3): 385-392.
Basa et al. (1998) "Atomic force microscopy and ellipsometry study of the nucleation and growth mechanism of polycrystalline silicon films on silicon dioxide," J. Vac. Sci. Technol. A. 16(4): 2466-2479.
Blomfield et al. (1971) "Adsorption of ammonia on oxide surfaces," Journal of Catalysis 21(2): 149-158.
Bosman et al. (1996) "An X-Ray Photoelectron Spectroscopy Study of the Acidity of SiO$_2$—ZrO$_2$Mixed Oxides," Journal of Catalysis 161(2): 551-559.
Brenner (1979) "Highly active molybdenum catalyst for alkene hydrogenation," Journal of Molecular Catalysis 5(2): 157-161.
Cardona-Martinez et al. (1990) "Acid strength of silica-alumina and silica studied by microcalorimetric measurements of pyridine adsorption," Journal of Catalysis 125(2): 427-444.
Caro et al. (2013) "Selective self-assembled monolayer coating to enable Cu-to-Cu connection in dual damascene vias," Microelectronic Engineering 106: 76-80.
Chaara et al. (1993) "MOCVD TiN from TDEAT and Ammonia: Experiments and Simulations," Advanced Metallization and Interconnect Systems for ULSI Applications V-08: 159-166.
Chakrabarty et al. (1984) "Preparation of a RU/Al$_2$O$_3$ catalyst from Ru$_3$(CO)$_{12}$ infrared and XPS study," Reaction Kinetics and Catalysis Letters 26(1): 143-147.
Chan et al. (2007) "Plasmonic Properties of Copper Nanoparticles Fabricated by Nanosphere Lithography," Nano Letters 7(7): 1947-1952.

(56) References Cited

OTHER PUBLICATIONS

Chang et al. (2004) "Influence of surface additives iodine and indium on the initial growth in copper chemical vapor deposition," Appl. Surf. Sci. 236: 165-174.
Chi et al. (1997) "Lewis Base Adducts of 1,1,1,5,5,5-Hexafluoro-2,4-Pentandionato-Copper(I) Compounds," Inorg. Syn. 31: 289-294.
Chiou et al. (1995) "The processing windows for selective copper chemical-vapor-deposition from Cu(hexafluoroacetylacetonate)trimethylvinylsilane," Journal of the Electrochemical Society 142(1): 177-182.
Choi et al. (2002) "Effect of the neutral ligand (L) on the characteristics of hexafluoroacetylacetonate (hfac)Cu(I)-L precursor and on the copper deposition process," Thin Solid Films 409: 147-152.
Choi (2004) "Ammonia decomposition over Mo carbides," J. Ind. Eng. Chem. 10(6): 967-971.
Chung et al. (2001) "Adsorption and chemical reaction of Cu(hfac)(vtms) on Cu(111)," Surface Science 482: 312-317.
Cote et al. (1999) "Plasma-Assisted Chemical Vapor Deposition of Dielectric Thin Films for ULSI Semiconductor Circuits," IBM J. Res. Dev. 43: 5-38.
Crowell (2003) "Chemical Methods of Thin Film Deposition: Chemical Vapor Deposition, Atomic Layer Deposition, and Related Technologies," J. Vac. Sci. Technol. A 21(5): S88-S95.
Dong et al. (2014) "Application of three-dimensionally area-selective atomic layer deposition for selectively coating the vertical surfaces of standing nanopillars," Sci Rep 4, Article No. 4458: 1-4.
Dresser et al. (1989) "The Adsorption and Decomposition of $NH_3$, on Si(100)—Detection of the $NH_2(a)$ Species," Surface Science 218(1): 75-107.
Dubois et al. (1992) "Selectivity and copper chemical vapor deposition," Journal of the Electrochemical Society 139(11): 3295-3299.
Elam et al. (2003) "Surface chemistry and film growth during TiN atomic layer deposition using TDMAT and $NH_3$," Thin Solid Films 436(2): 145-156.
El-Kady et al. (2000) "Metallic photonic crystals at optical wavelengths," Physical Review B 62(23): 15299-15302.
Evans et al. (1996) "Adsorption and thermal decomposition of $Mo(CO)_6$ on $TiO_2(110)$," J. Chem. Soc.—Faraday Trans. 92(23): 4733-4737.
Farkas et al. (1993) "Etching of copper and copper oxide at high rates via generation of volatile copper species," Materials Science and Engineering B-Solid State Materials for Advanced Technology 17: 93-96.
Färm et al. (2010) "Selective-Area Atomic Layer Deposition Using Poly(vinyl pyrrolidone) as a Passivation Layer," Journal of the Electrochemical Society 157(1): K10-K14.
Fix et al. (1990) "Solution-phase reactivity as a guide to the low-temperature chemical vapor deposition of early-transition-metal nitride thin films," Journal of the American Chemical Society 112(21): 7833-7835.
Fix et al. (1991) "Chemical Vapor Deposition of Titanium, Zirconium, and Hafnium Nitride Thin Films," Chem. Mater. 3: 1138-1148.
Fix et al. (1993) "Chemical vapor deposition of vanadium, niobium, and tantalum nitride thin films," Chem. Mater. 5 (5): 614-619.
Friese et al. (1997) "Influence of processing parameters on the selectivity in a CVD-process of copper using Cu(I)(hfac)(TMVS)," Microelectron. Eng. 37-38: 157-163.
Fubini et al. (1993) "Structural and induced heterogeneity at the surface of some $SiO_2$ polymorphs from the enthalpy of adsorption of various molecules," Langmuir 9(10): 2712-2720.
Gadkari et al. (2005) "Comparison of the agglomeration behavior of thin metallic films on $SiO_2$," J. Vac. Sci. Technol. A. 23(4): 1152-1161.
Gelest "Copper(I)/(II) Hexafluoro-2,4-Pentanedionate—Vinyltrimethylsilane Complex," Gelest, Inc. Accessible on the Internet at URL: shop.gelest.com/Product.aspx?catnum=AKC252.8&Index=0&TotalCount=31. [Last Accessed Jan. 12, 2016].

George et al. (1995) "Reaction of 1,1,1,5,5,5-Hexafluoro-2,4-pentanedione ($H^+hfac$) with CuO, $Cu_2O$, and Cu Films" and Errata, J. Electrochem. Soc. 142(3): 961-965 & 1732.
George (2010) "Atomic Layer Deposition: An Overview," Chemical Reviews 110: 111-131.
Gesheva et al. (1991) "CVD carbonyl thin-films of tungsten and molybdenum and their silicides—A good alternative to CVD fluoride tungsten technolgy," J. Phys. IV 1(C2): 865-871.
Girolami et al. (1993) "Mechanistic studies of copper thin-film growth from $Cu^I$ and $Cu^{II}$ beta-diketonates," J. Am. Chem. Soc. 115: 1015-1024.
Gissler (1994) "Preparation and Characterization of Cubic Boron Nitride and Metal Boron Nitride Films," Surf. Interface Anal. 22: 139-148.
Gladfelter (1993) "Selective metalization by chemical vapor deposition," Chem. Mat. 5(10): 1372-1388.
Gordon (2004) "Review of Recent Progress in Atomic Layer Deposition (ALD) of Materials for Micro- and Nano- Electronics," Abstr. Pap. Am. Chem. Soc. 227: 3 pp.
Greef et al. (1990) "Ellipsometric and electrochemical characterisation of the nucleation of mercury on glassy carbon," J. Electroanal. Chem. 280: 283-296.
Guiu et al. (1995) "Acidic and Catalytic Properties of $SiO_2$—$Ta_2O_5$ Mixed Oxides Prepared by the Sol-Gel Method," Journal of Catalysis 156(1): 132-138.
Hair et al. (1969) "Adsorption on hydroxylated silica surfaces," The Journal of Physical Chemistry 73(12): 4269-4276.
Hampden-Smith et al. (1995) "Chemical-vapor-deposition of metals: Part 2. Overview of selective cvd of metals," Chem. Vapor Depos. 1(2): 39-48.
Hashemi et al. (2014) "A New Resist for Area Selective Atomic and Molecular Layer Deposition on Metal-Dielectric Patterns," J. Phys. Chem. C.118: 10957-10962.
Heitzinger et al. (2003) "Simulation of Arsenic In Situ Doping with Polysilicon CVD and its Application to High Aspect Ratio Trenches," IEEE Tran. Comput. Aided. Design. 22(3): 285-292.
Hirschler (1966) "The effect of ammonia adsorption on the acidity of silica-alumina and alumina catalysts," Journal of Catalysis 6(1): 1-13.
Hoffman (1994) "Chemical Vapour Deposition of Nitride Thin Films," Polyhedron.13(8): 1169-1179.
Hofmann (1991) "Compositional Depth Profiling by Sputtering," Prog. Surf. Sci. 36: 35-87.
Holzschuh (2004) "Deposition of Ti—B—N (Single and Multilayer) and Zr—B—N Coatings by Chemical Vapor Deposition Techniques on Cutting Tools," Thin Solid Films 469: 92-98.
Houle et al. (1995) "Simulations of Thermal Decomposition and Film Growth from the Group VI Metal Hexacarbonyls," The Journal of Physical Chemistry 99(39): 14477-14485.
Howe et al. (1972) "Infrared-spectra and catalytic activity of supported molybdenum hexacarbonyl," Journal of the Chemical Society—Faraday Transactions I 68: 2266-2280.
Huang et al. (1996) "Thermal and photoinduced chemistry of $Mo(CO)_6$ on clean and chemically modified Ru(001)," Surface Science 365(3): 769-778.
Huang et al. (2014) "Area-Selective ALD of $TiO_2$ Nanolines with Electron-Beam Lithography," J. Phys. Chem. C.118: 23306-23312.
Hugues et al. (1980) "Surface-supported metal carbonyl clusters: formation of $[HFe_3(CO)_{11}]$- by interaction of $Fe_3(CO)_{12}$ and $Fe(CO)_5$ with alumina and magnesia," Journal of the Chemical Society, Chemical Communications (2): 68-70.
Hugues et al. (1982) "Surface organometallic chemistry: formation of $HFe_3(CO)_{11}$- from $Fe_3(CO)_{12}$ and $Fe(CO)_5$ on silica, alumina, magnesia, and zinc oxide," Journal of the American Chemical Society 104(25): 7020-7024.
Hwang et al. (2000) "Surfactant-Assisted Metalorganic CVD of (111)-Oriented Copper Films with Excellent Surface Smoothness," Electrochemical and Solid State Letters 3: 138-140.
Islamraja et al. (1991) "A 3-Dimensional Model for Low-Pressure Chemical-Vapor-Deposition Step Coverage in Trenches and Circular Vias," J. Appl. Phys. 70(11): 7137-7140.

(56) References Cited

OTHER PUBLICATIONS

Jain et al. (1992) "Control of Selectivity During Chemical Vapor Deposition of Copper From Copper (I) Compounds Via Silicon Dioxide Surface Modification," App. Phys. Lett. 61(22): 2662-2664.

Jain et al. (1996) "Chemical Vapor Deposition of Copper from (hfac)CuL (L=VTMS and 2-Butyne) in the Presence of Water, Methanol, and Dimethyl Ether," Chemistry of Materials 8: 1119-1127.

Jayaraman et al. (2005) "Chromium diboride thin films by low temperature chemical vapor deposition," Journal of Vacuum Science & Technology A: Vacuum, Surfaces, and Films 23(4): 631-633.

Jayaraman et al. (2005) "Hafnium diboride thin films by chemical vapor deposition from a single source precursor," Journal of Vacuum Science & Technology A: Vacuum, Surfaces, and Films 23(6): 1619-1625.

Jayaraman et al. (2006) "$HfB_2$ and Hf—B—N Hard Coatings by Chemical Vapor Deposition," Surf. Coat. Technol. 200: 6629-6633.

Jellison et al. (1996) "Parameterization of the Optical Functions of Amorphous Materials in the Interband Region," Appl. Phys. Lett. 69(3): 371-373.

Jeon et al. (1995) "Patterned self-assembled monolayers formed by microcontact printing direct selective metalization by chemical-vapor-deposition on planar and nonplanar substrates," Langmuir 11(8): 3024-3026.

Jeon et al. (1995) "Patterning of dielectric oxide thin-layers by microcontact printing of self-assembled monolayers," J. Mater. Res. 10(12): 2996-2999.

Jeon et al. (1997) "Additive fabrication of integrated ferroelectric thin-film capacitors using self-assembled organic thin-film templates," Adv. Mater. 9(11): 891-895.

Jeon et al. (1997) "Selective Chemical Vapor Deposition of Platinum and Palladium Directed by Monolayers Patterned Using Microcontact Printing," Langmuir 13(14): 3833-3838.

Johansson et al. (1984) "Structure of Reactively Magnetron Sputtered Hf—N Films," Appl. Phys. Lett. 44(7): 670-672.

Josell et al. (2002) "Superconformal Deposition by Surfactant-Catalyzed Chemical Vapor Deposition," Electrochemical and Solid State Letters 5(3): C44-C47.

Josell et al. (2003) "Interconnect Fabrication by Superconformal Iodine-Catalyzed Chemical Vapor Deposition of Copper," J. Electrochem. Soc. 150(5): C368-C373.

Joulaud et al. (2002) "Evaluation of (hfac)Cu(MHY) for Cu CVD," Microelectronic Engineering 64: 107-115.

Joulaud et al. (2003) "Structural Comparison Between Cu(hfac)(VTMS) and Cu(hfac)(MHY): An Answer to Differences in Copper Film Deposition," In; The Proceedings of the Electrochemical Society Aug. 2003: 1268-1274.

Kajikawa et al. (2005) "Growth mode during initial stage of chemical vapor deposition," Applied Surface Science. 245: 281-289.

Kaplan et al. (1970) "The Deposition of Molybdenum and Tungsten Films from Vapor Decomposition of Carbonyls," Journal of the Electrochemical Society 117(5): 693-700.

Karabacak (2011) "Thin-film Growth Dynamics with Shadowing and Re-Emission Effects," Journal of Nanophotonics. 5(1): 052501-1-052501-18.

Kim et al. (1994) "Selective deposition of copper by chemical vapor deposition using $Cu(HFA)_2$," J. Vac. Sci. Technol. A. 12(1): 153-157.

Kim et al. (1998) "Deposition mechanism of MOCVD copper films in the presence of water vapor," Thin Solid Films 330: 190-195.

Kim (2003) "Atomic Layer Deposition of Metal and Nitride Thin Films: Current Research Efforts and Applications for Semiconductor Device Processing," J. Vac. Sci. Technol. B 21(6): 2231-2261.

Kim (2006) "The Application of Atomic Layer Deposition for Metallization of 65 nm and Beyond," Surface & Coatings Technology. 200: 3104-3111.

Kim et al. (2007) "Comparative study of Cu-CVD seed layer deposition on Ru and Ta underlayers," Journal of the Electrochemical Society 154(1): G13-G17.

Kim et al. (2008) "Ultrathin CVD Cu Seed Layer Formation Using Copper Oxynitride Deposition and Room Temperature Remote Hydrogen Plasma Reduction," Journal of the Electrochemical Society 155(7): H496-H503.

Kim et al. (Mar. 2016) "A Process for Topographically Selective Deposition on 3D Nanostructures by Ion Implantation," ACS Nano 10(4): 4451-4458.

Klaus et al. (2000) "$SiO_2$ chemical vapor deposition at room temperature using $SiCl_4$ and $H_2O$ with an $NH_3$ catalyst," Journal of the Electrochemical Society 147(7): 2658-2664.

Kodas et al. (1991) "Selective low-temperature chemical vapor deposition of copper from (hexafluoroacetylacetonato)copper(I)tri methylphosphine, $(hfa)CuP(Me)_3$," Advanced Materials 3(5): 246-248.

Koichi et al. (1976) "Nature of Catalytically Active Sites over Solid Acids. I. Selective Poisoning of Lewis Acid Sites on Silica-Alumina with Pyridine and Its Application to Olefin Polymerization," Bulletin of the Chemical Society of Japan 49(7): 1788-1793.

Kosmulski (Dec. 2016) "Isoelectric points and points of zero charge of metal (hydr)oxides: 50 years after Parks' review," Advances in Colloid and Interface Science 238: 1-61.

Kuech et al. (1991) "Selective epitaxy of GaAs, $Al_xGa_{1-x}As$, and $In_xGa_{1-x}As$," Journal of Crystal Growth 107: 116-128.

Kumar et al. (2008) "Growth Inhibition to Enhance Conformal Coverage in Thin Film Chemical Vapor Deposition" and supporting information, J. Am. Chem. Soc. 130(52): 17660-17661.

Kumar (2009) "Control of reaction surface in low temperature CVD to enhance nucleation and conformal coverage," PhD Thesis, University of Illinois at Urbana-Champaign, 147 pp.

Kumar et al. (2009) "Low Temperature Chemical Vapor Deposition of Hafnium Nitride-Boron Nitride Nanocomposite Films," Chem. Mater. 21(23): 5601-5606.

Kumar et al. (2009) "Remote Plasma Treatment of Si Surfaces: Enhanced Nucleation in Low-Temperature Chemical Vapor Deposition," Applied Physics Letters. 95: 144107-1-144107-3.

Kung (1984) "Formation of new acid sites in dilute oxide solid solutions: A predictive model," Journal of Solid State Chemistry 52(2): 191-196.

Kwak et al. (2002) "Substrate and pretreatment dependence of Cu nucleation by metal-organic chemical vapor deposition," Current Applied Physics 2: 205-211.

Lavalley (1996) "Infrared spectrometric studies of the surface basicity of metal oxides and zeolites using adsorbed probe molecules," Catal. Today 27(3): 377-401.

Lercher et al. (1996) "Infrared studies of the surface acidity of oxides and zeolites using adsorbed probe molecules," Catal. Today 27(3): 353-376.

Liao et al. (Jun. 2016) "Precursor dependent nucleation and growth of ruthenium films during chemical vapor deposition," J. Vac. Sci. Technol. A 34(4): 041514-1-041514-7.

Li et al. (2006) "Thin, Continuous, and Conformal Copper Films by Reduction of Atomic Layer Deposited Copper Nitride," Chemical Vapor Deposition 12: 435-441.

Lim et al. (2003) "Atomic Layer Deposition of Transition Metals," Nature Materials 2: 749-754.

Lin et al. (1993) "Surface-selective deposition of palladium and silver films from metal-organic precursors: a novel metal-organic chemical vapor deposition redox transmetalation process," J. Am. Chem. Soc. 115(24): 11644-11645.

Lin et al. (1996) "Mechanistic Studies of Palladium Thin Film Growth from Palladium(II) β-Diketonates. 2. Kinetic Analysis of the Transmetalation Reaction of Bis(hexafluoroacetylacetonato)palladium(II) on Copper Surfaces," J. Am. Chem. Soc. 118(25): 5988-5996.

Lin et al. (2002) "Effects of the underlayer substrates on copper chemical vapor deposition," J. Vac. Sci. Technol. B. 20(3): 1111-1117.

Lin et al. (2003) "Via-Filling Capability of Copper Film by CVD," Journal of the Electrochemical Society 150(7): C451-C456.

(56) References Cited

OTHER PUBLICATIONS

Lindquist et al. (2012) "Engineering metallic nanostructures for plasmonics and nanophotonics," Reports on Progress in Physics 75(3): 1-61.
Liu et al. (Feb. 2016) "Surface etching, chemical modification and characterization of silicon nitride and silicon oxide-selective functionalization of $Si_3N_4$ and $SiO_2$," Journal of Physics—Condensed Matter 28(9): 1-20.
Liu et al. (Mar. 2016) "Molybdenum carbide as an efficient catalyst for low-temperature hydrogenation of dimethyl oxalate," Chem. Commun. 52(28): 5030-5032.
Ma et al. (publicly available Nov. 2016) "Molybdenum carbide as alternative catalyst for hydrogen production—A review," Renew. Sust. Energ. Rev. 75: 1101-1129 (published Aug. 2017).
Metiu et al. (2012) "Chemistry of Lewis Acid-Base Pairs on Oxide Surfaces," The Journal of Physical Chemistry C 116(19): 10439-10450.
Minaye Hashemi et al. (Nov. 2016) "Selective deposition of dielectrics: limits and advantages of Alkanethiol blocking agents on metal-dielectric patterns," ACS applied materials & interfaces 8(48): 33264-33272.
Mohimi et al. (Nov. 2017) "Surface Selective CVD of Metallic Thin Films Using Inhibitor Molecules," AVS 64th International Symposium & Exhibition: Thin Films Division, Abstract, 2 pp.
Mohimi et al (Jul. 2018) "Area selective CVD of metallic films from molybdenum, iron, and ruthenium carbonyl precursors: Use of ammonia to inhibit nucleation on oxide surfaces," Journal of Vacuum Science & Technology A 36(4): 041507-1-041507-8.
Momose et al. (2006) "In Situ Observation of Initial Nucleation and Growth of Chemical Vapor Deposition of Copper by Surface Reflectivity Measurement," Japanese Journal of Applied Physics Part 1 45(11): 8618-8623.
Nguyen (1999) "High-Density Plasma Chemical Vapor Deposition of Silicon-Based Dielectric Films for Integrated Circuits," IBM J. Res. Dev. 43: 109-126.
Norman et al. (1991) "New OMCVD precursors for selective copper metallization," IEEE, VMIC conference, 123-129.
Norman et al. (1995) "Chemical additives for improved copper chemical vapour deposition processing," Thin Solid Films 262: 46-51.
Okada et al. (1999) "Adsorption and Desorption Kinetics of Tetrakis(Dimethylamino)Titanium and Dimethylamine on TiN Surfaces," 137: 113-124.
Okorn-Schmidt (1999) "Characterization of Silicon Surface Preparation Processes for Advanced Gate Dielectrics," IBM J. Res. Dev. 43(3): 351-365.
Oshikawa et al. (2001) "Characterization of Molybdenum Carbides for Methane Reforming by TPR, XRD, and XPS," J. Phys. Chem. B 105 (38): 9124-9131.
Over et al. (2000) "Atomic-Scale Structure and Catalytic Reactivity of the $RuO_2(110)$ Surface," Science 287: 1474-1476.
Oyama (1992) "Preparation and catalytic properties of transition-metal carbides and nitrides," Catal. Today 15(2): 179-200.
Panayiotatos et al. (2003) "Homogeneous and Amorphous Sputtered $sp^3$-Bonded BN Films at RT: A Stress, Spectroscopic Ellipsometry and XPS Study," Diam. Relat. Mat. 12: 1151-1156.
Parks (1965) "The Isoelectric Points of Solid Oxides, Solid Hydroxides, and Aqueous Hydroxo Complex Systems," Chemical Reviews 65(2): 177-198.
Parry (1963) "An infrared study of pyridine adsorbed on acidic solids. Characterization of surface acidity," Journal of Catalysis 2(5): 371-379.
Pasquale et al. (2008) "Copper electrodeposition from an acidic plating bath containing accelerating and inhibiting organic additives," Electrochimica Acta. 53: 5891-5904.
Pedersen et al. (2007) "Surface Plasmon Resonance Spectra of 2.8 ±0.5 nm Diameter Copper Nanoparticles in Both Near and Far Fields," J. Phys. Chem. C. 111: 17493-17499.
Perrine et al. (2010) "Metallic Nanostructure Formation Limited by the Surface Hydrogen on Silicon," Langmuir 26(15): 12648-12658.
Perrine et al. (2012) "Controlling the Formation of Metallic Nanoparticles on Functionalized Silicon Surfaces," J. Phys. Chem. C. 116: 14431-14444.
Perry et al. (1985) "An XPS Study of Hafnium Nitride Films," Solid State Commun. 56(10): 837-841.
Perry et al. (1987) "Non-Stoichiometry Effects in the XPS Spectra of HfN Films," Solid State Commun. 62(1): 23-26.
Peytavy et al. (1979) "A Study of Some Properties of Titanium Boronitride Used for The Coating of Cutting Tools," Wear. 52: 89-94.
Portier et al. (2003) "Acid-base behavior of oxides and their electronic structure," Solid State Sciences 5(5): 695-699.
Pyo (2008) "Role of $CH_2I_2$ catalysis in chemically enhanced MOCVD Cu process: Nature of superfilling in copper thin film growth," Metals and Materials International 14(6): 767-772.
Reddy et al. (1995) "Kinetics of Surface Processes for $Mo(CO)_6$ on Partially Dehydroxylated Alumina and Hydroxylated Alumina. Observation of $Mo(CO)_5(ads)$," Journal of the American Chemical Society 117(10): 2845-2854.
Rhee et al. (2000) "Property of hexafluoroacetylacetonate Cu(I) (3,3-dimethyl-1-butene) as a liquid precursor for chemical vapor deposition of copper films," Electrochemical and Solid State Letters 3(3): 135-137.
Rossnagel (1998) "Directional and Ionized Physical Vapor Deposition for Microelectronics Applications," J. Vac. Sci. Technol. B 16(5): 2585-2608.
Satta et al. (2002) "Growth mechanism and continuity of atomic layer deposited TiN films on thermal SiO2," Journal of Applied Physics 92(12): 7641-7646.
Saxena et al. (2005) "Kinetics of voiding and agglomeration of copper nanolayers on silica," Physical Review B 72: 115425-1-115425-7.
Schlote et al. (1999) "$SiO_2$ Films from Tetraethoxysilane-Based LPCVD: An Experimental Investigation of the By-Product-Inhibited Deposition Mechanism," J. Electrochem. Soc. 146(9): 3415-3419.
Schmid et al. (1998) "Optical and Electronic Properties of Sputtered $TiN_x$ Thin Films," J. Vac. Sci. Technol. A. 16(5): 2870-2875.
Schmidt et al. (1996) "Mechanic Study of Copper Deposition onto Gold Surfaces by Scaling and Spectral Analysis of In Situ Atomic Force Microscopic Images," Journal of the Electrochemical Society 143(10): 3122-3132.
Sekiguchi et al. (2000) "Reaction of Copper Oxide and β-Diketone for In situ Cleaning of Metal Copper in a Copper Chemical Vapor Deposition Reactor," Japanese Journal of Applied Physics Part 1 39(11): 6478-6486.
Serp et al. (2002) "Chemical Vapor Deposition Methods for the Controlled Preparation of Supported Catalytic Materials," Chemical Reviews 102(9): 3085-3128.
Shacham-Diamand (2001) "Barrier Layers for Cu ULSI Metallization," J. Electron. Mater. 30(4): 336-344.
Shim et al. (2002) "Bottom-up Filling of Submicrometer Features in Catalyst-Enhanced Chemical Vapor Deposition of Copper," J. Electrochem. Soc. 149(2): G109-G113.
Shin et al. (1991) "Selective low-temperature chemical vapor deposition of copper from (hexafluoroacetylacetonato)copper(I)trimethylphosphine, $(HFA)CuP(Me)_3$," Adv. Mater. 3(5): 246-248.
Shin et al. (1992) "Hot-wall chemical vapor deposition of copper from copper(I) compounds. 2. Selective, low-temperature deposition of copper from copper(I) beta-diketonate compounds, (beta-diketonate)$CuL_n$, via thermally induced disproportionation reactions," Chemistry of Materials 4(4): 788-795.
Simoes et al. (2010) "In situ TEM study of grain growth in nanocrystalline copper thin films," Nanotechnology 21: 1-12.
Singh et al. (1993) "Effect of Surface Re-Emission on the Surface Roughness of Film Growth in Low Pressure Chemical Vapor Deposition," J. Vac. Sci. Technol. A. 11(3): 557-568.
Smith (1970) "Structure and Electrical Properties of Sputtered Films of Hafnium and Hafnium Compounds," J. Appl. Phys. 41(10): 4227-4231.
Sperling et al. (2004) "Simultaneous Short-Range Smoothening and Global Roughening During Growth of Hydrogenated Amorphous Silicon Films," Appl. Phys. Lett. 85(16): 3456-3458.

(56) References Cited

OTHER PUBLICATIONS

Sperling et al. (2007) "Kinetic Roughening of Amorphous Silicon During Hot-Wire Chemical Vapor Deposition at Low Temperature," Journal of Applied Physics 101(2): 024915-1-024915-7.
Steger et al. (1999) "Chemical vapor etching of copper using oxygen and 1,1,1,5,5,5-hexafluoro-2,4-pentanedione," Thin Solid Films 342: 221-229.
Sun et al. (2003) "A review of the different techniques for solid surface acid-base characterization," Advances in Colloid and Interface Science 105(1): 151-175.
Sung et al. (1985) "How carbon monoxide bonds to metal surfaces," Journal of the American Chemical Society 107(3): 578-584.
Susman et al. (2012) "Chemical Deposition and Stabilization of Plasmonic Copper Nanoparticle Films on Transparent Substrates," Chem. Mater. 24: 2501-2508.
Takenaka et al. (2004) "Anisotropic Deposition Of Cu in Trenches by H-Assisted Plasma Chemical Vapor Deposition," J. Vac. Sci. Technol. A 22(4): 1903-1907.
Tao et al. (2012) "On the initial growth of atomic layer deposited $TiO_2$ films on silicon and copper surfaces," Thin Solid Films 520(22): 6752-6756.
Tsai et al. (1992) "Facet modulation selective epitaxy—a technique for quantum-well wire doublet fabrication," Appl. Phys. Lett 60(2): 240-242.
Tauc et al. (1966) "Optical Properties and Electronic Structure of Amorphous Germanium," Phys. Status Solidi. 15: 627-637.
Theolier et al. (1983) "The characterization and thermal stability of a cluster $HRu_3(CO)_{10}(O—Si-)$ grafted on silica surface," Polyhedron 2(2): 119-121.
Thompson (2012) "Solid-State Dewetting of Thin Films," Annual Review of Materials Research 42: 399-434.
Tsyganenko et al. (1975) "Infrared study of surface species arising from ammonia adsorption on oxide surfaces," Journal of Molecular Structure 29(2): 299-318.
U.S. Office Action, dated Jun. 21, 2013, in U.S. Appl. No. 13/285,974, 16 pp.
U.S. Office Action, dated Dec. 10, 2013, in U.S. Appl. No. 13/285,974, 15 pp.
U.S. Office Action, dated Oct. 19, 2016, in U.S. Appl. No. 14/937,790, 25 pp.
U.S. Office Action, Final Rejection, dated Jul. 17, 2017, in U.S. Appl. No. 14/937,790, 20 pp.
U.S. Office Action, dated Nov. 30, 2017, in U.S. Appl. No. 14/937,790, 22 pp.
Vereecken et al. (2005) "The Chemistry of Additives in Damascene Copper Plating," IBM J. Res. Dev. 49(1): 3-18.
Wang et al. (2004) "Area-selective growth of ruthenium dioxide nanorods on $LiNbO_3(100)$ and Zn/Si substrates," Journal of Materials Chemistry 14: 3503-3508.
Wang et al. (2013) "Highly conformal magnesium oxide thin films by low-temperature chemical vapor deposition from $Mg(H_3BNMe_2BH_3)_2$ and water," Applied Physics Letters 102(10): 101605-1-101605-4.
Watanabe et al. (2004) "Direct-Bandgap Properties and Evidence for Ultraviolet Lasing of Hexagonal Boron Nitride Single Crystal," Nat. Mater. 3: 404-409.
Watson et al. (1989) "Low temperature pyrolysis products of chromium, molybdenum and tungsten hexacarbonyls," Polyhedron 8(13/14): 1794-1796.
Weiller (1995) "$HNMe_2$ Inhibits the Reaction of $Ti(NMe_2)_4$ with $NH_3$: Implications for the Chemical Vapor Deposition of TiN and Related Nitrides," Chem. Mater. 7(9): 1609-1611.
Weiller et al. (1997) "Effect of Dimethylamine on the Chemical Vapor Deposition of TiN from Tetrakis(dimethylamido)titanium and Ammonia," J. Electrochem. Soc. 144(3): L40-L43.

Williams (1997) "Transition Metal Carbides, Nitrides, and Borides for Electronic Applications," J. Miner. Met. Mater. Soc. 49: 38-42.
Winter et al. (2000) "Selective Nucleation and Area-Selective OMCVD of Gold on Patterned Self-Assembled Organic Monolayers Studied by AFM and XPS: A Comparison of OMCVD and PVD," Chemical Vapor Deposition 6(4): 199-205.
Wu et al. (2008) "Effects of Hydrogen Plasma Treatments on the Atomic Layer Deposition of Copper," Electrochemical and Solid State Letters 11(5): H107-H110.
Wulu et al. (1991) "Simulation of Mass Transport for Deposition in Via Holes and Trenches," J. Electrochem. Soc. 138(6): 1831-1840.
Xie et al. (2014) Selective Deposition of Ru Nanoparticles on $TiSi_2$ Nanonet and Its Utilization for $Li_2O_2$ Formation and Decomposition, J. Am. Chem. Soc. 136: 8903-8906.
Xu et al. (1996) "Mechanistic studies of the thermal decomposition of metal carbonyls on Ni(100) surfaces in connection with chemical vapor deposition processes," Journal of Vacuum Science & Technology A: Vacuum, Surfaces, and Films 14(2): 415-424.
Yamamoto et al. (2007) "Hydroxyl-Induced Wetting of Metals by Water at Near-Ambient Conditions," J. Phys. Chem. C. 111: 7848-7850.
Yang et al. (2002) "Nucleation and film growth during copper chemical vapor deposition using the precursor Cu(TMVS)(hfac)," J. Vac. Sci. Technol. B. 20(2): 495-506.
Yang et al. (2006) "Crystalline Texture in Hafnium Diboride Thin Films Grown by Chemical Vapor Deposition," J. Cryst. Growth 294: 389-395.
Yang et al. (2006) "CVD Growth Kinetics of $HfB_2$ Thin Films from the Single-Source Precursor $Hf(BH_4)_4$," Chem. Mater. 18(21): 5088-5096.
Yang et al. (2007) "In Situ Spectroscopic Ellipsometry Analyses of Hafnium Diboride Thin Films Deposited by Single-Source Chemical Vapor Deposition," J. Vac. Sci. Technol. A. 25(1): 200-206.
Yanguas-Gil et al. (2009) "Highly conformal film growth by chemical vapor deposition. I. A conformal zone diagram based on kinetics," J. Vac. Sci. Technol. A. 27(5): 1235-1243.
Yanguas-Gil et al. (2009) "Highly conformal film growth by chemical vapor deposition. II. Conformality enhancement through growth inhibition," J. Vac. Sci. Technol. A 27(5): 1244-1248.
Zaki et al. (2001) "In situ FTIR spectra of pyridine adsorbed on $SiO_2$—$Al_2O_3$, $TiO_2$, $ZrO_2$ and $CeO_2$: general considerations for the identification of acid sites on surfaces of finely divided metal oxides," Colloids and Surfaces A: Physicochemical and Engineering Aspects 190(3): 261-274.
Zanderighi et al. (1985) "Surface supported metal cluster carbonyls. Chemisorption, reactivity, and decomposition of $Ru_3(CO)_{12}$ on silica," Journal of Organometallic Chemistry 296(1): 127-146.
Zecchina et al. (1993) "Structure and reactivity of surface species obtained by interaction of organometallic compounds with oxidic surfaces—IR studies," Catalysis Reviews—Science and Engineering 35(2): 261-317.
Zhang et al. (1999) "Optimization of copper CVD film properties using the precursor of Cu(hfac)(tmvs) with variations of additive content," IEEE International Conference on Interconnect Technology, 1999. San Francisco, CA. p. 170-172.
Zheng et al. (2013) "Experimental and Theoretical Investigation of Molybdenum Carbide and Nitride as Catalysts for Ammonia Decomposition," Journal of the American Chemical Society 135(9): 3458-3464.
Zhuravlev (2000) "The surface chemistry of amorphous silica. Zhuravlev model," Colloids and Surfaces A: Physicochemical and Engineering Aspects 173(1): 1-38.
U.S. Appl. No. 13/285,974, filed Oct. 31, 2011.
U.S. Appl. No. 14/937,790, filed Nov. 10, 2015.

* cited by examiner

AREA SELECTIVE CVD OF METALLIC FILMS USING PRECURSOR GASES AND INHIBITORS

CROSS-REFERENCE TO RELATED APPLICATIONS

This application claims the benefit of U.S. Provisional Patent Application No. 62/580,240, filed Nov. 1, 2017, which is hereby incorporated by reference in its entirety, to the extent not inconsistent herewith.

STATEMENT REGARDING FEDERALLY SPONSORED RESEARCH OR DEVELOPMENT

This invention was made, at least in part, with United States governmental support awarded by National Science Foundation under Grant No. NSF 1362931, under Grant No. NSF 1665191, and under Grant No. CMMI 1825938. The United States Government has certain rights in this invention.

BACKGROUND OF INVENTION

In pursuit of increasing performance, feature sizes in microelectronics are decreasing. Unfortunately, as feature sizes shrink toward 10 nm, precise fabrication of these features is increasingly difficult. Conventional top-down approaches for nanoscale electronic device fabrication involve blanket film deposition, patterning, and etching steps, requiring precise control at each step. One approach for improving precision and pattern registry is area selective deposition (ASD), a bottom-up fabrication scheme. ASD involves highly (or, perfectly) selective growth of a thin film: for example, thin film growth may occur on conductive surfaces but not on insulating surfaces. Selective growth may occur when film nucleation is significantly slowed or prevented on certain surfaces while not on other surfaces. In addition to providing more precise device fabrication, use of ASD techniques may reduce fabrication cost, time, and complexity. During ASD, patterns and features may be deposited upon a pre-established base pattern thereby obviating a number of deposition and etching steps.

ASD may be performed using, for example, chemical vapor deposition (CVD) or atomic layer deposition (ALD). In an example CVD approach to achieve ASD, a surface may be rendered passive by addition of an inhibitor gas. For example, Abelson et al. (U.S. Pat. No. 10,103,057, which is hereby incorporated by reference in its entirety, to the extent not inconsistent herewith) discusses an ASD approach continuously introducing an inhibitor gas during the deposition process to reduce the film nucleation rate of Cu from Cu(hfac)VTMS on a $SiO_2$ surface while allowing film growth on a conductive surface (e.g., $RuO_x$).

It will be appreciated from the foregoing that there remains a need in the art for methods advancing the scope of mechanisms, substrates, and precursors, for example, available to achieve ASD and thereby afford greater flexibility in manufacturing of micro and nano electronics.

SUMMARY OF THE INVENTION

Provided herein are methods for forming a layer on a substrate wherein the layer is formed selectively on a first region of the substrate relative to a second region having a composition different than the first region. In an embodiment, for example, the layer is formed on the first region of the substrate while leaving one or more other regions of the substrate substantially uncoated, wherein the first region is characterized by a different composition that the one or more other regions. Methods of the invention include selectively forming a layer using an inhibitor agent capable of reducing the average acidity of a plurality of hydroxyl groups associated with a first region of the substrate. Methods of the invention include selectively forming a layer by simultaneous or sequential exposure of the substrate having first and second regions with different compositions using: (i) an inhibitor agent comprising a substituted or an unsubstituted amine group, a substituted or an unsubstituted pyridyl group, a carbonyl group, a ketone group, a diketone group, or a combination of these, and (ii) a precursor gas comprising one or more ligands selected from the group consisting of a carbonyl group, an allyl group, combination thereof. In an embodiment, the method is for selectively coating a plurality of regions, for example corresponding to a pattern. In an embodiment, the method is for selectively coating a pattern corresponding to one or more oxides, such as a plurality of different oxides. In an embodiment, the method is for selective area coating, such as selective coating area corresponding to specific regions of a microelectronic system.

In an aspect, the invention provides a method for selectively forming a layer on a substrate comprising: (i) providing the substrate having a receiving surface with a first region and a second region; (ii) exposing the receiving surface to an inhibitor agent, wherein: at least a fraction of the inhibitor agent is accommodated by the first region; and the inhibitor agent comprises a substituted or an unsubstituted amine group, a substituted or an unsubstituted pyridyl group, a carbonyl group, a ketone group, a diketone group, or a combination of these; (iii) contacting the receiving surface with a precursor gas, wherein: accommodation of the precursor gas by the receiving surface results in selective formation of the layer on the second region; and the precursor gas comprises a ligand selected from the group consisting of a carbonyl group, an allyl group, and any combination thereof, thereby selectively forming the layer on the substrate. In an embodiment, the first region having a composition different from that of the second region. In an embodiment, the at least a fraction of the inhibitor agent accommodated by the first region changes a concentration of exposed hydroxyl groups. For example, the inhibitor agent may change the amounts of nucleation sites available for nucleation of the layer via the precursor gas. In an embodiment, exposed hydroxyl groups refers to hydroxyl groups not directly chemically associated with an inhibitor agent. In an embodiment, the at least a fraction of the inhibitor agent accommodated by the first region changes a concentration of exposed hydroxyl groups and changes the average acidity of the first surface. In an embodiment, the inhibitor agent comprises a substituted or an unsubstituted amine group, a substituted or an unsubstituted pyridyl group, or both a substituted or an unsubstituted amine group and a substituted or an unsubstituted pyridyl group.

In an aspect, the invention provides a method for selectively forming a layer on a substrate, the method comprising: (i) providing the substrate having a receiving surface with a first region and a second region; and a surface of the first region comprises a plurality of hydroxyl groups characterized by an average acidity; (ii) exposing the receiving surface to an inhibitor agent, wherein: at least a fraction of the inhibitor agent is accommodated by the first region; and the at least a fraction of the inhibitor agent accommodated by the first region changes the average acidity of the first region; and (iii) contacting the receiving surface with a precursor gas, wherein: accommodation of the precursor gas by the receiving surface results in selective formation of the layer on the second region; and the precursor gas comprises a ligand selected from the group consisting of a carbonyl group, an allyl group, and any combination thereof, thereby selectively forming the layer on the substrate. In an embodiment, the first region having a composition different from that of the second region. In an embodiment, the at least a fraction of the inhibitor agent accommodated by the first region reduces the average acidity of the first region. In an embodiment, the at least a fraction of the inhibitor agent accommodated by the first region changes a concentration of exposed hydroxyl groups. For example, the inhibitor agent may change the amounts of nucleation sites available for nucleation of the layer via the precursor gas. In an embodiment, exposed hydroxyl groups refers to hydroxyl groups not directly chemically associated with an inhibitor agent. In an embodiment, the at least a fraction of the inhibitor agent accommodated by the first region changes a concentration of exposed hydroxyl groups and changes the average acidity of the first surface.

Some embodiments of the methods disclosed herein provide for deterministic control of a degree of selectivity with respect to selective formation of a layer on a substrate. In some embodiments, for example, a concentration and/or an average acidity of a plurality of hydroxyl groups at a first region of a receiving surface of a substrate is/are deterministic. In an illustrative example, at least a portion of a first region is prepared by depositing or forming a precursor layer having a known/predetermined composition, comprising a concentration of at least one metal, such as a metal alloy, and/or at least one metalloid. At least a portion of the precursor layer may then be converted to native oxide(s). The native oxide(s) corresponds to the converted composition of the precursor layer, wherein the native oxide may be a mixed oxide, for example. For example, an average acidity of hydroxyl groups associated with a native oxide of metal, a metalloid, or a mixture or alloy of at least one metal and/or at least one metalloid is known or determined. The conditions, such as atmosphere, exposure time, and temperature, of the process by which the precursor layer is at least partially converted to native oxide(s) are determined and the composition of the precursor layer is determined and controlled such that the concentration and/or average acidity of the hydroxyl groups at the at least a portion of the first region, corresponding to the precursor layer, is/are deterministic (deterministically controlled/determined).

In an aspect, the invention provides a method for selectively forming a layer on a substrate, the method comprising: (i) providing the substrate having a receiving surface with a first region and a second region; and a surface of the first region comprises a plurality of hydroxyl groups characterized by an average acidity; (ii) preparing the first region of said receiving surface to provide for a surface of said first region ("first surface") having a plurality of hydroxyl groups characterized by an average acidity; (iii) exposing the receiving surface to an inhibitor agent, wherein: at least a fraction of the inhibitor agent is accommodated by the first region; and the at least a fraction of the inhibitor agent accommodated by the first region changes the average acidity of the first region; and (iv) contacting the receiving surface with a precursor gas, wherein: accommodation of the precursor gas by the receiving surface results in selective formation of the layer on the second region. In an embodiment, the precursor gas comprises a ligand selected from the group consisting of a carbonyl group, an allyl group, and any combination thereof. In an embodiment, the first region having a composition different from that of the second region. In an embodiment, the at least a fraction of the inhibitor agent accommodated by the first region reduces the average acidity of the first region. In an embodiment, the at least a fraction of the inhibitor agent accommodated by the first region changes a concentration of exposed hydroxyl groups. For example, the inhibitor agent may change the amounts of nucleation sites available for nucleation of the layer via the precursor gas. In an embodiment, exposed hydroxyl groups refers to hydroxyl groups not directly chemically associated with an inhibitor agent. In an embodiment, the at least a fraction of the inhibitor agent accommodated by the first region changes a concentration of exposed hydroxyl groups and changes the average acidity of the first surface.

In some embodiments of the methods disclosed herein, the inhibitor agent comprises a substituted or an unsubstituted amine group, a substituted or an unsubstituted pyridyl group, a carbonyl group, a ketone group, a diketone group, or a combination of these. In some embodiments of the methods disclosed herein, the inhibitor agent comprises a substituted or an unsubstituted amine group, a substituted or an unsubstituted pyridyl group, a carbonyl group, a ketone group, a diketone group, a substituted or unsubstituted aldehyde group, or a combination of these. In an embodiment, the inhibitor agent comprises a chemical group selected from the group consisting of a substituted or an unsubstituted amine group, a substituted or an unsubstituted pyridyl group, a carbonyl group, a ketone group, a diketone group, and any combination thereof. In an embodiment, the inhibitor agent comprises a chemical group selected from the group consisting of a substituted or an unsubstituted amine group, a substituted or an unsubstituted pyridyl group, a carbonyl group, and any combination thereof. In some embodiments of the methods disclosed herein, the inhibitor agent comprises a substituted or an unsubstituted amine group, a substituted or an unsubstituted pyridyl group, or both a substituted or an unsubstituted amine group and a substituted or an unsubstituted pyridyl group. In some embodiments of the methods disclosed herein, the first region has a composition different from that of said second region. In an embodiment, the inhibitor agent comprises a substituted or an unsubstituted carboxyl group, a substituted or an unsubstituted acetate group, a substituted or an unsubstituted acetyl group, or a combination of these. In some embodiments of the methods disclosed herein, the inhibitor agent comprises a substituted or an unsubstituted amine group, a substituted or an unsubstituted pyridyl group, a ketone group, a diketone group, a substituted or unsubstituted aldehyde group, a substituted or an unsubstituted carboxyl group, a substituted or an unsubstituted acetate group, a substituted or an unsubstituted acetyl group, or a combination of these. In an embodiment, the carbonyl group is part of a ketone or a diketone group. In an embodiment, the inhibitor agent comprises a ketone group or a diketone group. In some embodiments of the methods disclosed herein, the inhibitor agent comprises a substituted or an unsubstituted amine group. In some embodiments of the methods disclosed herein, the inhibitor agent comprises a substituted or an unsubstituted pyridyl group. In some embodiments of the methods disclosed herein, the inhibitor agent comprises a substituted or an unsubstituted amine group, a substituted or an unsubstituted pyridyl group, a carbonyl group, or a combination of these.

In some embodiments of the methods disclosed herein, a surface of said first region ("first surface") comprises a plurality of hydroxyl groups characterized by an average acidity and wherein said at least a fraction of said inhibitor agent accommodated by said first region changes the average acidity of said first surface. In some embodiments of the methods disclosed herein, the at least a fraction of said inhibitor agent accommodated by said first region reduces the average acidity of said first surface. In some embodiments of the methods disclosed herein, the receiving surface of said provided substrate is substantially free of hydroxyl groups. In some embodiments of the methods disclosed herein, the first region is exposed to gas comprising air, oxygen, water vapor, or a combination of these during or prior to said step of providing. Air may be ambient air, or air whose composition is not locally or otherwise substantially man-made or controlled. Air may be clean or otherwise filtered air.

In any embodiment, a spatial distribution of the concentration of the plurality of hydroxyl groups on the first region, or surface thereof, may be non-homogeneous. In any embodiment, a spatial distribution of the concentration of the plurality of hydroxyl groups on the first region, or surface thereof, may be substantially homogeneous. In any embodiment, a spatial distribution of the average acidity of the plurality of hydroxyl groups on the first region, or surface thereof, may be non-homogeneous. In any embodiment, a spatial distribution of the average acidity of the plurality of hydroxyl groups on the first region, or surface thereof, may be substantially homogeneous. In any embodiment, a spatial distribution of the concentration of the plurality of hydroxyl groups on the first region, or surface thereof, may be substantially deterministic. In any embodiment, a spatial distribution of the average acidity of the plurality of hydroxyl groups on the first region, or surface thereof, may be substantially deterministic.

In any embodiment, a surface of the second region ("second surface") comprises a second plurality of hydroxyl groups characterized by a second average acidity; wherein the plurality of hydroxyl groups of the surface of the first region ("first surface") is a first plurality of hydroxyl group characterized by a first average acidity. A concentration of the second plurality of hydroxyl groups may be different from the concentration of the first plurality of hydroxyl groups. An average acidity of the second plurality of hydroxyl groups may be different from the average acidity of the first plurality of hydroxyl groups. A spatial distribution of the concentration of the second plurality of hydroxyl groups on the second surface may be different from the spatial distribution of the concentration of the first plurality of hydroxyl groups on the first surface. A spatial distribution of the average acidity of the second plurality of hydroxyl groups on the second surface may be different from the spatial distribution of the average acidity of the first plurality of hydroxyl groups on the first surface.

In an embodiment, the first region of the substrate comprises a dielectric. In an embodiment, the first region of the substrate comprises a dielectric and the second region of the substrate comprises a dielectric, wherein the composition of the first region is different from the composition of the second region. In an embodiment, the first region of the substrate comprises a metal oxide or a mixed oxide and the second region of the substrate comprises a metal oxide or a mixed oxide, wherein the composition of the first region is different from the composition of the second region. In an embodiment, the method comprises (i) selecting the precursor gas and/or (ii) selecting the composition of the first region and the composition of the second region to provide for selectively forming the layer on the substrate.

In any embodiment, the layer may be a seed layer. For example, any of the methods disclosed herein may be used to selectively deposit a seed layer on a first region of a substrate. For example, the methods may then comprise a step of subsequently depositing a second layer on top on the seed layer. For example, the seed layer may be a thin film comprising, or consisting of, Co. For example, the second layer may comprise, or consist of, Au.

In some embodiments of the methods disclosed herein, the method further comprises a step of preparing the first region of said receiving surface to provide for a surface of said first region ("first surface") having a plurality of hydroxyl groups. In some embodiments of the methods disclosed herein, the step of preparing comprises depositing a precursor layer on at least a portion of said first region. In some embodiments of the methods disclosed herein, the step of preparing comprises forming a precursor layer on at least a portion of said first region via a lithographic process. In some embodiments of the methods disclosed herein, the step of preparing further comprising converting at least a fraction of said precursor layer to a native oxide layer. In some embodiments of the methods disclosed herein, the of converting comprising exposing said precursor layer to an atmosphere comprising oxygen, water vapor, air, or a combination of these. In some embodiments of the methods disclosed herein, the step of preparing comprises exposing said first region to a pretreatment solution. In some embodiments of the methods disclosed herein, the pretreatment solution changes a concentration of the plurality of hydroxyl groups associated with the first region. In some embodiments of the methods disclosed herein, the pretreatment solution changes the acidity of the plurality of hydroxyl groups on at least a portion of the first region. In some embodiments of the methods disclosed herein, the precursor layer having said plurality of hydroxyl groups characterized by said average acidity. In some embodiments of the methods disclosed herein, the step of preparing comprises converting at least a portion of the first region to a native oxide. Preferably for some applications, a native oxide comprises at least one metal, at least one metalloid, or a mixture or alloy of at least one metal and at least one metalloid. For example, a native oxide may refer to an oxide layer formed from the conversion of at least a portion of a metal alloy to a mixed oxide via a chemical reaction, such as via chemical reaction with oxygen, water vapor, and/or another oxidizing fluid. In an embodiment, the term "fluid" refers to a liquid, gas, a plasma, or a combination of these. For some applications, the term "fluid" may also refer to aerosols.

In some embodiments of the methods disclosed herein, the precursor layer is a metal oxide, a nonmetal oxide, a metal nitride, a nonmetal nitride, a mixed oxide, a mixed nitride, a mixed oxynitride, or a combination of these. In some embodiments of the methods disclosed herein, the precursor layer is a metal oxide, a nonmetal oxide, a mixed oxide, a mixed oxynitride, or a combination of these. In some embodiments of the methods disclosed herein, the precursor is a mixed oxide. In some embodiments of the methods disclosed herein, the precursor is an oxide. In some embodiments of the methods disclosed herein, the precursor is a native oxide. In some embodiments of the methods disclosed herein, the precursor layer is a metal, metal alloy, a metalloid, an alloy comprising a plurality of metalloids, or a combination thereof. In some embodiments of the methods disclosed herein, the precursor layer is characterized by a thickness selected from the range of 1 nm to 100 nm, 1 nm to 1 µm, 10 nm to 1 µm, 10 nm to 100 µm, 100 nm to 100 µm, 100 nm to 1 µm, or preferably for some applications 100 nm to 10 µm.

In some embodiments of the methods disclosed herein, the step of preparing comprises modifying said first region of said receiving surface via at least one treatment selected from the group consisting of chemical processing, mechanical processing, photochemical processing, electrochemical processing, thermal processing, plasma processing, and any combination thereof. For example, exposure of the substrate, or region thereof, to a plasma may change the average acidity of the substrate, or region thereof. For example, the plasma may comprise Ar, including chemical radical derivatives thereof (e.g., Ar*), and/or $H_2O$, including chemical radical derivatives thereof, and/or $H_2$, including chemical radical derivatives thereof. In some embodiments of the methods disclosed herein, the step of preparing comprises cleaning, stripping, polishing, calcining, annealing, heating, or any combination thereof. In some embodiments of the methods disclosed herein, the step of preparing comprising increasing, decreasing, or increasing and decreasing sequentially in any order a concentration of said plurality of hydroxyl groups on said first region of said receiving surface. In some embodiments of the methods disclosed herein, the step of preparing comprising increasing a concentration of said plurality of hydroxyl groups on said first region of said receiving surface. In some embodiments of the methods disclosed herein, the step of preparing comprising increasing and decreasing, sequentially, in any order, a concentration of said plurality of hydroxyl groups on said first region of said receiving surface. In some embodiments of the methods disclosed herein, the step of preparing comprising increasing, decreasing, or increasing and decreasing sequentially in any order said acidity of said plurality of hydroxyl groups. In some embodiments of the methods disclosed herein, the step of preparing comprising increasing said acidity of said plurality of hydroxyl groups. In some embodiments of the methods disclosed herein, the step of preparing comprising increasing and decreasing, sequentially, in any order, said acidity of said plurality of hydroxyl groups. In some embodiments of the methods disclosed herein, a concentration of said plurality of hydroxyl groups, said acidity of said plurality of hydroxyl groups, or both, is deterministic. In some embodiments of the methods disclosed herein, the precursor gas comprises a ligand selected from the group consisting of a carbonyl group, an allyl group, and any combination thereof.

In some embodiments of the methods disclosed herein, the first region comprises a native oxide. In some embodiments of the methods disclosed herein, the first region comprises a native oxide of at least a portion of said substrate. In some embodiments of the methods disclosed herein, at least a portion of said first region is prepared by oxidation of a metal, metal alloy, metalloid, or alloy comprising a plurality of metalloids, or a combination of these of said first region. In some embodiments of the methods disclosed herein, at least a portion of said first region is prepared by oxidation of a metal, metal alloy, metalloid, or a combination of these of said first region. In some embodiments of the methods disclosed herein, at least a portion of said first region is prepared by oxidation of a metal or metal alloy of said first region. In some embodiments of the methods disclosed herein, at least a portion of said first region is prepared by nitridation of a metal, metal alloy, metalloid, or alloy comprising plurality of metalloids, or a combination of these of said first region.

A first region may include a variety of compositions, such as those described below, for use in aspects or embodiments of the methods disclosed herein. For example, a first region includes a composition that further includes hydroxyl groups at its surface. For example, a first region includes a metal oxide material composition. For example, a first region includes a metal nitride with surface hydroxyl groups. For example, a first region includes a metal and/or a nonmetal oxynitride. For example, a first region includes a metal and/or a nonmetal carbide nitride. For example, a first region includes a metal and/or a nonmetal carbide oxynitride. For example, a first region comprises a nonmetal carbide (e.g., SiC).

In an embodiment of some of the methods disclosed herein, for example, the first region comprises at least one of: metal oxide, nonmetal oxide, mixed oxide, metal oxynitride, nonmetal oxynitride, mixed oxynitride, or combination of these. In an embodiment, any of a metal oxide, a nonmetal oxide, a mixed oxide, a metal oxynitride, a nonmetal oxynitride, a mixed oxynitride, and a combination of these may comprise additives, such as dopants. Dopants include, but are not limited to, carbon, boron, phosphorous, and combinations of these. For example, carbon-doped $SiO_2$ is an exemplary nonmetal oxide. In an embodiment of some of the methods disclosed herein, for example, the first region comprises more than one metal oxide. In an embodiment of some of the methods disclosed herein, for example, the first region comprises more than one nonmetal oxide. In an embodiment of some of the methods disclosed herein, for example, the metal oxide is selected from the group consisting of $RuO_2$, $TiO_2$, $Al_2O_3$, $MgO$, $La_2O_3$, and any combination thereof. In an embodiment of some of the methods disclosed herein, for example, the nonmetal oxide is selected from the group consisting of $SiO_2$, $GeO$, $GeO_2$, and any combination thereof. In an embodiment of some of the methods disclosed herein, for example, the nonmetal oxide is selected from the group consisting of $SiO_2$, $GeO$, $GeO_2$, and any combination thereof. In an embodiment, the first region is a semiconductor. In an embodiment, the first region comprises a semiconductor. In an embodiment, the first region comprises an arsenide, such as GaAs.

In an embodiment of some of the methods disclosed herein, for example, the first region comprises at least one of: a metal nitride, a nonmetal nitride, a mixed nitride, an oxynitride, a mixed oxynitride, or combination of these. In an embodiment of some of the methods disclosed herein, for example, the first region comprises more than one metal nitride. In an embodiment of some of the methods disclosed herein, for example, the first region comprises more than one nonmetal nitride. In an embodiment of some of the methods disclosed herein, for example, the metal nitride is selected from the group consisting of TiN, VN, NbN, ZrN, GaN, and any combination thereof. In an embodiment of some of the methods disclosed herein, for example, the nonmetal nitride is selected from the group consisting of SiN, SiN, $Si_3N_4$, $Ge_3N_4$, and any combination thereof.

In an embodiment of some of the methods disclosed herein, for example, the first region comprises a native oxide. In an embodiment of some of the methods disclosed herein, for example, the first region comprises a native oxide of at least a portion of the second region.

In an embodiment of some of the methods disclosed herein, for example, a surface of the first region comprises a plurality of hydroxyl groups characterized by an average acidity. In an embodiment of some of the methods disclosed herein, for example, the average acidity of the plurality of hydroxyl groups is characterized by an isoelectric point selected from the range of 0 to 16. In an embodiment of some of the methods disclosed herein, for example, the average acidity of the plurality of hydroxyl groups is characterized by an isoelectric point selected from the range of 2 to 12.

In an embodiment of some of the methods disclosed herein, for example, the first region comprises a first portion having a primary plurality of hydroxyl groups characterized by a primary average acidity and a second portion having a secondary plurality of hydroxyl groups characterized by a secondary average acidity. For example, a degree of selectivity and/or nucleation delay of the layer may be deterministically different at each of a plurality of portions of the first region and/or the second region.

In an embodiment of some of the methods disclosed herein, for example, no detectable formation of the layer occurs on the first region. In an embodiment of some of the methods disclosed herein, for example, at least a portion of the first region is disposed on at least a portion of a surface of the second region.

A variety of one or more inhibitor agents, such as those described below, may be used in aspects or embodiments of the methods disclosed herein. For example, an inhibitor agent reduces the average acidity of at least a portion of a first region (e.g., of at least a portion of the hydroxyl groups at the surface of a first region) when the inhibitor agent is accommodated by the respective portion(s) of the first region. For example, an inhibitor agent comprises a substituted or an unsubstituted amine group, a substituted or an unsubstituted pyridyl group, a carbonyl group, a ketone group, a diketone group, or a combination of these. For example, an inhibitor agent is ammonia or pyridine.

In an embodiment of some of the methods disclosed herein, for example, the inhibitor agent comprises a substituted or an unsubstituted amine group, a substituted or an unsubstituted pyridyl group, a carbonyl group, a ketone group, a diketone group, or a combination of these. In an embodiment of some of the methods disclosed herein, for example, the inhibitor is a neutral molecule. In an embodiment of some of the methods disclosed herein, for example, the inhibitor agent is a gas. In an embodiment of some of the methods disclosed herein, for example, the inhibitor is selected from the group consisting of ammonia, dimethyl amine, methyl amine, trimethylamine, pyridine, acetylacetone, and any combination thereof. In an embodiment of some of the methods disclosed herein, for example, the inhibitor is acetylacetone.

In an embodiment of some of the methods disclosed herein, for example, the at least a fraction of the inhibitor agent reduces the average acidity of the plurality of hydroxyl groups. In an embodiment of some of the methods disclosed herein, for example, the inhibitor agent is a Lewis base characterized by a pKa greater than or equal to 15. In an embodiment of some of the methods disclosed herein, for example, the inhibitor agent is characterized by a pKa greater than or substantially equal to 15. In an embodiment of some of the methods disclosed herein, for example, the inhibitor agent is characterized by a pKa greater than or equal to 8. In an embodiment of some of the methods disclosed herein, for example, the inhibitor agent is characterized by a pKa greater than or substantially equal to 9.

In an embodiment of some of the methods disclosed herein, for example, the at least a fraction of the inhibitor agent accommodated by the first region adsorbs to at least a portion of the first region. In an embodiment of some of the methods disclosed herein, for example, the at least a fraction of the inhibitor agent accommodated by the first region undergoes hydrogen bonding with the plurality of hydroxyl groups. In an embodiment of some of the methods disclosed herein, for example, the at least a fraction of the inhibitor agent is accommodated by the first portion at a first adsorption rate and the at least a fraction of the inhibitor agent is accommodated by the second portion at a second adsorption rate, and wherein the first adsorption rate is substantially different from the second adsorption rate. In an embodiment of some of the methods disclosed herein, for example, the at least a fraction of the inhibitor agent remains accommodated by the first region for 0.5 seconds to 30 minutes after the step of exposing is stopped.

In an embodiment of some of the methods disclosed herein, for example, the inhibitor agent is characterized by a first differential heat of adsorption on the first portion and a second differential heat of adsorption on the second portion, and wherein the first differential heat of adsorption is substantially different from the second differential heat of adsorption.

In an embodiment of some of the methods disclosed herein, for example, a method for selectively forming a layer on a substrate further comprises exposing the receiving surface to a secondary inhibitor agent, wherein at least a fraction of the secondary inhibitor agent is accommodated by the first region and the secondary inhibitor agent comprises a substituted or an unsubstituted amine group, a substituted or an unsubstituted pyridyl group, a carbonyl group, a ketone group, a diketone group, or a combination of these.

In an embodiment of some of the methods disclosed herein, for example, the steps of exposing the receiving surface to the inhibitor agent and exposing the receiving surface to the secondary inhibitor agent are performed simultaneously.

In an embodiment of some of the methods disclosed herein, for example, the steps of exposing the receiving surface to the inhibitor agent and exposing the receiving surface to the secondary inhibitor agent are performed sequentially, in any order.

A second region may include a variety of compositions, such as those described below, for use in aspects or embodiments of the methods disclosed herein. For example, a second region includes composition(s) such that a layer forms (is deposited, for example, by CVD) on the second region even in the presence of inhibitor agent. For example, a second region includes compositions(s) such that an inhibitor agent is not accommodated by the second region during exposure of the receiving surface to the inhibitor agent. For example, a second region includes composition(s) such that an inhibitor agent does not reduce the average acidity at the second region. For example, at least a portion of a second region is a metal and/or a metal nitride. For example, at least a portion of a second region is a metal and/or a metal nitride that does not have a native oxide and/or surface hydroxyls thereon.

In an embodiment of some of the methods disclosed herein, for example, the second region comprises at least one of silicon, a metal and a nitride. In an embodiment of some of the methods disclosed herein, for example, the metal is selected from the group consisting of Ti, Fe, Mo, Ru, Pt, Au, Cr, Cu, In, Zn, Co, Mn, W, Al, and any combination thereof. In an embodiment of some of the methods disclosed herein, for example, the nitride is a metal or nonmetal nitride selected from the group consisting of vanadium nitride, titanium nitride, silicon nitride, and any combination thereof.

In an embodiment of some of the methods disclosed herein, for example, the second region further comprises a seed layer having a thickness of less than 10 nm. In an embodiment of some of the methods disclosed herein, for example, the seed layer is vanadium nitride.

In an embodiment of some of the methods disclosed herein, for example, the second region is not contiguous. In an embodiment of some of the methods disclosed herein, for example, the second region is in direct physical contact, direct thermal contact, or direct electrical contact with the first region. In an embodiment of some of the methods disclosed herein, for example, at least a portion of the second region is disposed on at least a portion of a surface of the first region.

A variety of one or more precursors, such as those described below, may be used in aspects or embodiments of the methods disclosed herein. For example, a precursor includes a composition that is accommodated by a surface having hydroxyl groups (e.g., acidic hydroxyl groups) such that a metal and/or metal oxide layer is formed on the surface accommodating the precursor. For example, a precursor is includes a composition that reacts with a surface having hydroxyl groups (e.g., reacts with the surface hydroxyls) such that a metal and/or metal oxide layer is formed on the surface accommodating the precursor. For example, a precursor comprises a ligand selected from the group consisting of a carbonyl group, an allyl group, and any combination thereof. For example, a precursor comprises a ligand selected from the group consisting of a carbonyl group, an allyl group, an alkyl group, and any combination thereof.

In an embodiment of some of the methods disclosed herein, for example, the precursor gas comprises a compound selected from the group consisting of $Mo(CO)_6$, $Fe(CO)_5$, $Ru_3(CO)_{12}$, $Cr(CO)_6$, $W(CO)_6$, $Co_2(CO)_8$, $Re_2(CO)_{10}$, $Rh(\eta_3-C_3H_5)_3$, and any combination thereof. In an embodiment of some of the methods disclosed herein, for example, the precursor gas comprises a compound selected from the group consisting of $Mo(CO)_6$, $Fe(CO)_5$, $Ru_3(CO)_{12}$, $Cr(CO)_6$, $W(CO)_6$, $Vn(CO)_6$, $Co_2(CO)_8$, $Re_2(CO)_{10}$, $Mn_2(CO)_{10}$, $Tc_2(CO)_{10}$, $Ni(CO)_4$, $Rh(\eta_3-C_3H_6)_3$, $Rh(allyl)_3$, $Pt(allyl)_2$, $Pt(allyl)Cp$, $Ir(allyl)_3$, $Pd(allyl)_2$, $Pd(allyl)Cp$, $PtCp(CH_3)_3$, and any combination thereof. In an embodiment of some of the methods disclosed herein, for example, the precursor gas comprises a ligand selected from the group consisting of a carbonyl group, an allyl group, an alkyl group (e.g., $(CH_3)_3$), a cyclopentadienyl (Cp), and any combination thereof. In an embodiment of some of the methods disclosed herein, for example, the precursor gas comprises a compound selected from the group consisting of $Mo(CO)_6$, $Fe(CO)_5$, $Ru_3(CO)_{12}$, $Cr(CO)_6$, $W(CO)_6$, $Co_2(CO)_8$, $Re_2(CO)_{10}$, $Rh(\eta_3-C_3H_5)_3$, $Rh(allyl)_3$, $Pt(allyl)_2$, $Pt(allyl)Cp$, $Ir(allyl)_3$, $Pd(allyl)_2$, $Pd(allyl)Cp$, $PtCp(CH_3)_3$, and any combination thereof. In an embodiment the precursor gas comprises a compound selected from the group consisting of: $Rh(allyl)_3$; $Pt(allyl)_2$; $Pt(allyl)Cp$; $Ir(allyl)_3$; $Pd(allyl)_2$; $Pd(allyl)Cp$ and $Ru(CO)_2(allyl)_2$. As will be generally understood by one of skill in the art various combinations of Cp, CO, allyl, and alkyl are useful as precursor gases.

In an embodiment of some of the methods disclosed herein, for example, a method for selectively forming a layer on a substrate further comprises contacting the receiving surface with a secondary precursor gas, wherein accommodation of the secondary precursor gas by the receiving surface results in selective formation of the layer on the second region.

A layer (i.e., a selectively formed layer) may include a variety of compositions, such as those described below, for use in aspects or embodiments of the methods disclosed herein. For example, a layer includes a metal. For example, a layer includes a metal nitride. For example, a layer includes a metal and/or a nonmetal oxynitride. For example, a layer includes a metal and/or a nonmetal carbide nitride. For example, a layer includes a metal and/or a nonmetal carbide oxynitride. For example, a layer is selectively formed at the base of a recess feature. For example, a layer is formed selectively at the walls/sides of a recess feature.

In an embodiment of some of the methods disclosed herein, for example, the layer forms on at least a portion of the first region during the step of contacting when the inhibitor agent is not accommodated by the at least a portion of the first region.

In an embodiment of some of the methods disclosed herein, for example, the layer comprises at least two portions each having different compositions. In an embodiment of some of the methods disclosed herein, for example, the layer is not contiguous. In an embodiment of some of the methods disclosed herein, for example, the receiving surface comprises relief structures. In an embodiment of some of the methods disclosed herein, for example, the layer is a conformal or superconformal thin film. In an embodiment of some of the methods disclosed herein, for example, the layer is a diffusion barrier layer in an electronic device. In an embodiment of some of the methods disclosed herein, for example, the layer is a gate dielectric layer in an electronic device, an electromigration cap layer, a metal contact, or a combination of these. In an embodiment of some of the methods disclosed herein, for example, the layer is substantially free of pinholes.

In an embodiment of some of the methods disclosed herein, for example, the layer is formed on the second region at a growth rate of at least 1 nm/s. In an embodiment of some of the methods disclosed herein, for example, the layer is formed on the first region after a nucleation delay time after the step of contacting is initiated at a growth rate of at least 1 nm/min. In an embodiment of some of the methods disclosed herein, for example, the nucleation delay time is at least 20 minutes, preferably in some applications at least 40 minutes, preferably in some applications at least 1 hour, and preferably in some applications at least 2 hours. In an embodiment of some of the methods disclosed herein, for example, the nucleation delay time is at least 3 hours, and preferably for some applications at least 4 hours. In an embodiment of some of the methods disclosed herein, for example, the nucleation delay time is such that nucleation does not occur. In an embodiment of some of the methods disclosed herein, for example, the layer is formed on the first portion at a first growth rate and the film is formed on the second portion at a second growth rate, and wherein the first growth rate is substantially different from the second growth rate.

In an embodiment of some of the methods disclosed herein, for example, the layer comprises Fe, Mo, Ru, Ti, Cu, Al, Co, Mn, W, $MoC_xN_y$, or any combination thereof, and wherein x is a number selected from the range of 0.01 to 1 and y is a number selected from the range of 0 to 0.5. In an embodiment of some of the methods disclosed herein, for example, the layer comprises Fe, Mo, Ru, Ti, Cu, Al, Co, Mn, W, or any combination thereof. In an embodiment of some of the methods disclosed herein, for example, the layer comprises Fe, Mo, Ti, Cu, Al, Co, Mn, W, or any combination thereof. In an embodiment of some of the methods disclosed herein, for example, the layer comprises Fe, Mo, Ru, Ti, Al, Co, Mn, W, MoC$_x$N$_y$, or any combination thereof, and wherein x is a number selected from the range of 0.01 to 1 and y is a number selected from the range of 0 to 0.5.

The methods disclosed herein may include a variety of alternative and/or additional process parameters or variables, such as those described below, for use in aspects or embodiments disclosed herein. For example, certain steps may be performed sequentially or simultaneously. For example, the methods may be used in a variety of applications or adapted for conventional layer formation techniques such as CVD or ALD.

In an embodiment of some of the methods disclosed herein, for example, the steps of exposing and contacting are performed simultaneously. In an embodiment of some of the methods disclosed herein, for example, the steps of exposing and contacting are performed sequentially.

In an embodiment of some of the methods disclosed herein, for example, the first region is prepared by oxidation of a metal or nonmetal of the first region. In an embodiment of some of the methods disclosed herein, for example, the first region is prepared by nitridation (e.g., forming a metal or a nonmetal nitride from a metal or nonmetal) of a metal or nonmetal of the first region.

In an embodiment of some of the methods disclosed herein, for example, the receiving surface has a temperature selected from the range of 150° C. to 210° C. In an embodiment of some of the methods disclosed herein, for example, the precursor gas has a partial pressure less than or equal to 100 mTorr. In an embodiment of some of the methods disclosed herein, for example, the inhibitor agent has a partial pressure less than or equal to 300 mTorr. In an embodiment of some of the methods disclosed herein, for example, the precursor gas has a partial pressure selected from the range of 0.01 mTorr to 5 mTorr. In an embodiment of some of the methods disclosed herein, for example, the inhibitor agent has a partial pressure selected from the range of 0.01 mTorr to 15 mTorr.

In an embodiment of some of the methods disclosed herein, for example, the method provides improved selectivity of forming said layer on said substrate (e.g., relative to conventional methods for depositing a layer). In an embodiment of some of the methods disclosed herein, for example, the method provides improved selectivity of forming said layer on said substrate relative to inherent selectivity. In an embodiment of some of the methods disclosed herein, for example, the method provides improved selectivity of forming said layer on said substrate relative to inherent selectivity by a factor of at least 10. In an embodiment of some of the methods disclosed herein, for example, the method provides improved selectivity of forming said layer on said substrate relative to inherent selectivity by a factor of at least 100.

In any embodiment, the methods disclosed herein are compatible with selective formation of the layer via an atomic layer deposition (ALD) technique. In an embodiment, the step of contacting the receiving surface with a precursor gas is performed as a pulse or a series of pulses during an ALD process. In an embodiment, the pulse of precursor gas is provided concurrently with the step of exposing the receiving surface to an inhibitor agent, and wherein the step of exposing is performed continuously (e.g., not pulsed). In an embodiment, the step of exposing the receiving surface to an inhibitor agent is performed as a pulse or a series of pulses during an ALD process, optionally concurrently with a pulse or series of pulses corresponding to the step of contacting the receiving surface with a precursor gas. In an embodiment, for example, the fraction of the inhibitor agent that is accommodated by the first region may be characterized by an accommodation residence time, such that a substantial amount of the accommodated fraction of inhibitor agent remains accommodated by the first region even after the flow of inhibitor agent to the atmosphere (e.g., reaction chamber) is shut off. In an embodiment, for example, the accommodation residence time is such that a substantial amount of the accommodated fraction of inhibitor agent remains accommodated when a precursor gas is pulsed into the atmosphere while flow of the inhibitor agent is off.

In an embodiment of some of the methods disclosed herein, for example, the first region is not contiguous. In an embodiment of some of the methods disclosed herein, for example, the first region and the second region are not contiguous with respect to each other. In an embodiment of some of the methods disclosed herein, for example, the first region and the second region are contiguous with respect to each other. In an embodiment of some of the methods disclosed herein, for example, the first region or the second region, or both, is independently a plurality of regions. In an embodiment, the first region is an edge of a thin film, a nanoscale feature, or a microscale feature. In an embodiment, the second region is an edge of a thin film, a nanoscale feature, or a microscale feature.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

(FIG. 3A) In-situ ellipsometry parameter delta, at a photon energy of 2.65 eV, vs. time for growth using 0025 mTorr of Mo(CO)$_6$ precursor with a co-flow of ammonia at a pressure of 3.5 mTorr on SiO$_2$ substrate at 200° C. (FIG. 3B) Cross-sectional SEM image of MoC$_x$ film grown using precursor alone for 30 min, with otherwise same protocol as in FIG. 3A. (FIG. 3C) AFM scan (2×2 µm) of the SiO$_2$ substrate after 0.5, 1, and 2 hours of exposure to the flow of precursor and ammonia (FIG. 3A).

(FIG. 5A) SEM image of patterned substrate with Ti on the upper left and SiO$_2$ on lower right. (FIG.

5B) Auger elemental map of Mo (red color); the substrate had been exposed to 0.025 mTorr of Mo(CO)$_6$ and 3.7 mTorr of NH$_3$ at 200° C. Growth time is 60 min. (FIG. 5C) Auger elemental map of Si (green color). Speckles are due to defects on surface dust.

(FIG. 6A) before growth (note the rough morphology of the Nb base); (FIG. 6B) growth of MoC$_x$N$_y$ under non-selective conditions at 200° C. using 0.025 mTorr Mo(CO)$_6$, where nucleation happens on Nb and SiO$_2$ surfaces; and (FIG. 6C) growth of MoC$_x$N$_y$ under selective conditions using 0.025 mTorr precursor and 3.7 mTorr ammonia, where nucleation happens only on the Nb base.

(FIG. 7A) SEM micrograph of Fe grown on SiO$_2$ substrate at 150° C. using Fe(CO)$_5$ precursor only. AFM scans (2×2 μm) on SiO$_2$ substrate under selective growth conditions: (FIG. 7B) at 150° C. with a co-flow of 18 mTorr ammonia; (FIG. 7C) at 130° C. with a co-flow of 10 mTorr ammonia. The Fe(CO)$_5$ precursor pressure is 0.01 mTorr. Growth time is 10 min. The white blob in FIG. 7A is due to stray nucleation on dust.

(FIG. 8A) at 150° C. using precursor only; and (FIG. 8B) at 150° C. with a co-flow of 10 mTorr ammonia.

STATEMENTS REGARDING CHEMICAL COMPOUNDS AND NOMENCLATURE

Figure 1A:
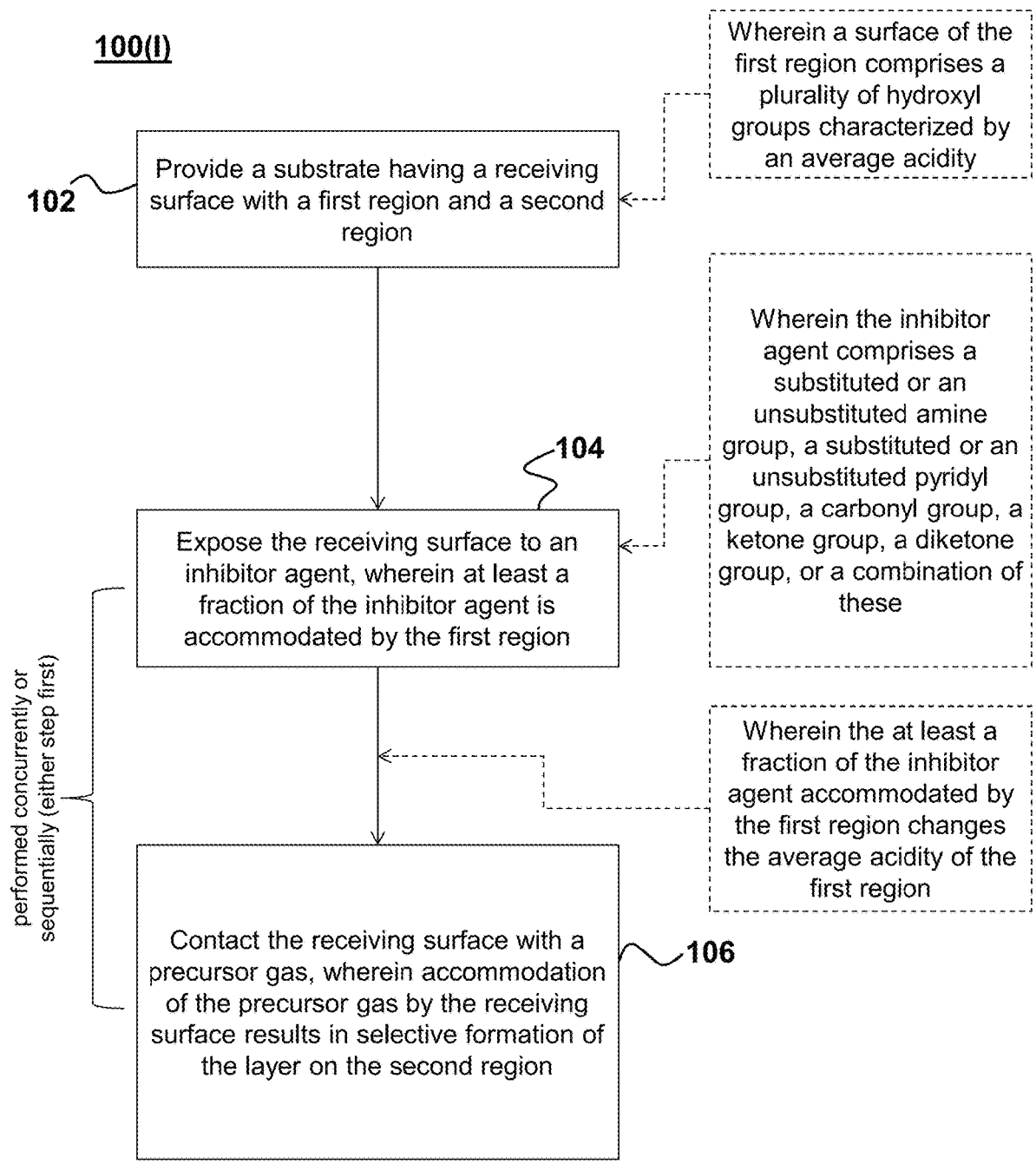
FIGS. 1A-1B. Flowcharts showing exemplary methods for selectively forming a layer on a substrate, according to certain embodiments.

In general the terms and phrases used herein have their art-recognized meaning, which can be found by reference to standard texts, journal references and contexts known to those skilled in the art. Referring to the drawings, like numerals indicate like elements and the same number appearing in more than one drawing refers to the same element. The following definitions are provided to clarify their specific use in the context of the invention.

In an embodiment, the term "selectively forming a layer", or obvious variation thereof, such as the term "selection formation of the layer", the term "selectively formed layer", and the term "area selective deposition", and in some embodiments a "selective layer", refers to formation of the layer on a first region with substantially no formation of the layer on a second region. In an embodiment, the term "selectively forming a layer", or obvious variation thereof, refers to formation of the layer on a first region with a nucleation delay time that is at least 10 seconds, at least 30 seconds, at least 1 minute, at least 5 minutes, at least 10 minutes, at least 1 hour, or preferably for some applications at least 2 hours longer than a nucleation delay time of the layer on a second region. In an embodiment, the term "selectively forming a layer", or obvious variation thereof, refers to formation of the layer on a first region with a nucleation delay time that is at least 10%, at least 20%, at least 50%, at least 75%, at least 100%, at least 150%, at least 200%, at least 500%, or preferably for some applications at least 1000% longer in time than a nucleation delay time of the layer on a second region. In an embodiment, the term "selectively forming a layer", or obvious variation thereof, refers to formation of the layer on a first region such that the thickness, continuity, contiguousness, growth rate, and/or smoothness is(are) substantially different from that(those) of the layer on a second region. In an embodiment, the term "selectively forming a layer", or obvious variation thereof, refers to formation of the layer on a first region such that a nucleation density, at a select time point, of the layer on the first region is substantially greater, preferably for some applications at least 50% greater, preferably for some applications at least 100% greater, preferably for some applications at least 200% greater, or preferably for some applications at least 500% greater, than a nucleation density, at the select time point, of the layer on a second region. In an embodiment, the term "selectively forming a layer", or obvious variation thereof, does not refer to intrinsic selectivity or refers to selectivity that is characterized by a greater degree of selectivity than that corresponding to intrinsic selectivity (e.g., similar method performed without step of exposing receiving surface to inhibitor agent). In an embodiment, "selectivity" is characterized by one or more parameters selected from the group consisting of a nucleation delay time, a nucleation density, thickness, continuity, contiguousness, growth rate, smoothness, and a combination of these.

"Molecule" refers to a collection of chemically bound atoms with a characteristic composition. As used herein, a molecule can be neutral or can be electrically charged, such as singly charged and multiply charged ions.

"Complex" refers to a molecule comprising at least one a metal ion and at least one organic ligand that charge balances the metal ion.

"Conformal layer" refers to the physical characteristics of a layer of deposited material, for example, a thin film structure deposited on a substrate. In an embodiment, a conformal layer lacks pinholes, gaps or voids having a volume larger than about $1 \times 10^{-6}$ µm$^3$ within the bulk phase of the conformal layer or positioned between the layer and the surface(s) of a feature coated by the layer. In some embodiments, conformal layers have uniform thickness at any surface of the layer (e.g., with variation less than about 20%). In some embodiments, conformal layers have uniform density throughout the layer (e.g., with variation less than about 20%). Conformal layers in the present invention may have a uniform composition throughout the layer or may have a composition that varies through all or a portion of the layer. The term "superconformal" refers to the result in which the thickness of coating on the bottom of the feature proximate to the bottom of the feature is larger than the thickness of coating on a surface immediately outside of the feature adjacent to its opening (e.g., immediate top portion of a wall or side of a recess or relief feature).

"Aspect ratio" is a physical characteristic of a feature, such as a recessed feature, equal to the depth of the feature divided by a physical dimension defining the opening size of the feature (i.e. a cross sectional dimension (width or diameter) of the opening). Methods of the present invention are well suited for conformally or superconformally coating and/or uniformly filling high aspect ratio recessed features.

"Feature" refers to a three-dimensional structure or structural component of a substrate. Features may be recessed in which they extend into a substrate surface or may be relief features embossed on a substrate surface. Features include, but are not limited to, trenches, cavities, vias, channels, posts, slots, stands, columns, ribbons, pores, holes, apertures or any combination of these. Features include pores, channels, holes, cavities and apertures in porous and/or fibrous substrates.

"Disproportionation" refers to a redox reaction wherein a species is simultaneously reduced and oxidized to form two different products.

"Accommodation" refers to the processes involved with the loss and/or uptake of a gas to a surface or bulk phase. As used herein, accommodation includes a range of chemical and physical processes involving gas molecules, atomic species and ions and a surface. For example, accommodation may include physisorption, chemisorption, decomposition, chemical reaction, and condensation processes. Accommodation includes reactions of gas molecules, including gas molecules adsorbed or otherwise condensed on a surface, and condensed phase species present on a surface and/or present in the bulk phase.

"Flux" refers to the number of molecules or atoms that impinge upon (e.g. collide or otherwise interact with) a surface or that pass through a given area of space per unit time per unit area. Flux may be expressed in units of (number s$^{-1}$ cm$^{-2}$), and is provided by the equation:

$$\text{Flux} = \frac{(\text{\# of molecules impinged on the surface})}{\text{time} \times \text{area}}$$

"Inhibitor agent" refers to atomic species, molecular species, ionic species or any combination(s) of these that selectively adjust the relative rates of chemical and/or physical processes involved in the nucleation, formation and/or growth of layers, such as thin film structures, generated by the deposition and/or accommodation of precursors (and optionally co-reactants). In some of the embodiments disclosed herein, an inhibitor agent decreases the rate of nucleation, formation, and/or growth of a material (e.g., nanocrystal or thin film material; e.g., metal or metalloid) on a receiving surface (e.g., substrate). In some embodiments, the inhibitor agent decreases the rate of nucleation, formation, and/or growth of a material by 50% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material by 70% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material by 80% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material by 90% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material by 95% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material by 99% or more, compared to the rate of nucleation, formation, and/or growth of the material in the absence of the inhibitor under otherwise identical or similar conditions. In some embodiments, the inhibitor agent decreases the rate of nucleation, formation, and/or growth of a material to zero, compared to the rate of nucleation, formation, and/or growth of the material in the absence of the inhibitor under otherwise identical or similar conditions. In some embodiments, the inhibitor agent decreases the rate of nucleation, formation, and/or growth of a material such that no nucleation, formation, and/or growth of the material is not detectable (e.g., not discernible from contamination, dust, impurities, measurement noise, and/or measurement artifacts) by conventional means. In some embodiments disclosed herein, an inhibitor agent increases the time delay before an onset of substantial nucleation, formation, and/or growth of a material by a factor of 1.1 to 100, compared to the nucleation delay of the material in the absence of the inhibitor under otherwise identical or similar conditions. In some embodiments disclosed herein, an inhibitor agent increases the time delay before an onset of substantial nucleation, formation, and/or growth of a material by a factor of 1.1 to 50, compared to the nucleation delay of the material in the absence of the inhibitor under otherwise identical or similar conditions. In some embodiments disclosed herein, an inhibitor agent increases the time delay before an onset of substantial nucleation, formation, and/or growth of a material by a factor of 1.1 to 20, compared to the nucleation delay of the material in the absence of the inhibitor under otherwise identical or similar conditions. In some embodiments disclosed herein, an inhibitor agent increases the time delay before an onset of substantial nucleation, formation, and/or growth of a material from zero (no nucleation delay) to at least 120 minutes, compared to the nucleation delay of the material in the absence of the inhibitor under otherwise identical or similar conditions. In some embodiments disclosed herein, an inhibitor agent increases the time delay before an onset of substantial nucleation, formation, and/or growth of a material from zero (no nucleation delay) to at least 60 minutes, compared to the nucleation delay of the material in the absence of the inhibitor under otherwise identical or similar conditions. In some embodiments disclosed herein, an inhibitor agent increases the time delay before an onset of substantial nucleation, formation, and/or growth of a material from zero (no nucleation delay) to at least 10 minutes, compared to the nucleation delay of the material in the absence of the inhibitor under otherwise identical or similar conditions. An inhibitor agent may be used in the form of a gas. An inhibitor agent may be introduced to a process (e.g., chemical vapor deposition or atomic layer deposition), such as those disclosed herein, in the form of a gas and, optionally, some of the inhibitor agent may condense onto one or more surfaces through chemical and/or physical interaction(s) with the one or more surfaces. An inhibitor agent may be a neutral molecule. An inhibitor agent may possess an electric charge (i.e. an ion). According to some of the embodiments disclosed herein, an inhibitor agent is characterized by a pKa greater than or equal to 15 (e.g., pKa of water is 15.7 and pKa of ammonia is 38). According to some of the embodiments disclosed herein, an inhibitor agent is characterized by a pKa greater than or equal to 20. According to some of the embodiments disclosed herein, an inhibitor agent is characterized by a pKa greater than or equal to 30. According to some of the embodiments disclosed herein, an inhibitor agent is characterized by a pKa greater than or equal to 35. The methods include processes wherein the inhibitor and precursor gas are provided simultaneously, such as in a continuous flow, and, alternatively, wherein the inhibitor and precursor gas are provided at separate times, such as wherein the inhibitor and precursor gas are provided sequentially via a pulsed flow. Precursor gases and/or inhibitors may be provided via a continuous flow or discontinuous (e.g. pulsed) flow.

The acidity or basicity of an atomic, ionic, or molecular species may be characterized by its pKa. The term "pKa" refers to the negative logarithm of the acid dissociation constant ($K_a$) (i.e., $pk_a = -\log_{10} K_a$). Alternatively, the acidity or basicity of an atomic, ionic, or molecular species may be characterized by its pKaH, which is the pKa of the conjugate acid of the species in question. For example, the pKa of $NH_3$ is 38 and the pKaH of $NH_3$ is 9.2 (i.e., the pKa of $NH_4+$ is 9.2). In some embodiments, the acidity or basicity of a species is characterized by the isoelectric point (IEP), as described below.

"Average acidity" refers to an average acidity of hydroxyl (—OH) groups at a surface. In some embodiments, average acidity of a surface, region, or portion of a substrate or a layer corresponds to the average acidity associated with hydroxyl groups on said surface, region, or portion of said substrate or said layer. For example, hydroxyl groups may be present at the surface of a metal oxide (e.g., $TiO_2$) or nonmetal (e.g., metalloid) oxide (e.g., $SiO_2$). Hydroxyl groups may also be present at the surface of metal nitride and nonmetal nitride materials (e.g., TiN and SiN). Average acidity is characterized by the isoelectric point (IEP), which is the pH value of an aqueous solution needed to establish zero net charge on the surface (e.g., metal or nonmetal oxide surface). Acidic hydroxyl groups have a negative surface charge in liquid water at neutral pH, so that the pH needs to be lowered to obtain a neutral surface charge, and conversely for basic hydroxyls. "Acidic hydroxyl groups" or "acidic hydroxyls" refer to hydroxyl groups at a surface characterized by an IEP less than 7. "Basic hydroxyl groups" or "basic hydroxyls" refer to hydroxyl groups at a surface characterized by an IEP greater than 7. The expression "more acidic" refers to a relatively lower IEP, the expression "less acidic" refers a relatively higher IEP, the expression "more basic" refers to a relatively higher IEP, and the expression "less basic" refers to a relatively lower IEP. For example, in general, the oxides $SiO_2$, $RuO_2$, and $TiO_2$ have acidic hydroxyl groups with IEP of 2.2, 4.2, and 4-6, respectively. For example, in general, the oxides MgO and $Al_2O_3$ have basic hydroxyl groups with IEP of 12 and 8-9, respectively. IEP values decrease slightly with increasing temperature. In general higher temperatures may not convert basic hydroxyl groups to acidic ones. The average acidity of hydroxyl groups at the surface of a film may depend on the substrate upon which the film was grown or otherwise deposited. In some cases, the average acidity of hydroxyl groups at the surface of a film supported by a substrate may be different (e.g., more acidic or more basic) from the average acidity of hydroxyls on the film, alone, or the substrate, alone. For example, the surface hydroxyls on a film of $Al_2O_3$ that is supported by a $SiO_2$ substrate may be more acidic than surface hydroxyls on alumina that is unsupported by a substrate and more acidic than surface hydroxyls on silica that is unsupported by a substrate. It will be appreciated that the acidity of hydroxyl groups on a surface (e.g., of $Al_2O_3$) may not be uniform and that accommodation of an inhibitor at the respective surface may be non-uniform, due, at least in part, to the non-uniformity of the acidity of the surface hydroxyl groups.

In some of the embodiments disclosed herein, the accommodation of an inhibitor agent at a surface, or region of a surface, reduces the average acidity (i.e., less acidic; higher IEP) of the surface hydroxyls on that surface, or corresponding region of the surface. In some of the embodiments disclosed herein, accommodation of an inhibitor agent at a surface reduces the average acidity of the surface hydroxyls at that surface by a factor of 14 on the IEP scale (e.g., from an IEP of 1 to an IEP of 14). In some of the embodiments disclosed herein, accommodation of an inhibitor agent at a surface reduces the average acidity of the surface hydroxyls at that surface by a factor of at least 10 on the IEP scale. In some of the embodiments disclosed herein, accommodation of an inhibitor agent at a surface reduces the average acidity of the surface hydroxyls at that surface by a factor of at least 5 on the IEP scale. In some of the embodiments disclosed herein, accommodation of an inhibitor agent at a surface reduces the average acidity of the surface hydroxyls at that surface by a factor of at least 2 on the IEP scale or by an increment of at least 2 on the IEP scale. In some of the embodiments disclosed herein, accommodation of an inhibitor agent at a surface reduces the average acidity of the surface hydroxyls at that surface by a factor of at least 1.5 on the IEP scale or by an increment of at least 1.5 on the IEP scale. In some of the embodiments disclosed herein, accommodation of an inhibitor agent at a surface reduces the average acidity of the surface hydroxyls at that surface by a factor of at least 1.1 on the IEP scale.

The term "nonmetal" refers to a material (e.g., ion, element, molecule, compound, or combination of these) that is not a metal. Nonmetals include metalloids. As used herein, the term "metalloid" refers to any of B, one or more allotropes of C (e.g., graphite, graphene, carbon black, carbon nanotubes, pyrolyzed carbon, graphitic carbon, graphitizable carbon, non-graphitizable carbon, etc.), Si, Ge, As, Sb, Te, Po, and At. Other nonmetals, as used herein, include certain allotropes of C (e.g., diamond), S, and Se. In some embodiments disclosed herein, the terms "nonmetal oxide" and "nonmetal nitride" refer to oxide and nitride compounds, respectively, the chemical formulas for which do not include of a metal element. In some embodiments disclosed herein, the terms "nonmetal oxide" and "nonmetal nitride" refer to oxide and nitride compounds, respectively, the chemical formulas of which include at least one nonmetal element. Relevant nonmetal oxides include metalloid oxides such as $SiO_2$, $SiO_x$, $SiO_xC_y$, GeO, $GeO_2$, and $GeO_x$, where x and y are independently selected from the range of 0.1 and 2. Relevant nonmetal nitrides include metalloid nitrides such as SiN, $SiN_x$, $Si_3N_4$, and $Ge_3N_4$, where x is selected from the range of 0.1 and 1. Relevant nonmetal oxides and nonmetal nitrides are in solid, semi-solid, or liquid form under process conditions relevant to those disclosed herein. Preferably, relevant nonmetal oxides and nonmetal nitrides (including oxynitrides, carbide nitrides, carbide oxynitride, and carbides) are those that are in solid or semi-solid form under process conditions relevant to those disclosed herein. In an embodiment, relevant nonmetal surfaces include sacrificial layers, for example present at low temperature processing. In an embodiment, relevant nonmetal surfaces include photoresist.

An "oxide" refers to a solid state chemical compound that contains at least one oxygen atom and at least one other element in its chemical formula. For example, a metal oxide is a solid compound that contains at least one oxygen atom and at least one metal element in its chemical formula. A "native oxide" is an oxide that does or would be thermodynamically favored to form under given conditions, such as under an ambient air atmosphere at STP or at NTP. In an embodiment, the chemical composition or chemical formula of a native oxide is substantially the composition or chemical formula of an oxide of a material if that material is exposed to ambient air atmosphere at STP or NTP for at least 1 year. A material may react with at least one oxidizing fluid, such as oxygen and/or water vapor, resulting in at least a fraction of the material, such as the fraction directly in contact with the oxidizing fluid, converting to a native oxide. Preferably for some applications, a native oxide comprises at least one metal, at least one metalloid, or a mixture or alloy of at least one metal and at least one metalloid. For example, a native oxide may refer to an oxide layer formed from the conversion of at least a portion of a metal alloy to a mixed oxide via a chemical reaction, such as via chemical reaction with oxygen, water vapor, and/or another oxidizing fluid. In some embodiments of the methods disclosed herein, a native oxide is characterized by a thickness selected from the range of 1 nm to 100 nm, 1 nm to 1 µm, 10 nm to 1 µm, 10 nm to 100 µm, 100 nm to 100 µm, 100 nm to 1 µm, or preferably for some applications 100 nm to 10 µm. An oxide, such as a metal oxide, is not necessarily a stoichiometric oxide and may be a nonstoichiometric oxide. In an embodiment, an oxide is a stoichiometric oxide. In an embodiment, an oxide is a non-stoichiometric oxide. For example, $MoO_3$, $MoO_{3-\delta}$, and $MoO_x$ are exemplary oxides, where $MoO_3$ is a stoichiometric oxide and where $MoO_{3-\delta}$, and $MoO_x$ are each a non-stoichiometric oxide; where x is less than 3 and where $\delta$ is less than 3. In an embodiment, an oxide, such as a metal oxide, a nonmetal oxide, a mixed oxide, a metal oxynitride, a nonmetal oxynitride, a mixed oxynitride, and a combination of these, may comprise additives, such as dopants. Dopants include, but are not limited to, carbon, boron, phosphorous, and combinations of these. For example, carbon-doped $SiO_2$ is an exemplary nonmetal oxide. Similarly, in an embodiment, a nitride, such as a metal nitride, a nonmetal nitride, a mixed nitride, a metal oxynitride, a nonmetal oxynitride, a mixed oxynitride, and a combination of these, may comprise additives, such as dopants.

A "mixed oxide" refers to an oxide whose chemical formula comprises a plurality of elements selected from the group consisting of metal, metalloid, nonmetal, and any combination thereof. The term "metal oxide" refers to an oxide whose chemical formula comprises at least one metal and/or metalloid element. In an embodiment, the term "metal oxide" refers to an oxide who chemical formula comprises at least one metal and/or metalloid element, and does not comprise a nonmetal element. The term "metal oxide" refers to an oxide whose chemical formula comprises at least one metal element. In an embodiment, the term "metal oxide" refers to an oxide whose chemical formula comprises at least one metal element, and does not comprise a nonmetal element. In some embodiments, a metal oxide is a mixed oxide, such as an oxide whose chemical formula consists of oxygen and a plurality of metal elements.

The term "deterministic" refers a material whose composition and/or at least one property is predetermined and/or controlled to within 20%, preferably within 10%, more preferably within 5%, more preferably within 1%, or more preferably within 0.1% of a determined or desired composition and/or property. For example, a concentration and/or an average acidity of a plurality of hydroxyl groups associated with a surface is/are deterministic if the concentration and/or the average acidity is known and/or controlled to within 20%, preferably within 10%, more preferably within 5%, more preferably within 1%, or more preferably within 0.1% of a predetermined or desired concentration value and/or average acidity value, respectively.

As used herein, the phrase "density of nuclei" or the term "density", when it refers to nuclei on a surface, refers to areal density, i.e., density over a two-dimensional area, quantified as the number of nuclei per unit area.

The term "physical dimension" or "dimension" refers to a physical characteristic of a structure, feature of a structure or pattern of structures or features that characterizes how the structure, features or pattern of structures or features is oriented in two or three dimensions and/or occupies space. Physical dimensions of structures, features of structures or patterns of structures or features include, length, width, height, depth, radius, radius of curvature and periodicity. "Nanosized" refers to a physical dimension ranging from 1 nm to 1000 nm and "microsized" refers to a physical dimension ranging from 1 µm to 1000 µm.

"Smooth" refers to a property of a thin film relating to the extent of vertical deviations of a real surface from its ideal form, such as a planar geometry of a thin film. In an embodiment, a smooth film has a low surface roughness, such as a surface root mean squared (rms) surface roughness less than or equal to 20 nm, and in some embodiments a surface root mean squared (rms) surface roughness less than or equal to 10 nm. In an embodiment, an ultrasmooth film has a very low surface roughness, such as a surface root mean squared (rms) surface roughness less than or equal to 1 nm.

"Precursor gas" refers to molecules or atoms that interact with a receiving surface of a substrate in a manner that forms nuclei and/or a deposited layer (i.e. undergoes deposition), such as a thin film layer. Precursor gases interact with a receiving surface, for example, via accommodation to result in nucleation and growth of nuclei. Precursor gases may also interact with the surfaces of nuclei, for example, via accommodation to result in growth of nuclei. Useful precursor gases, for example, are CVD or ALD precursors that react with the surfaces of a substrate to generate a deposited layer having a desired composition via a chemical vapor deposition process or atomic layer deposition process. Alternatively, other useful precursor gases are PVD gases that condense on a substrate surface, are physi-adsorbed and/or are chemi-adsorbed on a substrate surface via a physical vapor deposition process. Useful precursor gases include, but are not limited to, pure elements, and compounds that are combinations of elements (including hydrogen) with one or more of the following functional groups: hydrides, borohydrides, halides, oxides, chalcogenides, nitrides, pnictides, alkyls, aryls, allyls, cyclopentadienyls, alkenes, arenes, silyls, amides, amidinates, amines, phosphides, phosphines, arsines, diazines, alkoxides, alcohols, ethers, siloxides, carboxylates, beta-diketonates, thiolates, selenolates, and tellurolates. The present invention includes methods simultaneously exposing a substrate to a plurality of precursor gases, and methods wherein different precursor gases are sequentially exposed to a substrate undergoing processing (i.e. first precursor gas(es) is(are) replaced with different precursor gas(es) during processing).

"Fluid communication" refers to the configuration of two or more elements such that a fluid, such as a gas, is capable of flowing in the gas phase or via surface diffusion from one element to another element. Elements may be in fluid communication via one or more additional elements such as openings, tubes, channels, valves, pumps or any combination of these.

"Substrate" refers to a material, layer or other structure having a surface, such as a receiving surface, that is capable of supporting a deposited material, such as a thin film structure or layer. Substrates may optionally have a receiving surface having one or more features, such as nanosized or microsized recessed features including high aspect ratio features.

"Semiconductor" refers to any material that is an insulator at a very low temperature. A semiconductor may have an appreciable electrical conductivity, for example at an elevated temperature of about 300 Kelvin, and/or when suitably modified by alloying with "dopant" atoms that purposefully increase the electrical conductivity. In the present description, use of the term semiconductor is intended to be consistent with use of this term in the art of microelectronics and electronic devices. Useful semiconductors include those comprising elemental semiconductors, such as silicon, germanium and carbon, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductor alloys such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, graphene, carbon nanotubes, hexagonal BN, semiconductor materials having a 2D structure, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, BiI3, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Dielectric" or "insulating" refers to a non-conducting material having a conductivity less than 100 S/m, or less than 50 S/m, or less than 10 S/m or less than 1 S/m. Specific examples of inorganic dielectric materials include, but are not limited to, nitrides, such as silicon nitride, carbides, silicon dioxide and polymers.

"Conductive" and "electrically conductive" refer to a characteristic or physical property of a material that readily conducts electrons. A conductive material has a conductivity greater than 100 S/m, or greater than 500 S/m, or greater than 800 S/m, or greater than 1000 S/m, or greater than 2500 S/m, or greater than 5000 S/m. Specific examples of conductive materials include, but are not limited to, metals, doped semiconductors, doped or off-stoichiometric oxides, and polymers.

"Electronic device" generally refers to a device incorporating a plurality of components, and includes large area electronics, macroelectronic devices, display devices, integrated circuits, memory devices, photovoltaic devices, MEMS, NEMS, microfluidic and nanofluidic devices, and sensors including biological and/or chemical sensors, and physical sensors (e.g., temperature, etc.).

"Coalescence" refers to a process in which formation and growth of nuclei on a substrate leads to the conception of a substantially pinhole-free film, such as a smooth thin film layer or other structure.

As generally understood in the art, "hfac" refers to hexafluoroacetylacetone or an ionic form thereof, e.g., hexafluoroacetylacetonate; "dme" refers to 1,2-dimethoxyethane; "vtms" refers to vinyltrimethylsilane; "mhy" refers to 2-methyl-1-hexen-3-yne; "Hacac" refers to acetylacetone; and "tmod" refers to 2,2,7-trimethyloctane-3,5-dione or an ionic form thereof, e.g., 2,2,7-trimethyloctane-3,5-dionate.

The term "contiguous" may refer to a plurality of elements, a plurality of portions, or a plurality of regions that are in at least partial physical contact with each other. In an embodiment, a first region and a second region are contiguous, with respect to each other, when the first and the second regions are at least partially in physical contact with each other. Two contiguous regions may be adjacent to each other. In an embodiment, a first region and a second region are not contiguous, with respect to each other, when the first and the second regions are not in physical contact with each other. In an embodiment, when referring to a single region, such as a region of an element, layer, substrate, or film, the term "contiguous" refers to the single region being continuous such that any portion of the single region is in direct physical contact with another portion of the single region and no portion of the single region is not in physical contact with another portion of the single region.

In an embodiment, a composition or compound of the invention, such as a metal catalyst composition or formulation, is isolated or substantially purified. In an embodiment, an isolated or purified compound is at least partially isolated or substantially purified as would be understood in the art. In an embodiment, a substantially purified composition, compound or formulation of the invention has a chemical purity of 95%, optionally for some applications 99%, optionally for some applications 99.9%, optionally for some applications 99.99%, and optionally for some applications 99.999% pure.

Many of the molecules disclosed herein contain one or more ionizable groups. Ionizable groups include groups from which a proton can be removed (e.g., —COOH) or added (e.g., amines) and groups that can be quaternized (e.g., amines). All possible ionic forms of such molecules and salts thereof are intended to be included individually in the disclosure herein. With regard to salts of the compounds herein, one of ordinary skill in the art can select from among a wide variety of available counterions that are appropriate for preparation of salts of this invention for a given application. In specific applications, the selection of a given anion or cation for preparation of a salt can result in increased or decreased solubility of that salt.

The compounds of this invention can contain one or more chiral centers. Accordingly, this invention is intended to include racemic mixtures, diasteromers, enantiomers, tautomers and mixtures enriched in one or more stereoisomer. The scope of the invention as described and claimed encompasses the racemic forms of the compounds as well as the individual enantiomers and non-racemic mixtures thereof.

As used herein, the term "group" may refer to a functional group of a chemical compound. Groups of the present compounds refer to an atom or a collection of atoms that are a part of the compound. Groups of the present invention may be attached to other atoms of the compound via one or more covalent bonds. Groups may also be characterized with respect to their valence state. The present invention includes groups characterized as monovalent, divalent, trivalent, etc. valence states.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 2-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, 7- or 8-member ring(s). The carbon rings in cycloalkyl groups can also carry alkyl groups. Cycloalkyl groups can include bicyclic and tricycloalkyl groups. Alkyl groups are optionally substituted. Substituted alkyl groups include among others those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully halogenated or semihalogenated alkyl groups, such as alkyl groups having one or more hydrogens replaced with one or more fluorine atoms, chlorine atoms, bromine atoms and/or iodine atoms. Substituted alkyl groups include fully fluorinated or semifluorinated alkyl groups, such as alkyl groups having one or more hydrogens replaced with one or more fluorine atoms. Substituted alkyl groups may include substitution to incorporate one or more silyl groups, for example wherein one or more carbons are replaced by Si. A relevant alkyl group, as used herein, includes, for example, ($CH_3$), for example as part of $PtCp(CH_3)_3$.

The term "(allyl)", as used, for example, in $Rh(allyl)_3$, $Pt(allyl)_2$, Pt(allyl)Cp, $Ir(allyl)_3$, $Pd(allyl)_2$, and Pd(allyl)Cp, refers to a ($C_3H_5$) ligand group, which has the structure $H_2C=CH-CH_2X$, where X is the rest of the compound (e.g., the metal center). As used herein, the term "(allyl)" may include an allyl ligand characterized by any practically and/or synthetically feasible hapticity, where hapticity is commonly represented by the symbol n (e.g., $\eta^1$, $\eta^2$, $\eta^3$, $\eta^4$, $\eta^5$, etc.). As used herein, the term "(allyl)" may include an allyl ligand characterized by any practically and/or synthetically feasible denticity (e.g., monodentate, bidentate, tridentate, tetradentate, pentadentate, or hexadentate) when coordinated or bound with a metal atom.

In some embodiments, unless otherwise stated, the term "Cp" as used, for example, in Pt(allyl)Cp, Pd(allyl)Cp, and $PtCp(CH_3)_3$, refers to a cyclopentadienyl ligand group having the formula $C_5H_5$. The cyclopentadienyl group may form a complex with a metal to form, for example, some example precursor gas compounds. In some embodiments of the methods disclosed herein, the term "Cp" refers to a pentamethylcyclopentadiene ligand, having the formula $C_{10}H_{16}$ (or, $C_5Me_5H$ where $Me=CH_3$). As used herein, a cyclopentadienyl group may include any cyclopentadienyl ligand characterized by any practically and/or synthetically feasible hapticity (e.g., $\eta^3$ or $\eta^5$). As used herein, a cyclopentadienyl group may include any cyclopentadienyl ligand characterized by any practically and/or synthetically feasible denticity.

As used herein, the term "substituted" refers to a compound wherein a hydrogen is replaced by another functional group, including, but not limited to: hydroxide (—OH), methyl, ethyl, n-propyl, iso-propyl, c-propyl, cyclopropyl, n-butyl, s-butyl, t-butyl, cyclobutyl, n-pentyl, branched-pentyl, cyclopentyl, n-hexyl, branched hexyl, cyclohexyl group(s), phenyl group(s), carbonyl (C=O), a ketone (RC (=O)R'), sulfide (e.g., RSR'), phosphate (ROP(=O)(OH)$_2$), azo (RNNR'), cyanate (ROCN), amine (e.g., primary, secondary, or tertiary), imine (RC(=NH)R'), nitrile (RCN), ether (ROR'), halogen or a halide group, or any combination thereof; where each of R and R' is independently a hydrogen or a substituted or unsubstituted alkyl group, aryl group, alkenyl group, or a combination of these.

The term "differential heat of adsorption" refers to the slope of integral heat (or, enthalpy) evolved during adsorption versus the absorbed quantity. Differential heat (or, enthalpy) of adsorption is a measure of the energy (or, enthalpy) of interaction of the adsorbate with individual surface sites.

The term "substantially" refers to a property that is within 10%, within 5%, within 1%, or is equivalent to a reference property. The term "substantially equal", "substantially equivalent", or "substantially unchanged", when used in conjunction with a reference value describing a property or condition, refers to a value that is within 10%, optionally within 5%, optionally within 1%, optionally within 0.1%, or preferably for some applications is equivalent to the provided reference value. For example, a pKa is substantially equal to 1 if it the value of the ratio is within 10%, optionally within 5%, optionally within 1%, or preferably for some applications equal to 1. The term "substantially greater", when used in conjunction with a reference value describing a property or condition, refers to a value that is at least 2%, optionally at least 5%, or optionally at least 10% greater than the provided reference value. The term "substantially less", when used in conjunction with a reference value describing a property or condition, refers to a value that is at least 2%, optionally at least 5%, or optionally at least 10% less than the provided reference value.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

Figure 1B:
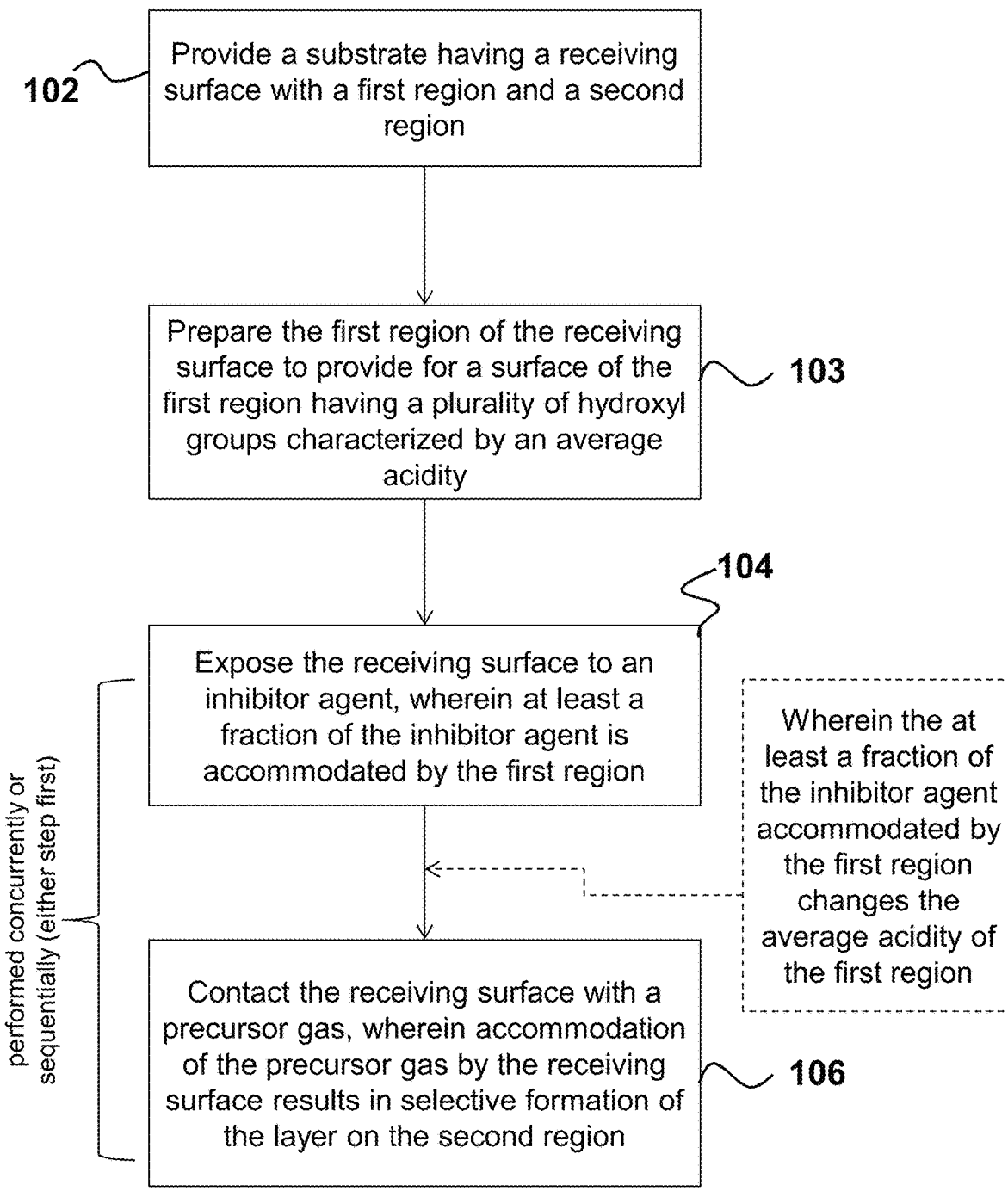

FIG. 1A is a flowchart illustrating one example method 100(1) for selectively forming a layer on a substrate. Dashed lines within FIGS. 1A-1B represent optional steps. In step 102 of method 100, a substrate is provided, which has a receiving surface with a first region and second region. The first region and the second region have different compositions from each other. In some embodiments disclosed herein, the first region includes a metal oxide, a nonmetal oxide, a metal nitride, a nonmetal nitride or a combination of these. The metal and/or nonmetal oxide of the first region may be a native oxide. In some embodiments disclosed herein, the first region is a metal oxide, a nonmetal oxide, a metal nitride, or a nonmetal nitride. In some embodiments disclosed herein, the first region includes a nonmetal carbide (e.g., SiC). In other embodiments disclosed herein, the first region includes a metal or nonmetal oxynitride (i.e., a ternary (or higher order) compound the chemical formula of which includes both O and N). In some embodiments disclosed herein, the first region includes a metal or nonmetal carbide nitride. In some embodiments disclosed herein, the first region includes a metal or nonmetal carbide oxynitride. In some embodiments disclosed herein, the second region includes a metal layer. In some embodiments disclosed herein, the second region is a metal layer. The first region may include a plurality of hydroxyl groups on a portion of or throughout the first region; these surface hydroxyl groups of the first region are characterized by an average acidity. The first region may be continuous or not contiguous not contiguous not contiguous not contiguous. In some embodiments, the second region includes a metal and/or metallic layer. In some embodiments, the second region is a metal and/or metallic layer. For example, the second region includes a metal such as Ti, Fe, Mo, Ru, and any combination of these. For example, the second region includes a nitride material such as vanadium nitride, titanium nitride, silicon nitride, and any combination of these. Relevant metals (e.g., where second region includes metal; e.g., metal oxide; e.g., metal nitride) include transition metals.

In step 104 of method 100, the receiving surface, of the substrate, is exposed to an inhibitor agent, which may be a gas. In step 104, at least a fraction of the inhibitor agent is accommodated by the first region of the receiving surface. In step 104, the inhibitor agent may comprise at least one of a substituted or an unsubstituted amine group, a substituted or an unsubstituted pyridyl group, a carbonyl group, a ketone group, and a diketone group. Example inhibitor agents include, but are not limited to, ammonia, dimethyl amine, methyl amine, trimethylamine, acetylacetone, and pyridine. In an embodiment, the carbonyl group is part of a ketone or a diketone group such that, in an embodiment, the inhibitor agent comprises at least one of a substituted or an unsubstituted amine group, a substituted or an unsubstituted pyridyl group, a ketone group, and a diketone group. In some embodiments, the inhibitor agent is characterized by a pKa greater than or equal to 15. During or subsequent to step 104, accommodation of at least a fraction of the inhibitor agent by at least a portion of the first region changes the average acidity of the first region or the corresponding portion of the first region (e.g., reduces the acidity of the surface hydroxyls at the corresponding portion(s) of the first region).

In step 106 of method 100, the receiving surface, of the substrate, is contacted with a precursor gas. Accommodation of the precursor gas by the receiving surface results in selective formation of a layer on the second region (e.g., a metal). The precursor gas may include a ligand selected from the group consisting of a carbonyl group, an allyl group, and any combination thereof. Example precursor gases include $Mo(CO)_6$, $Fe(CO)_5$, $Ru_3(CO)_{12}$, $Cr(CO)_6$, $W(CO)_6$, $Co_2(CO)_8$, $Re_2(CO)_{10}$, $Rh(\eta_3-C_3H_5)_3$, and any combinations of these (Cp refers to cyclopentadienyl group(s)). Example precursor gases include $Mo(CO)_6$, $Fe(CO)_5$, $Ru_3(CO)_{12}$, $Cr(CO)_6$, $W(CO)_6$, $Co_2(CO)_8$, $Re_2$ $(CO)_{10}$, $Mn_2(CO)_{10}$, $Tc_2(CO)_{10}$, $Fe(CO)_5$, $Ni(CO)_4$, $Rh(\eta_3-C_3H_5)_3$, $Rh(allyl)_3$, $Pt(allyl)_2$, $Pt(allyl)Cp$, $Ir(allyl)_3$, $Pd(allyl)_2$, $Pd(allyl)Cp$, $PtCp(CH_3)_3$, and any combinations of these. Example layers selectively formed on the second region include Fe, Mo, Ru, Ti, Cu, Al, $MoC_xN_y$, and any combination of these. In some embodiments, the second region.

Steps 104 and 106 may be performed sequentially (in either order) or concurrently. Each of steps 104 and 106 may be independently repeated, in any order. Steps 104 and 106, when performed sequentially, in any order, may be performed immediately after the other, with one or more intermediate steps in between, and/or with a finite delay in between. In an example of steps 104 and 106 occurring concurrently, an inhibitor agent may be introduced continuously during simultaneous flow of precursor gas. In an example of steps 104 and 106 occurring both sequentially and concurrently, an inhibitor agent may be introduced initially to be accommodated at the first region followed by introduction of precursor gas while inhibitor agent continues to be introduced as well. In an example of steps 104 and 106 occurring sequentially, for example during ALD, the receiving surface is exposed to an inhibitor agent, the inhibitor agent flow is turned off, and then precursor gas is introduced.

FIG. 1B is a flowchart illustrating one example method 100(11) for selectively forming a layer on a substrate. Method 100(11) comprises step 103. Step 103 comprises preparing the first region of the receiving surface to provide for a surface of the first region having a plurality of hydroxyl groups characterized by an average acidity.

Example 1

We demonstrate the use of a strong Lewis base, such as an amine, such as ammonia, to achieve area-selective chemical vapor deposition of $MoC_xN_y$, Fe, and Ru thin films from the carbonyl precursors $Mo(CO)_6$, $Fe(CO)_5$, and $Ru_3(CO)_{12}$, respectively. Other layers and precursors are also considered. Specifically, $NH_3$ serves as an inhibitor that has a differential effect: film grows readily from metal carbonyls on metal and metal nitride surfaces but no nucleation occurs on the oxides $SiO_2$, $RuO_2$, $TiO_2$, $Al_2O_3$, or MgO for at least 1-2 hours; i.e., the growth selectivity is perfect. In the case of $MoC_xN_y$, $NH_3$ also serves as the source of N in the film and results in a superconductive carbonitride with a room temperature resistivity of 200 µΩ-cm and critical temperature of 4 K. The inhibition mechanism on oxides appears to be related to the oxide surface charge (or, alternatively, the acidity of the OH groups) which is different from oxide to oxide. On oxides with acidic surface hydroxyl groups, including $SiO_2$, $RuO_2$, and $TiO_2$, it is well established that carbonyl precursors easily lose all their carbonyl groups at moderate temperatures. The adsorption of ammonia suppresses this reactivity, most likely by hydrogen bonding to the hydroxyl groups and decreasing the Brønsted acidity of the surface. This decrease in acidity may prevent protonation-induced decarbonylation of metal carbonyl intermediates on the surface. On basic oxide surfaces, ammonia adsorption enhances the 'intrinsic' nucleation barrier such surfaces display toward carbonyl precursors, which may exist when the hydroxyl groups are not acidic enough to protonate the metal centers. Additional factors related to the inhibition include competitive adsorption of precursor and ammonia, and the presence of a distribution of surface reactive sites with different adsorption/desorption energies.

Many nanoscale electronic devices are fabricated using a top-down approach involving blanket film deposition, patterning, and etching steps. However, as feature sizes shrink toward 10 nm, pattern registry becomes very difficult. A bottom-up method to guarantee pattern registry is area selective deposition (ASD), in which a thin film grows selectively (for example, on metallic but not on dielectric surfaces). ASD thus builds upon the previously established pattern on the substrate and obviates the need for additional patterning and etching steps [1]. In chemical vapor deposition (CVD) or atomic layer deposition (ALD) processes, selective growth occurs when film nucleation is inherently difficult on some surfaces (usually, oxides) but not on others [2-4], or when a surface is rendered passive by chemical termination such as by the deposition of a dense self-assembled monolayer [5-10].

In ASD processes, selectivity is lost when nucleation commences on the intended non-growth surface, which often is associated with defects in the surface or in the passivation treatments [2, 4, 11, 12]. One way to achieve a robust ASD process is to ensure that no nucleation occurs on the oxide over the total time needed to deposit the desired film thickness on the metal. In CVD, we have previously demonstrated that this outcome can sometimes be accomplished by continuously injecting a suitable neutral molecular inhibitor along with the precursor. Specifically, we showed that Cu growth from the Cu(hfac)VTMS precursor on oxide surfaces can be inhibited by co-injecting additional VTMS. On both certain metal and certain dielectric surfaces, the effect of added VTMS is to promote the associative desorption of Cu(hfac) intermediates. On certain oxide surfaces the disproportionation of the Cu(hfac) intermediates to Cu metal is slow compared with associative desorption, so that the Cu(hfac) intermediates have time to react with VTMS and desorb; in contrast, on certain metal surfaces, which promote the electron transfer necessary for disproportionation, conversion of the Cu(hfac) intermediates to Cu metal is faster than (and only partially offset by) the associative desorption [13].

Here, we report a different example of the inhibitor approach to ASD, in which we demonstrate that CVD film growth from metal carbonyl precursors can be completely suppressed on oxide surfaces by injecting $NH_3$, a strong Lewis base (e.g., pKa >15), along with the precursor. We show that the presence of $NH_3$ completely eliminates the nucleation of metal on oxide surfaces for at least 1 to 2 hours. At the same time, film nucleation and growth occur readily on metallic seed layers despite the presence of $NH_3$ in the feed gas, i.e., the approach affords perfect selectivity.

We propose that the mechanism by which ammonia promotes ASD is quite different than in the Cu(hfac) (VTMS) system: instead of reacting directly with the precursor, ammonia passivates the surface. On acidic oxides such as $SiO_2$ and $TiO_2$, metal carbonyl precursors may readily nucleate to form metal [14-17]; here, the adsorption of ammonia suppresses this reactivity, most likely by serving as a base that hydrogen bonds to the hydroxyl groups. On basic oxides such as MgO or $Al_2O_3$, ammonia adsorption enhances the 'intrinsic' nucleation barrier these surfaces display toward carbonyl precursors. In the Discussion section, we interpret our results in the context of relevant studies of oxide surfaces from the heterogeneous catalysis literature; our results correlate well with the average surface charge (average acidity) and the presence of a distribution of adsorption sites with different desorption energies.

Experimental Section: Materials and Methods: CVD experiments are performed in a cold wall high vacuum chamber described elsewhere [18, 19]. We explore the behavior of carbonyl precursors of Mo, Fe, and Ru in the presence of $NH_3$. The temperature of the $Mo(CO)_6$ precursor reservoir is controlled in the range 20-40° C. to set the partial pressure; this precursor flows under its own vapor pressure (i.e., with no carrier gas) through the delivery tube, which is heated to 55° C. to avoid condensation of sublimed precursor. The precursor pressure in the chamber is 0.01-0.03 mTorr. The $Fe(CO)_5$ precursor is cooled to 0° C. in an ice bath and the precursor pressure is controlled by a needle valve to establish a partial pressure in the chamber of 0.01 mTorr. The $Ru_3(CO)_{12}$ precursor is heated in the reservoir to 85 C and is delivered to the chamber by means of 50 sccm of Ar as a carrier gas. Research grade ammonia (99.9992%) is delivered through a separate gas line, regulated by a mass flow controller to establish a partial pressure of 1-20 mTorr in the chamber. All the gas delivery lines are pointed towards the substrate; hence the local fluxes are higher than those suggested by the isotropic background pressure.

The substrate is heated radiatively to a temperature of 130-225° C., as measured by a K-type thermocouple attached to the sample holder. The following substrates are used with no pre-treatment following their preparation in other facilities on our campus: 300 nm thermal $SiO_2$ (microelectronic grade)/Si; 10 nm e-beam $Ru/SiO_2$/Si; 50 nm CVD MgO/Si [20]; 8 nm ALD $Al_2O_3$ (doped with some $TiO_2$)/Si (precursors are trimethylaluminum and tetrakis(dimethylamido)titanium and water); 20 nm e-beam deposited Ti/Si which is then oxidized under ozone in air for 1 hour; and 60 nm of e-beam Ti/Si which is stored under Ar to minimize oxide formation. XPS confirms the presence of $RuO_2$ on the surface of the air-exposed Ru film. In some experiments, a 1-2 nm seed layer of VN is grown in-situ on thermal $SiO_2$ by CVD from tetrakis(dimethylamido)vanadium and ammonia.

Film thickness and microstructure are determined from cross-sectional and top-view SEM images. Compositional depth profiles are obtained by AES with sputtering. The onset of nucleation and the growth are monitored by real-time spectroscopic ellipsometry (SE); for each substrate-film combination, we report change in the angle delta at a single energy, 2.65 eV, which provides the greatest sensitivity to the onset of nucleation, as discussed previously [13]. Ex-situ AFM (2×2 µm scan area), XRR, RBS, TOF-SIMS, and high resolution XPS are used to detect the formation of nuclei on the non-growth surfaces.

Figure 2:
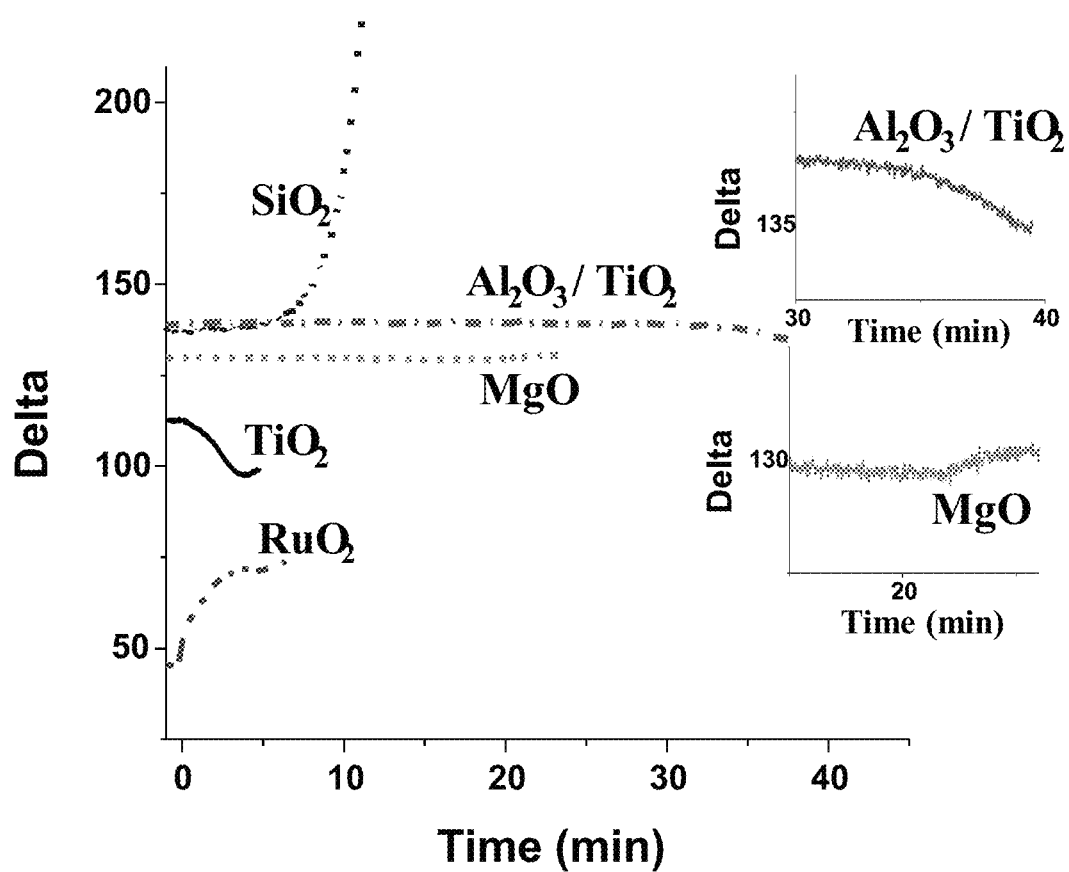
FIG. 2. In-situ ellipsometry parameter delta, at a photon energy of 2.65 eV, vs. time for MoC$_x$ film growth using the Mo(CO)$_6$ precursor at a pressure of 0.01 mTorr at 200° C. on the acidic oxides SiO$_2$, TiO$_2$, RuO$_2$, and on the basic oxides Al$_2$O$_3$ ("Al$_2$O$_3$/TiO$_2$" refers to Al$_2$O$_3$ doped with TiO$_2$) and MgO. Nucleation occurs after a short time on the acidic oxides, but has a long nucleation delay on the basic oxides. Inset: On the basic oxides, the lack of nucleation (i.e., the inherent selectivity) fails at longer times due to the onset of 'stray' nucleation. On certain basic oxides, 'stray' nucleation eventually occurs at longer times.

Results And Discussion: Control studies of deposition from $Mo(CO)_6$ on metal oxide surfaces. We initially investigated the chemical vapor deposition of molybdenum-containing films from the carbonyl precursor $Mo(CO)_6$ on different oxide substrates in the absence of any co-reactant [21, 22]. The onset temperature for $Mo(CO)_6$ thermolysis is 150° C. For growth at 200° C. using 0.010 mTorr of precursor, there is a relatively short nucleation delay of 5 min on $SiO_2$, after which growth reaches a steady-state rate of roughly 8 nm/min (FIG. 2). Growth at 200° C. affords a molybdenum carbide film with 15 at. % oxygen contamination. When a film is grown under identical conditions and capped in-situ with $HfB_2$ (which protects against post-growth oxidation in air), the oxygen content is only slightly less, 13 at. %, which indicates that the oxygen contamination in the film originates mostly from carbonyl decomposition and not from post-growth air exposure, in agreement with previous studies [21, 23, 24]. The film surface is rough, which is indicative of sparse nucleation [25, 26].

Under the same experimental conditions, no change in the ellipsometry signal occurs, i.e., no nucleation takes place, on MgO or $Al_2O_3$ substrates for growth times of 22 and 35 min, respectively, after which a small deviation indicates the onset of nucleation (FIG. 2). The surface roughness of the $Al_2O_3$ substrate after 20 min of attempted growth is identical to that of the bare substrate. High-resolution XPS and RBS measurements do not detect Mo on the MgO and $Al_2O_3$ substrates after 20 min of attempted growth.

In contrast to the $SiO_2$ results, there is no nucleation delay on $RuO_2$ or $TiO_2$ surfaces; a 70 nm thick film grows within 9 minutes, with a growth rate of 8 nm/min. Thus, $MoC_x$ growth occurs promptly on $RuO_2$ and $TiO_2$, and after a short delay on $SiO_2$, but there is a significant nucleation delay (barrier) on $Al_2O_3$ and MgO, which is the basis for intrinsic selectivity.

Inhibition of nucleation and growth from $Mo(CO)_6$ on oxide surfaces by ammonia. The nucleation rate on $SiO_2$ and $TiO_2$ substrates at 200° C. is reduced essentially to zero when ammonia is co-flowed with the $Mo(CO)_6$ precursor. For example, at 0.01 mTorr of precursor and 1.8 mTorr of ammonia on $SiO_2$ at 200° C., no nucleation is detected even after 120 min, as compared with deposition of nearly 200 nm in the absence of ammonia after 30 min (FIG. 3, panels a and b). Atomic force microscopy (AFM) images of samples exposed to $Mo(CO)_6$ and ammonia for 30, 60, and 120 min are identical to bare $SiO_2$ substrate (FIG. 3, panel c).

When the ammonia co-flow experiment is repeated at a higher precursor pressure, 0.025 mTorr, while keeping the ammonia pressure at 1.8 mTorr, some nucleation can be detected after 15 min. But nucleation at the higher precursor pressure can be inhibited simply by increasing the pressure of ammonia: in a third experiment at a precursor pressure of 0.025 mTorr and an ammonia pressure of 3.7 mTorr, no nucleation occurs after 60 min. AFM scans of the surface treated under these conditions show no nuclei, and XPS detects no molybdenum.

Similar results are seen on $TiO_2$ at 200° C.: in contrast to the rapid nucleation and growth that take place on $TiO_2$ from 0.020 mTorr of $Mo(CO)_6$ in the absence of ammonia, there is no nucleation when 3.5 mTorr of ammonia is co-flowed with the precursor, even after 30 min.

On $RuO_2$, the effect of ammonia is not quite as complete: after a $RuO_2$ surface is exposed at 200° C. to 0.025 mTorr precursor and 3.7 mTorr ammonia for 30 min, AFM detects a very small number of nuclei: ~10 nuclei/$\mu m^2$. A higher ammonia pressure may decrease the nucleation density even further.

Figure 4:
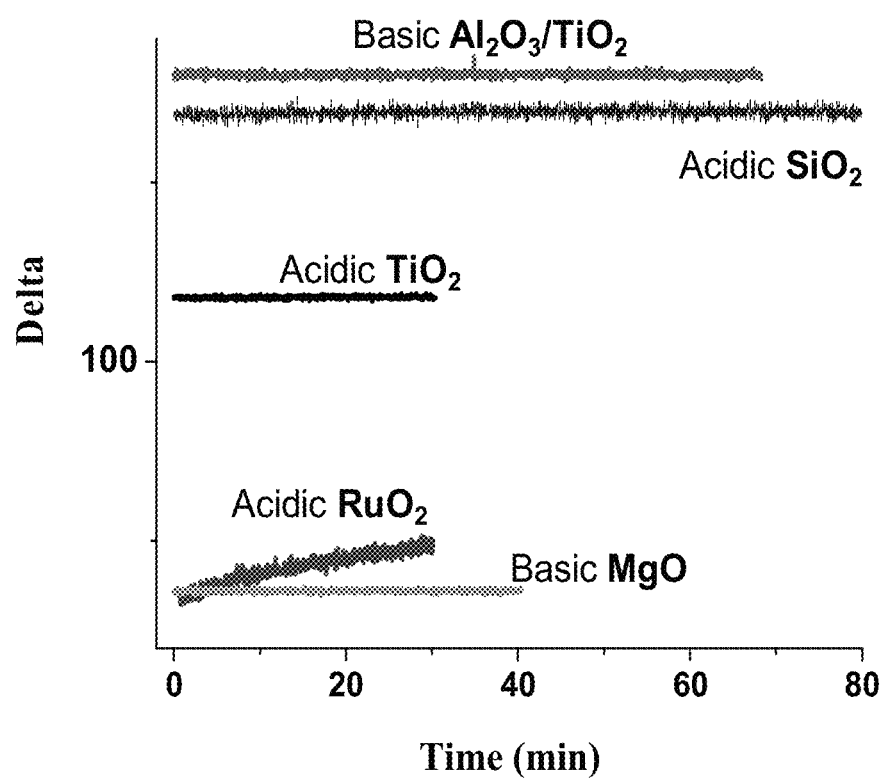
FIG. 4. In-situ ellipsometry parameter delta, at a photon energy of 2.65 eV, vs. time using 0.025 mTorr Mo(CO)$_6$ precursor and a co-flow of 3.7 mTorr of ammonia. No nucleation occurred on either the acidic and basic oxides, except on RuO$_2$, which had a ~10 nuclei/µm$^2$; we attribute the latter to nucleation on 'dust' rather than to a fundamental process.

Additionally, we investigated the effect of ammonia on MgO and $Al_2O_3$, two surfaces for which there is a significant nucleation delay (intrinsic selectivity) when exposed to $Mo(CO)_6$ at 200° C., even in the absence of ammonia. On these two surfaces, co-flow of ammonia significantly extended the nucleation delay: even after 40 and 65 min of exposure, respectively, XRR data indicate no change from the bare substrates (FIG. 4), and ellipsometry and AFM show the absence of any nuclei.

RBS studies of the $SiO_2$, $TiO_2$, MgO, and $Al_2O_3$ surfaces exposed to $Mo(CO)_6$ in the presence of ammonia under the conditions specified above confirm the absence of detectable amounts of molybdenum.

Nucleation and growth from $Mo(CO)_6$ on metal and metal nitride surfaces in the presence of ammonia. In contrast to the above results (and highly significant in the context of surface-selective deposition), we find that ammonia does not inhibit nucleation and growth from $Mo(CO)_6$ on clean metal and metal nitride surfaces (i.e., no native oxide). Two surfaces were investigated: an in-situ grown vanadium nitride and an e-beam deposited titanium film protected from atmospheric oxidation during transfer to the CVD chamber. Using $Mo(CO)_6$ and ammonia pressures of 0.025 and 3.7 mTorr, respectively, no nucleation delay is observed on these surfaces at 200° C. by in-situ ellipsometry; 19 nm of film is deposited during a 20 min growth time. AES depth profiles show that the films contain 20 at. % nitrogen and 21 at. % carbon; the oxygen content is 3-4 at. % after air exposure. Thus, the film composition is best described as $MoC_{0.36}N_{0.35}$. The significant nitrogen content is consistent with the known ability of vanadium nitride, molybdenum carbide, and molybdenum nitride surfaces to catalyze ammonia decomposition at this deposition temperature [27-29]. The $MoC_{0.36}N_{0.35}$ samples in this study are metallic and have room temperature resistivities of 200-300 μΩ-cm.

Figure 5A:
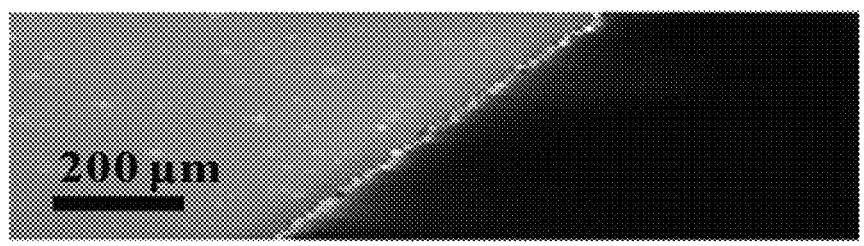
FIGS. 5A-5C.
Figure 5B:
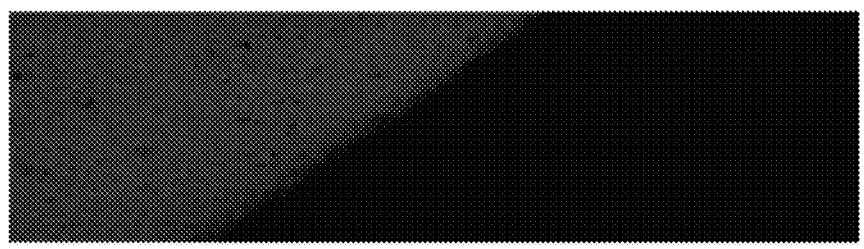
Figure 5C:
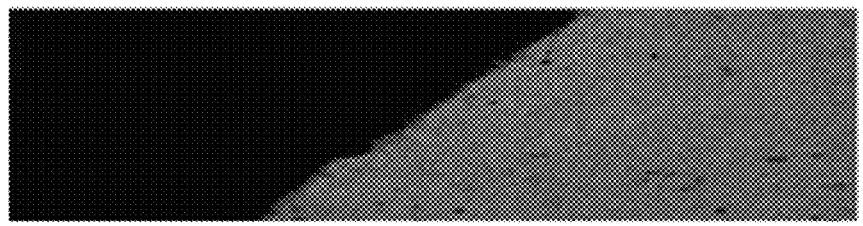
Figure 6A:
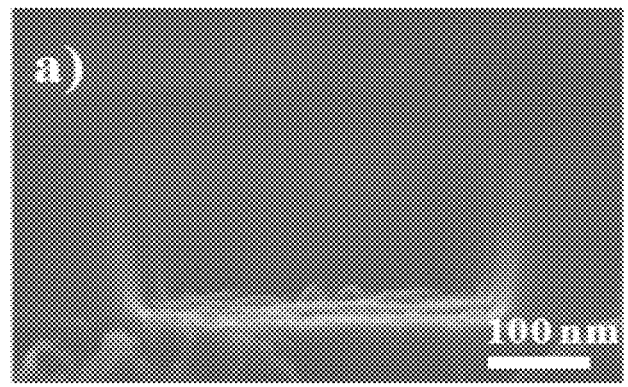
FIGS. 6A-6C. SEM cross sectional images (FIGS. 6A, 6B and 6C) of vias which include SiO$_2$ sidewalls and a Nb base (e.g., 60 nm wide base)
Figure 6B:
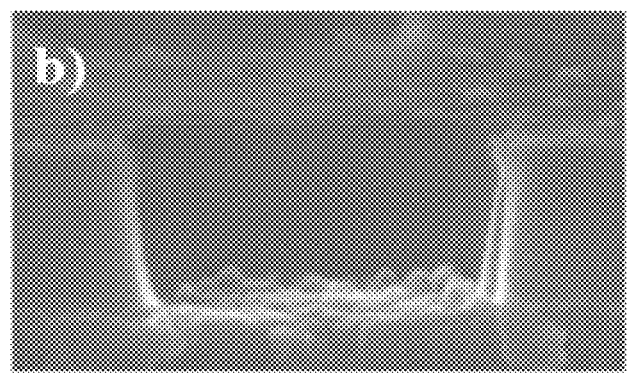

Area-selective growth on patterned substrates and bottom-up filling, On a patterned substrate of $Ti/SiO_2$, growth from 0.025 mTorr $Mo(CO)_6$ and 3.7 mTorr ammonia at 200° C. affords film only on the metallic areas of the pattern, with no deposition on oxide as evidenced by Auger elemental mapping (FIG. 5). This perfectly selective growth process can also be used to effect the bottom-up filling of trenches and vias. Using the same growth conditions as above on a pattern of vias each consisting of $SiO_2$ sidewalls and a Nb film on the via bottom, growth occurs only at the base of the via with no nucleation on the sidewalls or top surface (FIG. 6).

Inhibition of nucleation and growth from $Mo(CO)_6$ on native oxide surfaces by ammonia. When silicon nitride is exposed to air, a silicon-rich and nitrogen-depleted native oxide forms, terminated by Si—OH sites, similar to those present on $SiO_2$ surfaces [30]. Consistent with this finding, Si, SiN, Ti, and TiN substrates covered with their native oxides respond to ammonia as other oxide surfaces do: thus, 3.7 mTorr ammonia completely inhibits nucleation from 0.025 mTorr of $Mo(CO)_6$ at 200° C. This result raises the possibility that selective inhibition of growth from a carbonyl precursor on Si, SiN, Ti, TiN, and other non-oxide substrates can be achieved by first forming a coat (layer) of native oxide. After selective deposition on other surfaces in the presence of ammonia, the native oxide can be etched off or chemically reduced to return the surface to its original state.

Process window and reversibility of inhibition on oxide surfaces by ammonia. We find that the temperature window for inhibition of CVD from $Mo(CO)_6$ on thermal $SiO_2$ is approximately 150-210° C., for ammonia pressures within the mTorr range. At 150° C. and 0.02 mTorr $Mo(CO)_6$ pressure, a relatively small ammonia pressure of 1.5 mTorr is enough to inhibit growth on $SiO_2$ altogether. In contrast, at substrate temperatures higher than 210° C., ammonia no longer is able to prevent inhibition on $SiO_2$ indefinitely: for example, at 225° C. using 0.02 mTorr precursor and a higher ammonia pressure of 9 mTorr, nucleation occurs after a 13 min delay.

Interestingly, when the ammonia flow to the growth chamber is stopped during a CVD experiment, nucleation occurs within a few seconds on $SiO_2$ and other acidic oxide substrates as judged by in-situ ellipsometry. This result suggests that ammonia inhibition is a reversible process, most likely involving reversible adsorption on the oxide surface. The mean residence time of ammonia on $SiO_2$, as estimated from the desorption energy of 0.43 eV, is $\sim 1.3 \times 10^{-8}$ sec at 150° C.; thus, the finding that the surface instantly becomes active for nucleation upon interruption of the ammonia co-flow is consistent with the known ammonia desorption energy. (Note that ammonia will persist in the chamber after the flow is shut off due to slower desorption from the room-temperature chamber walls; however, the partial pressure due to the wall residence effect is very small.)

Extension to other inhibitors: Amines other than ammonia can adsorb on oxide surfaces; among these is pyridine [31-33]. We performed selected experiments using 0.025 mTorr of $Mo(CO)_6$ and 3.7 mTorr of pyridine on $SiO_2$ at 200° C. to determine whether this amine can also serve as a growth inhibitor. In a 40 min experiment, the real-time ellipsometry signal changed only very slightly; AFM scans indicated the presence of just a few nuclei spaced by ~1 μm. The experiment was then repeated, but after 30 min the pyridine flow was cut off and the precursor flow continued for another 20 min. Nucleation and growth was very slow after discontinuation of the pyridine flow: the ellipsometry signal changed very little with time. The persistence of inhibition seen with pyridine is in sharp contrast with the results of the similar experiment using $NH_3$ described above, in which nucleation occurred promptly after the inhibitor flow was stopped.

When growth is carried out using $Mo(CO)_6$ and pyridine on a seed layer of vanadium nitride, the growth rate is much lower than when using ammonia, i.e., pyridine also tends to inhibit film growth on this metallic substrate.

Figure 7A:
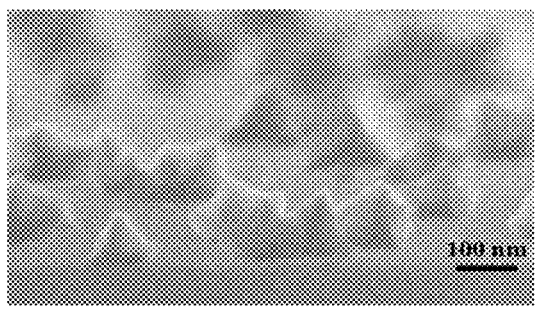
FIGS. 7A-7C.

Selective growth of Fe from $Fe(CO)_5$ and of Ru from $Ru_3(CO)_{12}$ in the presence of ammonia. The ability of ammonia to inhibit nucleation and growth on metal oxide surfaces extends to other metal carbonyl precursors. On thermal $SiO_2$, 0.01 mTorr of $Fe(CO)_5$ alone affords a high coverage of islands >100 nm tall after 9 min at 130-150° C. (FIG. 7, panel a); under the same conditions except with a co-flow of 10-18 mTorr of ammonia, AFM indicates that no nucleation occurs at all at 130° C., and only 0.25 nuclei/$\mu m^2$ are present at 150° C. (FIG. 7, panels b and c). High resolution XPS detects no iron on the substrate. The inhibition is still effective after a growth time of 20 min.

On MgO substrates, growth from 0.01 mTorr $Fe(CO)_5$ in the absence of ammonia is characterized by a long nucleation delay, over 40 min at 150° C., as evidenced by in-situ ellipsometry and ex-situ high resolution XPS. The longer nucleation delay on MgO vs. $SiO_2$ in the absence of ammonia is consistent with the results reported above for $Mo(CO)_6$.

In contrast, Fe deposits rapidly from $Fe(CO)_5$ on metal and metal nitride surfaces, even in the presence of ammonia. For example, a 50 nm thick Fe film grows in 20 minutes on a VN seed layer or on a Ti substrate at 130° C. using 0.01 and 10 mTorr of precursor and ammonia, respectively. An Auger depth profile indicates incorporation of 3 at. % nitrogen in the Fe film, along with 2 at. % carbon and 1 at. % oxygen. On a patterned substrate of $Ti/SiO_2$, growth occurs only on Ti with no Fe detected on $SiO_2$ by AES.

Ru CVD from $Ru_3(CO)_{12}$ behaves in the same manner as for $Fe(CO)_5$. At 150° C. in the absence of ammonia, nucleation and growth occurs readily on $SiO_2$ (FIG. 8, panel a). A co-flow of 10 mTorr ammonia completely shuts down nucleation (FIG. 8, panel b), whereas Ru nucleation and growth in the presence of ammonia occurs easily on Ti and VN.

Finally, selected samples were analyzed by TOF-SIMS to determine how much Mo, Fe, or Ru metal (if any) had been deposited on acidic oxide substrates in the presence of ammonia, and on basic oxides in the absence of ammonia. The metal/substrate count ratios in all cases were less than 0.001, confirming the highly effective inhibition process investigated here (details in the Supplementary Information).

Reactivity of metal carbonyls on oxide surfaces: We have shown that, at relatively low temperatures in the absence of ammonia, CVD from metal carbonyls shows little or no nucleation delay on some oxides (such as $SiO_2$, $TiO_2$, and $RuO_2$) but long nucleation delays on other oxides (such as MgO and $Al_2O_3$). Our findings are consistent with studies of the formation of metal nanoparticle catalysts on oxide supports from metal carbonyl precursors at similar temperatures [15, 34, 35]. For example, molybdenum and its compounds constitute a well-known group of heterogeneous catalysts for the dehydrogenation and metathesis of alkenes; the chemistry and kinetics of catalyst formation have been studied extensively [34, 36-38]. The reaction to form molybdenum nanoparticles occurs readily on $SiO_2$ but not on $Al_2O_3$; the difference has been attributed to differences in the reaction pathway on oxides with acidic vs. basic hydroxyl groups [14, 15].

Oxide surfaces, unless vacuum annealed at high temperature, are always hydroxylated because the —OH termination lowers the surface energy. The character of the —OH group can, however, be either acidic or basic; a hydroxyl group becomes more acidic with an increase in the covalency (especially the pi bonding) of the bulk metal-oxygen bond [39] or with an increase in the charge/radius ratio of the cation (Si, Ti, Al, Mg, etc.) to which the hydroxyl group is bound [40]. The average acidity can be characterized by the isoelectric point (IEP), which is the pH value of an aqueous solution needed to establish zero net charge on the oxide surface. Acidic hydroxyl groups have a negative surface charge in liquid water at neutral pH, so that the pH has to be lowered to obtain a neutral surface charge, and conversely for basic hydroxyls [39, 41, 42]. The oxides $SiO_2$, $RuO_2$, and $TiO_2$ have acidic hydroxyl groups with IEPs of 2.2, 4.2, and 4-6, respectively; MgO and $Al_2O_3$ have basic hydroxyl groups with IEPs of 12 and 8-9, respectively [43]. IEP values decrease slightly with increasing temperature, but in general higher temperatures will not convert basic hydroxyl groups to acidic ones [44]. Interestingly, some mixed oxides have hydroxyl groups that are more acidic than those in either of the binary constituents [45-47]: for example, alumina supported on silica is more acidic than either silica or alumina alone [48].

We find that the reaction of $Mo(CO)_6$ on acidic oxide surfaces in the absence of ammonia leads to rapid nucleation and growth of $MoO_xC_y$ films. Consistent with this finding, $Mo(CO)_6$ dissociatively adsorbs on the (100) face of hydroxylated $TiO_2$ above −50° C. and no stable sub-carbonyls are detected [17]. Instead, exposure of the $TiO_2$ surface at 130° C. to $Mo(CO)_6$ results in the formation of small Mo particles and graphitic C on the surface [17]. On basic surfaces, however, TPD experiments suggest that stable sub-carbonyls are formed which do not further react at low temperatures [49]. For example, on $Al_2O_3$, $Mo(CO)_6$ reacts to form film only above 400° C. TPD experiments show that, on this surface, $Mo(CO)_6$ loses CO in two steps, each step involving desorption of three CO molecules per precursor molecule; this result suggests the formation of stable adsorbed $Mo(CO)_3$ species after the first step, and removal of remaining three CO groups in the second step only at 400° C., a higher temperature than the present experiments [14].

On acidic oxides such as $SiO_2$, $Ru_3(CO)_{12}$ reacts with surface OH groups to form the grafted cluster $HRu_3(CO)_{10}$ (OSi≡), which decarbonylates completely upon being heated to 200° C. [16, 50]. On strongly basic oxides such as MgO, $Ru_3(CO)_{12}$ reacts with OH groups to form the stable anionic carbonylruthenate species $[HRu_3(CO)_{11}]^-$, which decarbonylates completely only at temperatures above 350° C. [51].

On the mildly basic oxide $La_2O_3$, adsorption of $Ru_3(CO)_{12}$ generates mononuclear (dicarbonyl)ruthenium species, which decarbonylate only above 250° C. [52]. Similar results are reported for $Fe(CO)_5$, which generates the thermally robust anionic cluster $[HFe_3(CO)_{11}]^-$ on basic oxides [53, 54].

According to the heterogeneous catalysis literature, the reaction pathway of metal-carbonyl precursors such as $Cr(CO)_6$, $W(CO)_6$, $Co_2(CO)_8$, and $Re_2(CO)_{10}$ depends strongly on the degree of hydroxylation of the oxide surface and on the acid-base character of the oxide [34]. The temperature at which these precursors completely decarbonylate is lower on acidic oxides than on basic oxides.

The short nucleation delays for growth from metal carbonyl precursors seen on acidic oxides such as $SiO_2$, $RuO_2$, and $TiO_2$, vs. the long nucleation delays seen on basic oxides such as MgO, must relate either to the Brønsted acidity of the surface OH groups, or the Lewis basicity of deprotonated surface hydroxyl groups. We discuss this issue below.

Selectivity by nucleation inhibition: As shown in the Results section, ammonia co-flow inhibits nucleation and growth of films from metal carbonyls on acidic oxides. To understand this effect, we need to understand how ammonia, a strong Lewis base, interacts with oxide surfaces. Such interactions have been probed by adsorbing ammonia and then probing the adsorbed states by FTIR [31, 39, 55, 56], microcalorimetry [48, 57, 58], and thermally programmed desorption [48, 56] experiments. Generally, the binding energy between the OH groups on oxide substrate and ammonia (and other bases) depends on several factors, including the acid/base strengths of the surface and the adsorbate [31, 39, 59, 60]. In addition, basic molecules such as ammonia and organic amines poison the catalytic activity of acidic oxides [61-63].

The adsorption energy of ammonia on hydroxylated $SiO_2$ is ~0.43 eV [64]. In the present experiments, this value is too small to lead to a large steady state ammonia coverage; for example, at 200° C. and a pressure of 3.7 mTorr of ammonia, first order Langmuirian behavior would afford negligible surface coverage. However, the number of reactive sites may be only a small fraction of the total number of surface sites. In a study of Ru growth from $Ru_3(CO)_{12}$ on $SiO_2$, [65] the nucleation density (~$10^{11}$ sites/$cm^2$) was three orders of magnitude smaller than the hydroxyl density (~$10^{14}$ sites/$cm^2$) and the temperature dependence of the nucleation density followed the same temperature dependence as the density of isolated OH groups.

It is well appreciated that the adsorption energies of many molecules on hydroxylated $SiO_2$ are coverage-dependent [57]. For this reason, the differential heat of ammonia adsorption, i.e., the slope of integral heat evolved during adsorption versus the adsorbed quantity, is a better measure of the energy of interaction of the adsorbate with the individual surface sites [57]. On hydroxylated $SiO_2$ at near-zero coverage, the differential heat of ammonia adsorption is 0.8-0.9 eV. This value decreases with increasing ammonia coverage, indicating the presence of a heterogeneous distribution of surface sites, or lateral interactions between adsorbed species, or induced heterogeneity [67].

In our CVD experiments, we find that at 150° C. an ammonia pressure of only 1.5 mTorr is sufficient to inhibit nucleation from $Mo(CO)_6$ precursor. This finding is consistent with the ammonia adsorption data above if the precursor can react at the surface sites with the highest adsorption energies.

At a higher growth temperature such as 225° C., an ammonia pressure of 9 mTorr should be high enough to block reactive sites, if the mechanism were inhibition of nucleation by ammonia bonding to surface OH groups. That nucleation happens under these conditions suggests that other reaction pathways exist, or that there is a large temperature induced increase in the number of the most reactive (i.e., isolated) OH groups.

The rapid onset of nucleation and growth when ammonia flow is stopped is consistent with the hypothesis that the mechanism of growth inhibition involves hydrogen bonding of ammonia to surface hydroxyl groups [68, 69]. The temporary (dynamic) nature of the passivation of the surface should not pose an issue for CVD processes because a continuous co-flow of the inhibitor is easy to implement. Furthermore, continuous co-flow affords control over the surface reactivity for long times, as required for growth of thicker films on metal areas of the substrate.

The ability of pyridine to inhibit growth even after its co-flow is stopped suggests a process option: area-selective growth might be obtained by treating the substrate with an initial dose of pyridine (or other inhibitor agent that may bind strongly to acidic oxide surfaces), rather than adding the inhibitor continuously. This approach has three potential advantages: first, it might be applicable to ALD; second, the absence of the inhibitor during CVD might afford higher deposition rates on intended growth surfaces; third, it avoids the possibility that atoms from the inhibitor might become incorporated into the growing films. If one initial dose is not sufficient to prevent growth indefinitely, then periodic dosing could be used.

Mechanism of ammonia inhibition of CVD growth from metal carbonyls. One way in which added ammonia could prevent nucleation of metal from metal carbonyls is simply by blocking the most reactive surface adsorption sites. Specifically, if the most acidic hydroxyl groups are the points of reaction of the metal carbonyl, then these sites may simply be deactivated by hydrogen bonding with ammonia.

A second and possibly synergistic mechanistic explanation of the effect of ammonia is that it creates conditions that disfavor the complete decarbonylation of metal carbonyl intermediates, thus preventing them from converting to metal nuclei. The results above clearly show that decarbonylation of metal carbonyl precursors under CVD conditions is facile on acidic oxides, whereas stable carbonyl intermediates that are reluctant to further decarbonylate are formed on basic oxide surfaces. Specifically, on basic oxide surfaces, surface-bound metal carbonyl species such as $Mo(CO)_3$ and $[HRu_3(CO)_{11}]^-$ are formed; these species are electron rich (either owing to the high d-orbital energies of early transition metals or the shielding effects of a negative charge) and accordingly are characterized by strong metal-carbonyl pi backbonding. This backbonding becomes stronger as more carbonyl groups are lost. There is thus a large barrier for complete decarbonylation, and metal nuclei are difficult to generate.

One way to explain the very different behavior seen on acidic oxide surfaces is that any electron rich species that are formed on such surfaces become protonated by reaction with hydroxyl groups. As a result, the metal increases in oxidation state and becomes less electron rich; the backbonding is significantly decreased and loss of carbonyl groups is facilitated. The effect of ammonia, in this view, is to reduce the acidity of acidic oxide surfaces by hydrogen bonding to the surface hydroxyl groups, and prevent protonation of the metal carbonyl intermediates.

The effect of ammonia may therefore be twofold: site blocking and decreasing the acidity of the oxide surface. The first of these effects disfavors adsorption of the metal carbonyl precursor in the first place, and the second prevents the total decarbonylation of surface carbonyl intermediates if they are formed. Both effects involve the interaction of ammonia with reactive (i.e., acidic) surface hydroxyl groups; the net outcome of adding ammonia is inhibition of nucleation and growth of metal from metal carbonyl precursors on acidic oxide surfaces.

It may be possible to distinguish these two mechanisms. If the mechanism involves site blocking, then ammonia should inhibit growth from many classes of precursors besides metal carbonyls. If the mechanism involves decreasing the acidity of the surface and preventing protonation of reactive intermediates, however, then ammonia should exert its largest effect on precursors in which protonation aids in conversion to nuclei. Metal complexes with strongly pi accepting ligands (such as CO), and possibly metal complexes with anionic ligands (which could be protonated), would be inhibited by added ammonia, but other kinds of precursors may nucleate and grow equally well on acidic oxide surfaces whether ammonia is present or not.

Another distinction between the two mechanisms is that site blocking should prevent precursor from adsorbing to the surface, whereas the suppression of protonation would permit some (i.e., submonolayer) precursor adsorption. Our SIMS studies show that the metal coverages in the presence of ammonia in all cases are less than 0.001, which is certainly consistent with site blocking as the main inhibition mechanism. But it may also be consistent with the protonation suppression mechanism, if adsorption of precursor occurs at a small subset (i.e., the most reactive) surface sites.

Finally, a related issue is why growth occurs on metallic surfaces, despite the absence of acidic protons. One possibility is that low energy empty states in the band structure could oxidize the electron-rich metal carbonyl species, thereby promoting loss of CO. It has been suggested previously that dissociation of carbonyl groups from adsorbed metal carbonyl species could be enhanced by charge transfer: thermally activated decomposition of metal carbonyls happens on Ni(100), but little dissociation has been observed on Si and Ag(110) surfaces [70]. An alternative possibility is that, on surfaces that bind CO groups well [71], migration of CO ligands to the metallic surface could destabilize otherwise stable metal carbonyl species, thus initiating nucleation events.

Conclusions: Area selective CVD from metal-carbonyl precursors is reported. The CVD from metal-carbonyl precursors on oxide substrates can be inhibited by the addition of ammonia (and similar but more long lasting effects are seen for pyridine). We can achieve perfectly selective growth from metal carbonyl precursors: no growth occurs at all on $SiO_2$, $TiO_2$, $Al_2O_3$, and MgO, whereas under the same conditions growth occurs readily on metallic substrates such as VN and Ti. The effect of ammonia inhibition is most pronounced on oxides with acidic hydroxyl groups, for which nucleation and growth is fast in the absence of ammonia at temperatures above 130° C. Most likely, co-flow of ammonia deactivates the acidic hydroxyl groups by hydrogen bonding to them; we propose that this interaction suppresses protonation of metal subcarbonyl intermediates, a process that leads to decarbonylation and formation of film nuclei. By converting acidic oxide surface to basic surfaces, these sub-carbonyls are stabilized and reaction is suppressed. The use of ammonia also extends the intrinsic selectivity of basic oxide surfaces to all attempted growth times investigated. This selective method also affords a means to fill deep structures, such as trenches and vias, bottom-up if a metal nucleation layer exists at the trench bottom but not on the sidewalls.

Table 1: TOF-SIMS metal/host count ratios for different film and substrate combinations. In TOF-SIMS, the metal/substrate (raw) count ratios on acidic oxide substrates in the presence of ammonia, and on basic oxides in the absence of ammonia. The metal/substrate count ratios in all cases are less than 0.001, confirming the highly effective inhibition process investigated here. Matrix sensitivities of different materials are not considered here.

TABLE 1

| Film/substrate | Metal/host count ratio |
|---|---|
| $MoC_x$/MgO | 0.00001 |
| $MoC_x$/$Al_2O_3$ | 0.001 |
| $MoC_xN_y$/$SiO_2$ | 0.0008 |
| Fe/MgO | 0.0004 |
| Fe/$SiO_2$ | 0.001 |
| Ru/$SiO_2$ | 0.0002 |

Example 2

We demonstrate area-selective chemical vapor deposition of $MoC_xN_y$, Fe, and Ru thin films using the carbonyl precursors $Mo(CO)_6$, $Fe(CO)_5$, and $Ru_3(CO)_{12}$, respectively. We add $NH_3$ as an inhibitor that has a differential effect: film grows readily on metal surfaces but no nucleation occurs on the oxides $SiO_2$, $RuO_2$, $TiO_2$, $Al_2O_3$, or MgO for at least 1-2 hours, i.e., the growth selectivity is perfect. In the case of $MoC_xN_y$, $NH_3$ also serves as the source of N in the film and results in a conductive carbonitride with a room temperature resistivity of 200 $\mu\Omega$-cm. On oxides with acidic surface hydroxyl groups, including $SiO_2$, $RuO_2$, and $TiO_2$, OH groups react readily with carbonyl precursors; here, the adsorption of ammonia suppresses this reactivity, most likely by serving as a base that deprotonates the hydroxyl groups. On oxides with basic hydroxyl groups, ammonia adsorption enhances the 'intrinsic' nucleation barrier they display toward carbonyl precursors.

Experimental Section: Materials and Methods: CVD experiments are performed in a cold wall high vacuum chamber described elsewhere [11,12]. The temperature of the $Mo(CO)_6$ precursor reservoir is controlled in the range 20-40° C. to set the partial pressure; this precursor flows under its own pressure (i.e., with no carrier gas) through the delivery tube. No flow regulation device is used except for the finite conductance of the delivery line, which is heated to 55° C. to avoid condensation of sublimed precursor. The precursor pressure in the chamber is 0.01-0.03 mTorr. The $Fe(CO)_5$ precursor is cooled to 0° C. in an ice bath and the precursor pressure is controlled by a needle valve to establish a partial pressure in the chamber of 0.01 mTorr. The $Ru_3(CO)_{12}$ precursor is heated in the reservoir to 85° C. and is carried to the chamber by means of 50 sccm of Ar as a carrier gas. Electronic grade ammonia (99.999%) is delivered through a separate gas line, regulated by a mass flow controller, to establish a partial pressure of 1-20 mTorr in the chamber. All the gas delivery lines are pointed towards the substrate; hence the local fluxes are higher than indicated by the isotropic background pressure. The substrate is heated radiatively to a temperature of 130-225° C., as measured by a K-type thermocouple attached to the sample holder. The following substrates are used with no pre-treatment following their preparation in other facilities on our campus: 300 nm thermal $SiO_2$/Si; 10 nm e-beam Ru/$SiO_2$/Si; 50 nm CVD MgO/Si; 8 nm ALD $Al_2O_3$ (unintentionally doped with some $TiO_2$)/Si; 20 nm e-beam deposited Ti/Si which is then oxidized under ozone in air for 1 hour; and 60 nm of e-beam Ti/Si which is stored under Ar to minimize oxide formation. XPS confirms the presence of $RuO_2$ on the surface of the air-exposed Ru film. In some experiments, a 2 nm seed layer of VN is grown in-situ on thermal $SiO_2$ by CVD using tetrakis(dimethylamido)vanadium and ammonia.

Film thickness and microstructure are determined from cross-sectional and top-view SEM images. Compositional depth profiles are obtained by AES with sputtering. The onset of nucleation and the growth are monitored by real-time spectroscopic ellipsometry (SE); for each substrate-film combination, we report change in the angle delta at a single energy, 2.65 eV, which provides the greatest sensitivity to the onset of nucleation, as discussed previously [10]. Ex-situ AFM (2×2 µm scan area), XRR, RBS, and high resolution XPS are used to detect the formation of nuclei on the non-growth surfaces.

Results and Discussion: Control studies of deposition from $Mo(CO)_6$ on metal oxide surfaces: We initially investigated the chemical vapor deposition of molybdenum-containing films from the carbonyl precursor $Mo(CO)_6$ on different oxide substrates in the absence of any co-reactant. The onset temperature for $Mo(CO)_6$ thermolysis is 150° C. For growth at 200° C. using 0.010 mTorr of precursor, there is a relatively short nucleation delay of 5 min on $SiO_2$, after which growth reaches a steady-state rate of roughly 8 nm/min (FIG. 2). Growth at 200° C. affords a molybdenum carbide film with 15 at. % oxygen contamination. When a film is grown under identical conditions and capped in-situ with $HfB_2$ (which protects against post-growth oxidation in air), the oxygen content is only slightly less, 13 at. %, which indicates that the oxygen contamination in the film originates mostly from carbonyl decomposition and not from post-growth air exposure. The film surface is rough, which is indicative of sparse nucleation [13, 14] By contrast, there is no nucleation delay on $RuO_2$ or $TiO_2$ surfaces; a 70 nm thick film grows within 9 minutes, with a growth rate of 8 nm/min.

Under the same experimental conditions, no change in the ellipsometry signal occurs, i.e., no nucleation takes place, on MgO or $Al_2O_3$ substrates for growth times of 22 and 35 min, respectively, after which a small deviation indicates the onset of nucleation (FIG. 2). The surface roughness of the $Al_2O_3$ substrate after 20 min of attempted growth is identical to that of the bare substrate. High resolution XPS and RBS measurements do not detect Mo on the MgO and $Al_2O_3$ substrates. Thus, $MoC_x$ growth occurs quickly on $SiO_2$, $RuO_2$, and $TiO_2$, but there is a significant nucleation barrier on $Al_2O_3$ and MgO, as discussed further below.

Inhibition of nucleation and growth from $Mo(CO)_6$ on oxide surfaces by ammonia: The nucleation rate of $MoC_xN_y$ on $SiO_2$, $RuO_2$, and $TiO_2$ substrates at 200° C. is dramatically affected when ammonia is co-flowed with the $Mo(CO)_6$ precursor: the growth rate is zero even after extended exposure times. For example, at 0.01 mTorr of precursor and 1.8 mTorr of ammonia on $SiO_2$ at 200° C., no nucleation is detected even after 120 min, as compared with deposition of nearly 1000 nm in the absence of ammonia (FIG. 3, panels a and b). AFM images of samples exposed to $Mo(CO)_6$ and ammonia for 30, 60, and 120 min are identical to bare $SiO_2$ substrate (FIG. 3, panel c). When the ammonia co-flow experiment is repeated at a higher precursor pressure, 0.025 mTorr, while keeping the ammonia pressure at 1.8 mTorr, some nucleation can be detected after 15 min. But nucleation at the higher precursor pressure can be inhibited simply by increasing the pressure of ammonia: in a third experiment at a precursor pressure of 0.025 mTorr and an ammonia pressure of 3.7 mTorr, no nucleation occurs even after 60 min. AFM scans of the surface treated under these conditions show no nuclei and XPS detects no molybdenum. These data suggest that the inhibition effect is due to a surface passivation effect, in which a given ammonia pressure renders the surface unreactive independent of precursor pressure. Instead, the results are consistent with competitive adsorption of $Mo(CO)_6$ and ammonia, in which binging of ammonia to the surface prevents adsorption of the carbonyl precursor.

Similar results are seen on $TiO_2$ at 200° C.: in contrast to the rapid nucleation and growth that take place on $TiO_2$ from 0.020 mTorr of $Mo(CO)_6$ in the absence of ammonia, there is no nucleation when 0.020 mTorr of precursor is co-flowed with 3.5 mTorr of ammonia, even after 30 min. On $RuO_2$, the effect of ammonia is still dramatic but not quite as complete: after a $RuO_2$ surface is exposed at 200° C. to 0.025 mTorr precursor and 3.7 mTorr ammonia for 30 min, AFM detects ~10 nuclei/$\mu m^2$.

Finally, we investigated the effect of ammonia on MgO and $Al_2O_3$, two surfaces for which there is a significant nucleation delay when exposed to $Mo(CO)_6$ by itself at 200° C. On these two surfaces, co-flow of ammonia significantly extended the nucleation delay: even after 40 and 65 min of exposure, respectively (FIG. 4), XRR data indicate no change from the bare substrates, and ellipsometry and AFM show the absence of any nuclei. RBS confirms the absence of molybdenum on all the surfaces, down to a detection limit of ~$10^{13}$-$10^{15}$ atoms/$cm^2$.

Inhibition of nucleation and growth from $Mo(CO)_6$ on native oxide surfaces by ammonia: Very similar effects are seen on Ti, TiN, and Si substrates covered with their native oxides: 3.7 mTorr ammonia completely inhibits nucleation from 0.025 mTorr of $Mo(CO)_6$ at 200° C. This result raises the possibility that selective inhibition of growth from a carbonyl (or other) precursor on Ti, TiN, and Si and other non-oxide substrates can be achieved by first forming a coat of native oxide. After selective deposition on other surfaces, the native oxide can be etched off to return the surface to its original state.

Reversibility of inhibition on oxide surfaces by ammonia: We find that the temperature window for selective inhibition of CVD from $Mo(CO)_6$ on thermal $SiO_2$ is approximately 150-210° C., for ammonia pressures within the mTorr range. At 150° C. and 0.02 mTorr $Mo(CO)_6$ pressure, a relatively small ammonia pressure of 1.5 mTorr is enough to inhibit growth on $SiO_2$ altogether. Interestingly, when the ammonia flow to the growth chamber is stopped during a CVD experiment, nucleation occurs within a few seconds on $SiO_2$, $TiO_2$, and $RuO_2$ substrates as judged by in-situ ellipsometry. This result confirms that, as expected, ammonia reversibly adsorbs to the oxide surface. The mean residence time of ammonia on $SiO_2$ is estimated to be ~1.7×10-8 sec at 150° C., and is shorter at higher temperatures; thus the surface instantly becomes active for nucleation upon interruption of the ammonia co-flow. At substrate temperatures higher than 210° C., ammonia no longer is able to prevent inhibition on $SiO_2$ indefinitely: for example, at 225° C. using 0.02 mTorr precursor and a higher ammonia pressure of 9 mTorr, nucleation occurs after a 13 min delay.

Non-inhibition on nitride surfaces. In the context of surface-selective deposition, it is significant that ammonia does not inhibit nucleation and growth from $Mo(CO)_6$ on certain nitride surfaces under certain conditions. Two nitride surfaces were investigated: an in-situ grown vanadium nitride and an e-beam deposited titanium film protected from atmospheric oxidation during transfer to the CVD chamber. At $Mo(CO)_6$ and ammonia pressures of 0.025 mTorr and 3.7 mTorr, respectively, no nucleation delay is observed on these surfaces at 200° C. by in-situ ellipsometry; 19 nm of film is deposited during a 20 min growth time. AES depth profiles show that the films contain 20 at. % nitrogen and 21 at. % carbon; the oxygen content is 3-4 at. % after air exposure. Thus, the film composition is best described as $MoC_{0.36}N_{0.35}$. The significant nitrogen content is consistent with the known ability of vanadium nitride, titanium nitride, molybdenum carbide and molybdenum nitride surfaces to catalyze ammonia decomposition at our deposition temperatures [15-17] [18, 19]. The $MoC_{0.36}N_{0.35}$ samples in this study are metallic and have room temperature resistivities of 200-300 $\mu\Omega$-cm.

Inhibition of nucleation and growth from $Fe(CO)_5$ on oxide surfaces by ammonia: The ability of ammonia to inhibit nucleation and growth on metal oxide surfaces extends to other metal carbonyl precursors. Whereas 0.01 mTorr of $Fe(CO)_5$ affords a high coverage of large islands on thermal $SiO_2$ after 9 min at 130-150° C. (FIG. 7, panel a), under the same conditions except with a co-flow of 10-18 mTorr of ammonia, AFM indicates that no nucleation occurs at all at 130° C., and only ~0.25 nuclei/$\mu m^2$ are present at 150° C. (FIG. 7, panels b and c). High resolution XPS detects no iron on the substrate. The inhibition is still effective after a growth time of 20 min.

As seen above for $Mo(CO)_6$, growth from $Fe(CO)_5$ on MgO is characterized by a long nucleation delay of over 40 min at 150° C. even in the absence of ammonia, as evidenced by in-situ ellipsometry and ex-situ high resolution XPS studies. The observed nucleation delay for MgO but not for $SiO_2$ in the absence of ammonia is consistent with the results reported above for $Mo(CO)_6$.

Also similar to the $Mo(CO)_6$ results is the finding that rapid deposition of Fe occurs from $Fe(CO)_5$ on nitride surfaces, even in the presence of ammonia. Thus, a 50 nm thick Fe film grows on a VN seed layer or on a Ti substrate. An Auger depth profile indicates incorporation of 3 at. % nitrogen in the Fe film, along with 2 at. % carbon and 1 at. % oxygen.

Inhibition of nucleation and growth from $Ru_3(CO)_{12}$ on oxide surfaces by ammonia: Ru CVD from $Ru_3(CO)_{12}$ behaves in the same manner as for $Fe(CO)_5$. At 150° C. in the absence of ammonia, nucleation and growth occurs readily on $SiO_2$ (FIG. 8, panel a), but not on MgO, as evidenced by in-situ ellipsometry and ex-situ AFM. Co-flow of 10 mTorr ammonia completely shuts down nucleation on $SiO_2$ (FIG. 8, panel b), whereas Ru nucleation and growth occur easily on Ti and VN.

Discussion: Reactivity of metal carbonyls on oxide surfaces: We have found that, at relatively low temperatures in the absence of ammonia, CVD from metal carbonyls shows little or no nucleation delay on some oxides (such as $SiO_2$, $TiO_2$, and $RuO_2$) but long nucleation delays on other oxides (such as MgO and $Al_2O_3$). Our findings are consistent with studies of the formation of metal nanoparticle catalysts on oxide supports from metal carbonyl precursors at similar temperatures [20-22]. For example, molybdenum and its compounds constitute a well-known group of heterogeneous catalysts for dehydrogenation and metathesis of alkenes; the chemistry and kinetics of catalyst formation have been studied extensively [21, 23-25]. The reaction to form molybdenum nanoparticles occurs readily on $SiO_2$ but not on Al$_2$O$_3$; the difference has been attributed to differences in the reaction pathway on oxides with acidic vs. basic hydroxyl groups, discussed below [20, 26].

Oxide surfaces, unless vacuum annealed at high temperature, are always hydroxylated because the —OH termination lowers the surface energy. The character of the —OH group can, however, be either acidic or basic; as a guideline, a hydroxyl group is more acidic if the bulk metal-oxygen bond is more covalent. The acidity can be characterized by the isoelectric point (IEP), which is the pH value of an aqueous solution needed to establish zero average charge on the oxide surface. Acidic hydroxyl groups have a negative surface charge in liquid water at neutral pH, so that the pH has to be lowered to obtain a neutral surface charge, and conversely for basic hydroxyls [27-29]. The oxides SiO$_2$, RuO$_2$, and TiO$_2$ have acidic hydroxyl groups with IEPs of 2.2, 4.2, and 4-6, respectively; MgO and Al$_2$O$_3$ have basic hydroxyl groups with IEPs of 12 and 8-9, respectively [30]. IEP values decrease slightly with increasing temperature, but in general temperature changes will not convert basic hydroxyl groups to acidic ones [31]. Interestingly, some mixed oxides have hydroxyl groups that are more acidic than those in either of the binary constituents [32-34]: for example, alumina supported on silica is more acidic than either silica or alumina alone [35]. Note that even though a macroscopic description of acid-base properties by IEP is a useful parameter for characterization of a solid surface, a localized description is required to explain molecular level acid-base interactions [27].

We find that the reaction of Mo(CO)$_6$ on acidic oxide surfaces in the absence of ammonia leads to rapid nucleation and growth of MoO$_x$C$_y$ films. Consistent with this finding, on the (100) face of hydroxylated TiO$_2$, Mo(CO)$_6$ dissociatively adsorbs above −50° C. and no stable sub-carbonyls are detected [36]. Exposure of the TiO$_2$ surface at 130° C. to Mo(CO)$_6$ results in the formation of Mo and C on the surface [36]. On basic surfaces, however, TPD experiments suggest that stable sub-carbonyls are formed which do not further react at low temperatures [37]. For example, on Al$_2$O$_3$, Mo(CO)$_6$ reacts to form film only above 400° C. TPD experiments show that, on this surface, Mo(CO)$_6$ loses CO in two steps, each step involving desorption of 3 CO molecules per precursor molecule; this result suggests the formation of stable adsorbed Mo(CO)$_3$ species after the first step, and removal of remaining three CO groups in the second step at 400° C. Decomposition of Mo(CO)$_6$ on hydroxylated Al$_2$O$_3$ is a kinetically limited process, with no evidence for a role of particular sites on the surface. The exact nature of the interaction between surface hydroxyl groups and the presumed Mo(CO)$_x$ species formed by decomposition is not known, but presumably involves initially some form of hydrogen bonding [26].

On acidic oxides such as SiO$_2$, Ru$_3$(CO)$_{12}$ reacts with surface OH groups to form the grafted cluster HRu$_3$(CO)$_{10}$(OSi≡), which decarbonylates completely upon being heated to 200° C. [38, 39]. On basic oxides such as MgO and Al$_2$O$_3$, Ru$_3$(CO)$_{12}$ reacts with OH groups to form stable anionic carbonylruthenate species that decarbonylate completely only at temperatures above 350° C. [40]. On the basic oxide La$_2$O$_3$, adsorption of Ru$_3$(CO)$_{12}$ generates mononuclear (dicarbonyl)ruthenium species, which decarbonylate only above 250° C. [41]. Similar results are reported for Fe(CO)$_5$, which generates the thermally robust anionic cluster [HFe$_3$(CO)$_{11}$]— on basic oxides [42, 43].

According to the catalysis literature, the reaction pathway of metal-carbonyl precursors such as Cr(CO)$_6$, W(CO)$_6$, Co$_2$(CO)$_8$, and Re$_2$(CO)$_{10}$ depends strongly on the degree of hydroxylation of the oxide surface and on the acid-base character of the oxide [21]. The temperature at which these precursors completely decarbonylate is lower on acidic oxides than on basic oxides.

The short nucleation delays on acidic oxides such as SiO$_2$, RuO$_2$, and TiO$_2$, vs. the long nucleation delays on basic oxides such as MgO, must relate either to the Brønsted acidity of the surface OH groups, or the Lewis basicity of deprotonated surface hydroxyl groups. We now turn to this issue.

Reactivity of ammonia on oxide surfaces: As shown in the results section, ammonia co-flow inhibits nucleation and growth of films from metal carbonyls on acidic oxides. To understand the reasons for this effect, we need to understand how ammonia, a strong Lewis base, interacts with metal oxide surfaces. Such interactions can be probed by adsorbing ammonia and then probing the adsorbed states by FTIR [28, 44-46], microcalorimetry [35, 47, 48], or thermally programmed desorption [35, 46] experiments.

Generally, the degree of interaction depends on the strength of the acid-base pair [49]. It is also known that organic bases such as amines and ammonia poison the catalytic activity of acidic oxides [50-52].

The adsorption energy of ammonia on hydroxylated SiO$_2$ is ca. 0.43 eV [53]. This value is too small to lead to any considerable steady state ammonia coverage at the growth temperatures examined here; for example, at 200° C. and a pressure of 3.5 mTorr of ammonia, the surface coverage is ~6%. However, it should be noted that number of reactive sites may be only a small fraction of the total number of surface sites, so that a coverage of 6% may be sufficient to prevent nucleation and growth of a CVD film. In this context, it is worth pointing out that, for Ru growth from Ru$_3$(CO)$_{12}$ on SiO$_2$, the nucleation density as a function of temperature follows the same trend as the number of isolated OH groups, but only a small fraction of the ~10$^{11}$ sites/cm$^2$ are involved in nucleation [54].

Indeed, adsorption energies on hydroxylated SiO$_2$ are coverage-dependent [47]. The differential heat of ammonia adsorption on hydroxylated SiO$_2$ at near-zero coverages is 0.8-0.9 eV. This value decreases with increasing ammonia coverage, indicating the presence of a heterogeneous distribution of surface sites, lateral interaction between adsorbed species, or induced heterogeneity [55].

All these data are consistent with our finding that at 150° C. an ammonia pressure of only 1.5 mTorr is sufficient to inhibit nucleation from Mo(CO)$_6$ precursor, but that at 225° C. 9 mTorr of ammonia is required, although a small amount of nucleation occurs.

Onset of nucleation and growth when ammonia flow is stopped is consistent with hydrogen bonding of ammonia to surface hydroxyl groups [56, 57]. Temporary passivation of a surface may not pose an issue for CVD processes because continuous co-flow of the inhibitor is acceptable. Furthermore, continuous co-flow affords control over the surface reactivity for long periods of time, required for growth of thicker films on metal areas of the substrate.

Extension to native oxide surfaces: We find that ammonia is able to inhibit nucleation and growth from metal carbonyl precursors on the native oxides on Ti, TiN, and Si. This result indicates that the hydroxyl groups on native oxides behave the same way as on bulk oxides.

Extension to other inhibitors and precursor systems: Amines other than ammonia (pKa=9.25), can adsorb on oxide surfaces; among these (in order of decreasing basicity) are dimethyl amine (pKa=10.73), methylamine (10.66), trimethylamine (9.8), and pyridine (5.23). We performed selected experiments using 0.025 mTorr of Mo(CO)$_6$ and 3.7 mTorr of pyridine on SiO$_2$ at 200° C. In a 40 minute experiment, the real-time ellipsometry signal changed only very slightly; AFM scans indicated the presence of just a few nuclei spaced by ~1 µm. The experiment was then repeated but after 30 minutes, the pyridine flow was cut off and the precursor flow continued for another 20 minutes. Nucleation and growth happened very slowly in the presence of precursor only and the ellipsometry signal change was consistent with growth with pyridine present. This is in sharp contrast with the results of a similar experiment using NH$_3$ as the inhibitor, in which nucleation occurred shortly after the inhibitor flow was stopped. When growth is done using precursor and pyridine on a seed layer of vanadium nitride, the growth rate on the metallic substrate is much lower than when using ammonia, i.e., pyridine also tends to inhibit film growth.

The result for pyridine suggests a process option: area-selective growth might be obtained by treating the substrate with an initial dose of an amine that is strongly binding to acidic oxide surfaces, rather than being injected continuously. This approach has two potential advantages: first, it might be applicable to ALD; second, the absence of the inhibitor during CVD might afford higher deposition rates on intended growth surface. Of course, this approach must prevent nucleation on the oxide surface; if an initial dose is not sufficient, then periodic dosing could be used.

Conclusions: The CVD from metal-carbonyl precursors on oxide substrates can be inhibited by the addition of ammonia (and other amines). The effect is most pronounced on oxides with acidic hydroxyl groups, for which nucleation and growth is fast in the absence of ammonia at temperatures above 150° C. Whereas decarbonylation of the precursor goes to completion on oxides with acidic hydroxyl groups, basic hydroxyl groups stabilize sub-carbonyls and reaction is ceased. Co-flow of a strong base molecule such as ammonia blocks the acidic hydroxyl groups probably through deprotonation of the surface hydroxyl groups. Perfect selective growth is reported with no nucleation on SiO$_2$, RuO$_2$, TiO$_2$, Al$_2$O$_3$, and MgO, whereas film grows with no delay on metallic substrates.

Example 3

The use of basic molecular inhibitors such as NH$_3$ to afford selective growth can be extended to the use of other precursors, inhibitor molecules, and potentially to other dielectric substrates, if they are terminated with hydroxyl groups, as is the case for silicon nitride [42]. Among carbonyl-based precursors, we tested Mo(CO)$_6$, Fe(CO)$_5$, and Ru$_3$(CO)$_{12}$ on thermal SiO$_2$, TiO$_2$, and RuO$_2$, and found no nucleation for at least 20-120 min. (On RuO$_2$, there were a few nuclei per square µm, which we attribute to the possible presence of 'dust'.) Other basic inhibitors such as amines and CO can also result in selective growth.

A further extension would be to use basic inhibitors with precursors based on other ligand groups. For example, for the metal-allyl precursor Rh($\eta_3$-C$_3$H$_5$)$_3$, the first step in precursor adsorption is the formation of a mono-allyl intermediate, which is known to be fast on an acidic oxide substrate [43]. We expect that if the surface were modified by using an inhibitor, then the reduced rate of precursor adsorption might greatly delay or eliminate the nucleation process. This selective growth approach is applicable for other precursor/substrate combinations following similar mechanisms as those discussed herein.

Example 4

In the fabrication of nanoscale devices, the top-down process of lithography and etching is time consuming and expensive. A proposed bottom-up approach—area selective growth—would enable device fabrication beyond conventional patterning limits: thin films would preferentially deposit onto pre-existing portions of a structure with no nucleation and growth on other surfaces. However, a selective process is subject to statistical failure—the nucleation of unwanted material—when it relies on the initial characteristics of the non-growth surface, either the inherent chemical properties or passivation pre-treatments. A robust process requires dynamic control of selectivity to ensure that no stray nucleation occurs on the intended non-growth surfaces for the total time required to deposit film on the device areas.

Here, we present a perfectly selective CVD method which involves adding a neutral molecule "inhibitor" to the process gas mixture: the inhibitor dynamically populates oxide surfaces and prevents nucleation while permitting the deposition of film on metal surfaces, where the inhibitor effect is weaker. Because the inhibitor concentration on the oxide surfaces is continuously replenished, it completely eliminates film nucleation on defects or impurity sites.

We previously demonstrated perfectly selective copper CVD using the Cu(hfac)VTMS precursor with additional VTMS as the inhibitor: no nucleation occurs on thermal SiO$_2$ or on porous, carbon doped oxide, while copper growth occurs on areas covered with a ruthenium seed layer [1]. The excess VTMS scours Cu(hfac) intermediates off the dielectric surface prior to the disproportionation (growth) reaction. Here, we extend the method by using a different class of inhibitor molecules to afford the selective CVD of transition metals and their compounds on a wide variety of oxide substrates; and we explain the mechanism of selectivity.

Example 5: Area Selective CVD of Metallic Films from Molybdenum, Iron, and Ruthenium Carbonyl Precursors: Use of Ammonia to Inhibit Nucleation on Oxide Surfaces It is demonstrated in this Example that the addition of an ammonia co-flow during the chemical vapor deposition of MoC$_x$N$_y$, Fe, or Ru thin films at 200° C. from the metal carbonyl precursors Mo(CO)$_6$, Fe(CO)$_5$, or Ru$_3$(CO)$_{12}$ affords area-selective growth: film grows readily on titanium metal or vanadium nitride substrate surfaces, but no nucleation occurs on SiO$_2$, TiO$_2$, Al$_2$O$_3$, or MgO within the investigated times of 1-2 hours. By contrast, in the absence of ammonia nucleation and deposition on these oxide surfaces can either be slow or rapid, depending strongly on the oxide surface preparation. NH$_3$ is also the source of N in MoC$_x$N$_y$, which has a resistivity of 200 µΩ-cm and becomes superconducting at a critical temperature of 4 K. In an embodiment, the passivating effect of NH$_3$ on oxide surfaces involves site blocking to prevent precursor adsorption, or an acid-base interaction to stabilize surface-bound metal sub-carbonyl intermediates, or a combination of these mechanisms.

Many nanoscale electronic devices are fabricated by top-down approaches involving blanket film deposition, lithographic patterning, and etching steps. However, as feature sizes shrink toward 10 nm, pattern registry becomes very difficult. One bottom-up method that in principal can guarantee pattern registry is area selective deposition (ASD), in which a thin film grows selectively, for example, on metallic but not on dielectric surfaces. ASD builds upon the previously established pattern on the substrate and obviates the need for additional patterning and etching steps[1]. In chemical vapor deposition (CVD) or atomic layer deposition (ALD) processes, selective growth occurs when film nucleation is inherently difficult on some surfaces (usually, oxides) but not on others[2-4], or when a surface is rendered passive by chemical termination such as by the deposition of a dense self-assembled monolayer[5-10].

In ASD processes, selectivity is lost when nucleation commences on the intended non-growth surface, which often occurs at defects in the surface or in the passivation treatments[2, 4, 11, 12]. One way to achieve a robust ASD process is to ensure that no nucleation occurs on the oxide over the total time needed to deposit the desired film thickness on the metal. In CVD, we have previously demonstrated that in some systems this outcome can be accomplished by continuously injecting a suitable neutral molecular inhibitor along with the precursor: the inhibitor allows film growth to occur on metal surfaces, but reduces the nucleation rate on oxide surfaces essentially to zero[13]. Specifically, we showed that Cu growth from the Cu(hfac) VTMS precursor on oxide surfaces can be inhibited by co-injecting additional VTMS. On both metal and dielectric surfaces, the effect of added VTMS is to promote the associative desorption of Cu(hfac) intermediates in the form of the Cu(hfac)VTMS precursor. On oxide surfaces the disproportionation of the Cu(hfac) intermediates to Cu(hfac)$_2$ and Cu metal is slow, so that the Cu(hfac) intermediates have time to desorb as Cu(hfac)VTMS without depositing copper; in contrast, on metal surfaces, which promote the electron transfer necessary for disproportionation, conversion of the Cu(hfac) intermediates to Cu(hfac)$_2$ and Cu metal is fast and not prevented by the added VTMS[13].

Described herein are embodiments of an inhibitor approach to ASD, in which CVD film growth from molybdenum, iron, and ruthenium carbonyl precursors can be completely suppressed on many oxide surfaces by injecting $NH_3$, a strong Lewis base, along with the precursor. In the absence of ammonia, selective deposition from these carbonyl precursors on metal substrates but not on oxides can sometimes be achieved, but the selectivity depends capriciously on the oxide substrate history; furthermore, even when selectivity is seen, it is often quickly lost as deposition is continued. We show that the presence of $NH_3$ completely eliminates the nucleation of metal on many oxide surfaces for the 1-2 hour duration of the experiments performed. At the same time, film nucleation and growth occur readily on metallic seed layers despite the presence of $NH_3$ in the feed gas, i.e., the approach affords perfect selectivity. Ammonia thus lengthens the nucleation delay on oxide surfaces (e.g., at least one hour, preferably in some applications at least two hours), and makes the delay far less dependent on the substrate history.

It is demonstrated here that the mechanism by which ammonia promotes ASD may be different than that in the Cu(hfac)(VTMS) system: instead of reacting directly with the precursor, ammonia changes the surface in such a way to prevent the precursor from converting to film. The mechanistic embodiments include that: (i) $NH_3$ may adsorb to an areal coverage that is sufficient to site block the process of precursor adsorption; or (ii) the adsorption of $NH_3$ may render the surface more basic, which stabilizes surface-bound $M(CO)_x$ intermediates with respect to further loss of CO ligands and thus prevents them from converting to a metallic film. A combination of these mechanisms could also be operative. Below, we describe data in the context of relevant studies of oxide surfaces from the heterogeneous catalysis literature.

Experimental Details: CVD experiments are performed in a cold wall high vacuum chamber described elsewhere 14, 15 We explore the behavior of carbonyl precursors of Mo, Fe, and Ru in the presence of $NH_3$. The pressure of $Mo(CO)_6$ is controlled by setting the temperature of the precursor reservoir in the range 20-40° C.; this precursor flows under its own vapor pressure (i.e., with no carrier gas) through the delivery tube, which is heated to 55° C. to avoid condensation of sublimed precursor. The precursor pressure in the chamber is 0.01-0.03 mTorr. The $Fe(CO)_5$ precursor is cooled to 0° C. in an ice bath and the precursor pressure is controlled by a needle valve to establish a partial pressure in the chamber of 0.01 mTorr. The $Ru_3(CO)_{12}$ precursor is heated in the reservoir to 85° C. and is delivered to the chamber by means of 50 sccm of Ar as a carrier gas. Research grade ammonia (99.9992%) is delivered through a separate gas line, regulated by a mass flow controller to establish a partial pressure of 1-20 mTorr in the chamber. All the gas delivery lines are pointed towards the substrate; hence the local fluxes are higher than those suggested by the isotropic background pressure.

The substrate is heated radiatively to a temperature of 130-225° C., as measured by a K-type thermocouple attached to the sample holder. The following substrates are used with no pre-treatment following their preparation in other facilities on our campus: (i) 300 nm thermal $SiO_2$ (microelectronic grade)/Si; (ii) 10 nm e-beam Ru/$SiO_2$/Si; (iii) 50 nm CVD MgO/Si[16]; 8 nm ALD $Al_2O_3$ (doped with 5% $TiO_2$)/Si (precursors are trimethylaluminum and tetrakis (dimethylamido)titanium and water); (iv) $TiO_2$/Ti/Si prepared by e-beam depositing 20 nm Ti and then oxidizing under ozone in air for 1 hour; (v) 60 nm of e-beam Ti/Si, and (v) 1-2 nm VN/thermal $SiO_2$ grown by CVD from tetrakis (dimethylamido)vanadium and ammonia at 200° C.[17]. The Ru and Ti films are exposed to air before use and thus are surface-oxidized; for example, XPS confirms the presence of $RuO_2$ on the surface of the Ru films. For Ti, freshly prepared samples are exposed to air as briefly as possible and promptly transferred from the e-beam system to the CVD system ("fresh Ti"); we find that Ti films that have been exposed to lab air for several days to form a thicker oxide overlayer ("aged Ti") behave quite differently.

Film thickness and microstructure are determined from cross-sectional and top-view SEM images. Compositional depth profiles are obtained by AES with sputtering. The onset of nucleation and the growth are monitored by real-time spectroscopic ellipsometry (SE); for each substrate-film combination, we report change in the ellipsometric angle delta at a single energy, 2.65 eV, which provides the greatest sensitivity to the onset of nucleation, as discussed previously[13]. Ex-situ AFM (2×2 μm scan area), RBS, TOF-SIMS, and high resolution XPS are used to detect the formation of nuclei on the non-growth surfaces.

To rule out the effect of gas scattering, i.e., that the partial pressure of $NH_3$ reduces the flux of precursor to the growth surface, a screening experiment is performed by replacing $NH_3$ by Ar. (Because the mass of Ar is greater than that of $NH_3$, the effect, if any, may be slightly stronger than that of $NH_3$.) The steady state growth rate of the $MoC_x$ films decreases by approximately 20% upon addition of Ar. Generally, the modest reduction in precursor flux due to gas scattering may be an insignificant factor in the dramatic increase in nucleation time upon addition of $NH_3$.

Results: Control studies of deposition from $Mo(CO)_6$ on metal oxide surfaces: We show the chemical vapor deposition of molybdenum-containing films from the carbonyl precursor $Mo(CO)_6$ on different oxide substrates in the absence of any co-reactant[18, 19]. The onset temperature for $Mo(CO)_6$ thermolysis is 150° C. For growth at 200° C. from 0.010 mTorr of precursor, there is a relatively short nucleation delay of 5 min on $SiO_2$, after which growth reaches a steady-state rate of roughly 8 nm/min (FIG. 2). Growth at 200° C. affords a molybdenum carbide film with 15 at. % oxygen content. When a film is grown under identical conditions and capped in-situ with $HfB_2$ (which protects against post-growth oxidation in air), the oxygen content is only slightly less, 13 at. %; this result indicates that the oxygen in the film originates mostly from carbonyl decomposition and not from post-growth air exposure, in agreement with previous studies[18, 20, 21]. The film surface is rough, which is indicative of sparse nucleation (FIG. $2b$)[22, 23].

Under the same experimental conditions, except that the surface is changed from $SiO_2$ to MgO or $Al_2O_3$, no change in the ellipsometry signal occurs, i.e., no nucleation takes place, for growth times of 22 and 35 min, respectively, after which a small deviation indicates the onset of nucleation (FIG. 1 inset). After 20 min of attempted growth, high-resolution XPS and RBS measurements do not detect Mo on the MgO or $Al_2O_3$ substrates; and the surface roughness of the $Al_2O_3$ substrate is identical to that of the bare substrate.

In contrast to the short nucleation delay seen on $SiO_2$ and the longer delays seen on MgO and $Al_2O_3$, there is no nucleation delay on $RuO_2$ or $TiO_2$ surfaces; a 70 nm thick film grows within 9 min, with a growth rate of 8 nm/min. Thus, $MoC_x$ growth occurs promptly on $RuO_2$ and $TiO_2$, and after a short delay on $SiO_2$, but there is a significant nucleation delay (barrier) on $Al_2O_3$ and MgO surfaces, when prepared as described in the Experimental section.

Figure 3A:
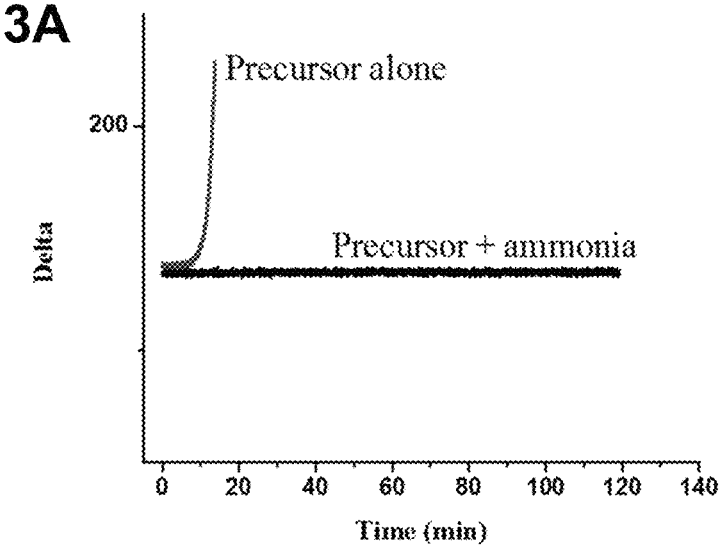
FIGS. 3A-3C.
Figure 3B:
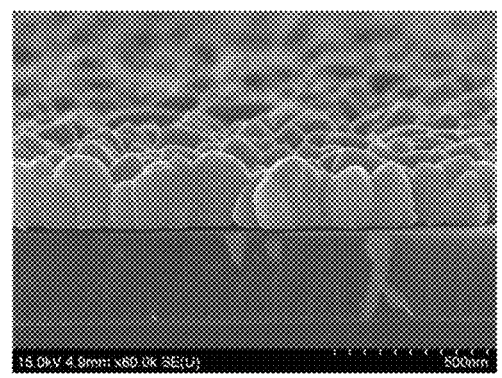
Figure 3C:
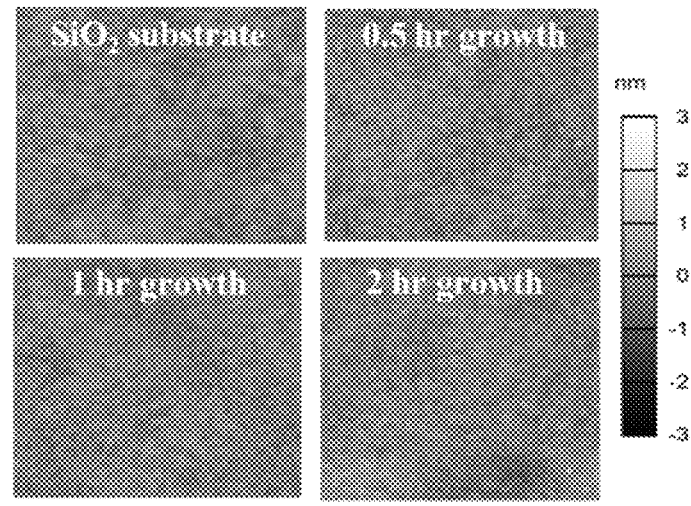

Results: Inhibition of nucleation and growth from $Mo(CO)_6$ on oxide surfaces by ammonia: The short nucleation delay on $SiO_2$ substrates at 200° C. is dramatically lengthened when ammonia is co-flowed with the $Mo(CO)_6$ precursor. For example, at 0.01 mTorr of precursor and 1.8 mTorr of ammonia on $SiO_2$ at 200° C., no nucleation is detected even after 120 min, as compared with deposition of nearly 200 nm after 30 min in the absence of ammonia (FIGS. 3A and 3B). AFM images of samples exposed to $Mo(CO)_6$ and ammonia for 30, 60, and 120 min are identical to the bare $SiO_2$ substrate (FIG. 3C).

When the ammonia co-flow experiment is repeated at a higher precursor pressure, 0.025 mTorr, while keeping the ammonia pressure at 1.8 mTorr, some nucleation can be detected after 15 min. But nucleation at the higher precursor pressure can be inhibited by increasing the pressure of ammonia: in a third experiment at a precursor pressure of 0.025 mTorr and an ammonia pressure of 3.7 mTorr, no nucleation occurs after 60 min. AFM scans of the surface treated under these conditions show no nuclei, and XPS detects no molybdenum.

Similar results are seen on $TiO_2$ at 200° C.: in contrast to the rapid nucleation and growth that take place on $TiO_2$ from 0.020 mTorr of $Mo(CO)_6$ in the absence of ammonia, there is no nucleation when 3.5 mTorr of ammonia is co-flowed under these conditions, even after 30 min. On $RuO_2$, co-flow of ammonia considerably slows nucleation from $Mo(CO)_6$ but does not completely suppress it: after a $RuO_2$ surface is exposed at 200° C. to 0.025 mTorr precursor and 3.7 mTorr ammonia for 30 min, AFM detects about 10 nuclei/$\mu m^2$.

We also show the effect of ammonia on MgO and $Al_2O_3$, two surfaces for which there is a significant nucleation delay (intrinsic selectivity) when exposed to $Mo(CO)_6$ at 200° C. in the absence of ammonia. On these two surfaces, co-flow of ammonia significantly extended the nucleation delay: even after 40 and 65 min of exposure, AFM and ellipsometry (FIG. 4) show the absence of any nuclei.

AES depth profiles show that the films deposited from $Mo(CO)_6$ in the presence of ammonia (both in this section and later in this paper) contain 20 at. % nitrogen and 21 at. % carbon; the oxygen content is 3-4 at. % after air exposure. Thus, the film composition is best described as $MoC_{0.36}N_{0.35}$. The significant nitrogen content is consistent with the known ability of molybdenum carbide and molybdenum nitride surfaces to promote ammonia decomposition at this deposition temperature[24-26]. The $MoC_{0.36}N_{0.35}$ samples in this study are metallic and have room temperature resistivities of 200-300 $\mu\Omega$-cm. This material is also superconducting, with a critical temperature of 4 K; detailed studies of this property are described elsewhere[27].

Results: Nucleation and growth from $Mo(CO)_6$ on metal and metal nitride surfaces in the presence of ammonia: In contrast to the above results—and highly significant in the context of surface-selective deposition—we find that ammonia does not stop nucleation and growth from $Mo(CO)_6$ on in-situ grown vanadium nitride and a freshly e-beam deposited titanium film bearing a thin oxide overlayer. When these substrates are exposed to 0.025 mTorr of $Mo(CO)_6$ at 200° C., film grows with no detectable nucleation delay at a rate of 12 nm/min. Under the same conditions but with co-flow of 3.7 mTorr of $NH_3$, there is also no nucleation delay on VN but the film grows more slowly: 19 nm of film deposits during a 20 min growth time. On a freshly-prepared Ti substrate bearing only a thin oxide overlayer, there is a short nucleation delay of 5 to 20 min in the presence of a co-flow of 3.7 mTorr of $NH_3$, but after that film grows steadily.

The ability of $Mo(CO)_6$ to nucleate and grow on some surfaces but not on others in the presence of $NH_3$ suggests these differences can be exploited to achieve surface-selective growth, as described below.

Figure 6C:
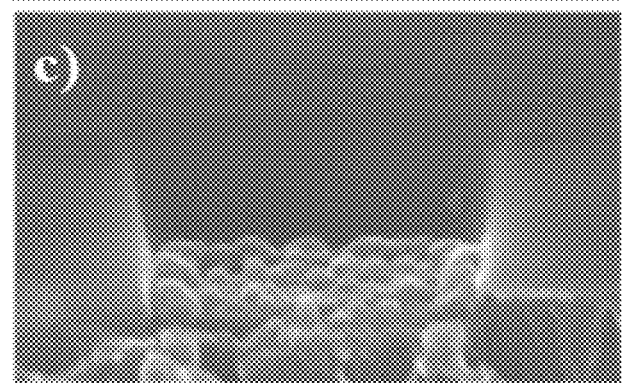

Results: Area-selective growth on patterned substrates and bottom-up filling: On a patterned substrate of fresh Ti/$SiO_2$, growth from 0.025 mTorr $Mo(CO)_6$ and 3.7 mTorr ammonia at 200° C. affords film only on the metallic areas of the pattern, with no deposition on oxide as evidenced by Auger elemental mapping (FIG. 5). This highly selective growth process can also be used to affect the bottom-up filling of trenches and vias. When a pattern of vias consisting of $SiO_2$ sidewalls and a Nb film on the via bottoms is exposed to the same growth conditions as above, growth occurs only at the base of the via with no nucleation on the sidewalls or top surface (FIG. 6C).

Results: Inhibition of nucleation and growth from $Mo(CO)_6$ on native oxide surfaces by ammonia: Many non-oxide surfaces form native oxide overlayers when exposed to air; for example, silicon nitride forms a silicon-rich and nitrogen-depleted native oxide that is terminated by Si—OH sites, similar to those present on $SiO_2$ surfaces[28]. Consistent with this finding, Si, SiN, Ti, and TiN substrates covered with a sufficiently thick overlayer of their native oxides respond to ammonia as other oxide surfaces do: thus, 3.7 mTorr ammonia completely inhibits nucleation from 0.025 mTorr of $Mo(CO)_6$ at 200° C. For example, whereas $Mo(CO)_6$ deposits onto freshly prepared Ti surfaces in the presence of ammonia (as described above), we find that deposition is strongly inhibited on a Ti surface that has been left in air for several days.

Therefore, in some embodiments, selective inhibition of growth from a carbonyl precursor on Si, SiN, Ti, TiN, and other non-oxide substrates, can be achieved by first forming a coat of native oxide. After selective deposition on other surfaces in the presence of ammonia, the native oxide can be etched off or chemically reduced to return the surface to its original state.

Results: Process window and reversibility of inhibition on oxide surfaces by ammonia: We find that the temperature window for inhibition of CVD from $Mo(CO)_6$ on thermal $SiO_2$ is approximately 150-210° C. for ammonia pressures within the mTorr range, such 1 Torr to 1000 mTorr. At 150° C. and 0.02 mTorr $Mo(CO)_6$ pressure, a relatively small ammonia pressure of 1.5 mTorr is enough to inhibit growth on $SiO_2$ altogether. In contrast, at 225° C. using 0.02 mTorr precursor and a higher ammonia pressure of 9 mTorr, nucleation occurs after a 13 min delay. In an embodiment, even higher $NH_3$ pressures may again inhibit growth.

Interestingly, when the ammonia flow to the growth chamber is stopped during a CVD experiment, nucleation occurs within a few seconds on the substrates such as $RuO_2$, $TiO_2$, and $SiO_2$ which exhibit little intrinsic nucleation delay. This result suggests that ammonia inhibition is a reversible process. The mean accommodation residence time of ammonia on $SiO_2$, as estimated from the desorption energy of 0.43 eV, is ~$1.3 \times 10^{-8}$ s at 150° C.; thus, the finding that the surface becomes active for nucleation upon interruption of the ammonia co-flow is consistent with the known ammonia desorption energy.

Figure 7B:
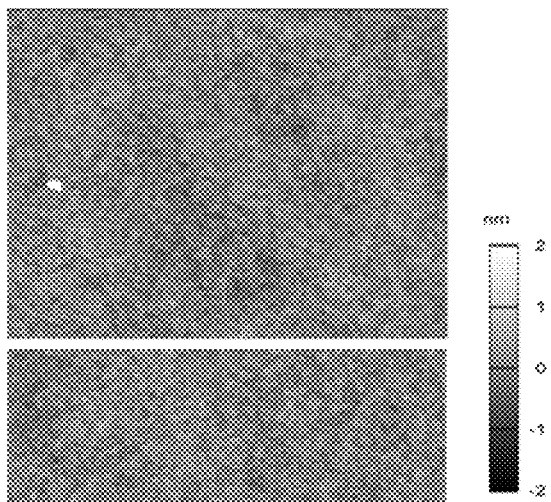
Figure 7C:
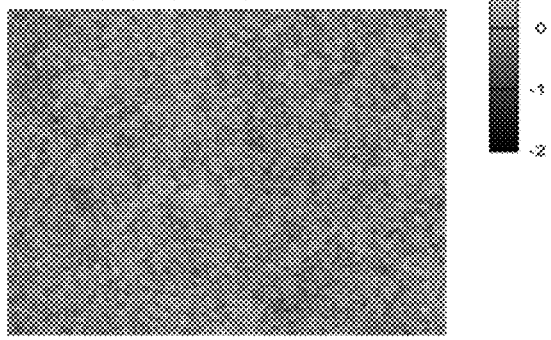

Results: Selective growth of Fe from $Fe(CO)_5$ and of Ru from $Ru_3(CO)_{12}$ in the presence of ammonia: We have briefly investigated whether ammonia can inhibit nucleation and growth on metal oxide surfaces from other metal carbonyl precursors. On thermal $SiO_2$, 0.01 mTorr of $Fe(CO)_5$ alone affords a high coverage of islands >100 nm tall after 9 min at 130-150° C. (FIG. 7A); under the same conditions except with a co-flow of 10-18 mTorr of ammonia, AFM indicates that no nucleation occurs at all at 130 and 150° C. during a 20 minute experiment (FIGS. 7B and 7C). High resolution XPS detects no iron on the substrate.

On MgO substrates, growth from 0.01 mTorr $Fe(CO)_5$ in the absence of ammonia is characterized by a long nucleation delay, over 40 min at 150° C., as evidenced by in-situ ellipsometry and ex-situ high resolution XPS. The longer nucleation delay on MgO vs. $SiO_2$ in the absence of ammonia is consistent with the results reported above for $Mo(CO)_6$.

In contrast, Fe deposits rapidly from $Fe(CO)_5$ on titanium metal and vanadium nitride surfaces, even in the presence of ammonia. For example, a 50 nm thick Fe film grows in 20 minutes on a VN seed layer or on fresh Ti at 130° C. using 0.01 and 10 mTorr of precursor and ammonia, respectively. An Auger depth profile indicates incorporation of 3 at. % nitrogen in the Fe film, along with 2 at. % carbon and 1 at. % oxygen. On a $SiO_2$ substrate onto which Ti has been pattern deposited, Fe growth occurs only on Ti, with no Fe detected on the bare $SiO_2$ regions by AES.

Figures 8A, 8B:
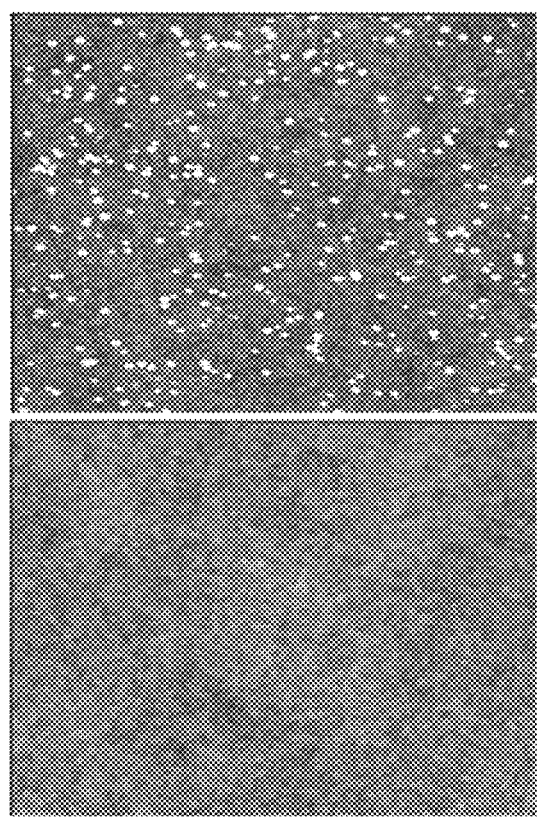
FIGS. 8A-8B. AFM scans of Ru growth using the Ru$_3$(CO)$_{12}$ precursor on SiO$_2$ substrate.

Ru CVD from $Ru_3(CO)_{12}$ behaves in the same manner as $Fe(CO)_5$. At 150° C. in the absence of ammonia, nucleation and growth occur readily on $SiO_2$ (FIG. 8A). A co-flow of 10 mTorr ammonia completely shuts down nucleation (FIG. 8B), whereas Ru nucleation and growth in the presence of ammonia occur easily on the fresh Ti and VN surfaces.

Finally, RBS studies of the $SiO_2$, $TiO_2$, MgO, and $Al_2O_3$ surfaces exposed to $Mo(CO)_6$, $Fe(CO)_5$ and $Ru_3(CO)_{12}$ in the presence of ammonia under the above conditions confirm the absence of detectable amounts of metal. Selected samples were also analyzed by TOF-SIMS to determine how much Mo, Fe, or Ru metal (if any) had been deposited on $SiO_2$ substrates in the presence of ammonia, and in the absence of ammonia. The metal/substrate count ratios in all cases were less than 0.001, confirming the highly effective inhibition process investigated here (details Table 1).

Discussion: Reactivity of metal carbonyls on oxide surfaces: We show that, in some embodiments at relatively low temperatures in the absence of ammonia, CVD from metal carbonyls shows little or no nucleation delay on some oxides (such as $SiO_2$, $TiO_2$, and $RuO_2$) but longer nucleation delays on other oxides (such as MgO and $Al_2O_3$). Our findings are consistent with studies of the formation of metal nanoparticle catalysts on oxide supports from metal carbonyl precursors at similar temperatures[29-31]. Molybdenum and its compounds constitute a well-known group of heterogeneous catalysts for the dehydrogenation and metathesis of alkenes; the chemistry and kinetics of catalyst formation have been studied extensively[30, 32-34]. The reaction of $Mo(CO)_6$ to form molybdenum-containing nanoparticles occurs readily on $SiO_2$ but not on $Al_2O_3$; the difference has been attributed to unspecified differences in the reaction pathway on oxides with acidic vs. basic hydroxyl groups[29, 35].

Oxide surfaces, unless vacuum annealed at high temperature, are always hydroxylated because the —OH termination lowers the surface energy. The character of the —OH groups can, however, be either acidic or basic; a hydroxyl group becomes more acidic with an increase in the covalency (especially the pi bonding) of the bulk metal-oxygen bond[36] or with an increase in the charge/radius ratio of the cation to which the hydroxyl group is bound[37]. The average acidity can be characterized by the isoelectric point (IEP), which is the pH value of an aqueous solution needed to establish zero net charge on the oxide surface. Acidic hydroxyl groups have a negative surface charge in liquid water at neutral pH, so that the pH has to be lowered to obtain a neutral surface charge, and conversely for basic hydroxyls[36, 38, 39]. The oxides $SiO_2$, $RuO_2$, and $TiO_2$ have acidic hydroxyl groups with IEPs of 2.2, 4.2, and 4-6, respectively; MgO and $Al_2O_3$ have basic hydroxyl groups with IEPs of 12 and 8-9, respectively[40]. IEP values decrease slightly with increasing temperature, but in general higher temperatures will not convert basic hydroxyl groups to acidic ones[41].

We find that the reaction of $Mo(CO)_6$ on acidic oxide surfaces in the absence of ammonia leads to rapid nucleation and growth of $MoO_xC_y$ films. Consistent with this finding, $Mo(CO)_6$ dissociatively adsorbs on the (100) face of hydroxylated $TiO_2$ above −50° C.[42] (The latter study reported that no stable sub-carbonyls were detected at this temperature, and that the deposit consisted of molybdenum particles; however, the XPS binding energy is also consistent with the presence of a variety of molybdenum carbide phases, whose presence is far more likely on chemical grounds[43].) In contrast, on basic surfaces, TPD experiments suggest that stable sub-carbonyls are formed which do not further react until much higher temperatures[44]. For example, on $Al_2O_3$, $Mo(CO)_6$ reacts to form film only above 400° C. TPD experiments show that $Mo(CO)_6$ loses CO in two steps, each step involving desorption of three CO molecules per precursor molecule; this result suggests that stable adsorbed $Mo(CO)_3$ species are formed after the first step, which lose the remaining three CO groups only in the second step at 400° C., a higher temperature than those in the present study[35].

On acidic oxides such as $SiO_2$, $Ru_3(CO)_{12}$ reacts with surface OH groups to form the grafted cluster $HRu_3(CO)_{10}$(OSi≡), which decarbonylates completely upon being heated to 200° C.[45, 46]. On strongly basic oxides such as MgO, $Ru_3(CO)_{12}$ reacts with OH groups to form the stable anionic carbonylruthenate species $[HRu_3(CO)_{11}]^-$, which decarbonylates completely only at temperatures above 350° C.[47]. On the mildly basic oxide $La_2O_3$, adsorption of $Ru_3(CO)_{12}$ generates mononuclear (dicarbonyl)ruthenium species, which decarbonylate only above 250° C.[48]. Similar results are reported for $Fe(CO)_5$, which generates the thermally robust anionic cluster $[HFe_3(CO)_{11}]^-$ on basic oxides[49, 50]. .

According to the heterogeneous catalysis literature, the reaction pathway of metal-carbonyl precursors such as $Cr(CO)_6$, $W(CO)_6$, $Co_2(CO)_8$, and $Re_2(CO)_{10}$ depends strongly on the degree of hydroxylation of the oxide surface and on the acid-base character of the oxide[30]. The temperature at which these precursors completely decarbonylate is lower on acidic oxides than on basic oxides.

Discussion: Exemplary embodiments of mechanisms responsible for $NH_3$-induced selectivity: In an embodiment, one way in which added ammonia could prevent nucleation of metal from metal carbonyls is simply by blocking the most reactive surface adsorption sites. Specifically, if the most acidic hydroxyl groups are the points of reaction of the metal carbonyl, then these sites may simply be deactivated by hydrogen bonding with ammonia. The measured adsorption energy of ammonia on hydroxylated $SiO_2$ is ~0.43 eV[51]. In the present experiments, this value is too small to lead to a large steady state ammonia coverage; for example, at 200° C. and a pressure of 3.7 mTorr of ammonia, first order Langmuirian behavior would afford negligible surface coverage. This raises the possibility that the sites involved in nucleation may have larger adsorption energy for ammonia than the average value, and may be only a small fraction of the total number of surface sites. In a study of Ru CVD from $Ru_3(CO)_{12}$ on $SiO_2$[52], the nucleation density (~$10^{11}$ sites/$cm^2$) was three orders of magnitude smaller than the hydroxyl density (~$10^{14}$ sites/$cm^2$) and the temperature dependence of the nucleation density followed the same temperature dependence as the density of isolated OH groups.

In another embodiment, a second and synergistic mechanistic explanation of the effect of ammonia is that it creates conditions that disfavor the complete decarbonylation of metal carbonyl intermediates, thus preventing them from converting to metal nuclei. Ammonia could cause such an outcome in several ways: by reducing the acidity (increasing the basicity) of oxide surfaces by hydrogen bonding to the surface hydroxyl groups, or by bonding directly to the metal centers of subcarbonyl intermediates. All these factors will increase the electron richness of the metal subcarbonyl intermediates and stabilize them against decarbonylation by increasing the M-CO backbonding.

One distinction between these two mechanistic embodiments is that site blocking should prevent precursor from adsorbing to the surface, whereas the stabilization of subcarbonyl intermediates would permit some (i.e., submonolayer) precursor adsorption. Our SIMS studies show that the metal coverages in the presence of ammonia in all cases are less than 0.001, which is certainly consistent with site blocking as the main inhibition mechanism. But it may also be consistent with suppression of decarbonylation, if adsorption of precursor occurs only at a small subset (i.e., the most reactive) surface sites.

Finally, a related issue is why growth occurs on titanium metal and vanadium nitride surfaces. In an embodiment, low energy empty states in the band structure could oxidize the electron-rich metal carbonyl species, thereby promoting loss of CO. Dissociation of carbonyl groups from adsorbed metal carbonyl species could be enhanced by charge transfer: thermally activated decomposition of metal carbonyls happens on Ni(100), but little dissociation has been observed on Si and Ag(110) surfaces[53]. Another embodiment is that, on surfaces that bind CO groups well[54], migration of CO ligands to the metallic surface could destabilize otherwise stable metal carbonyl species, thus initiating nucleation events.

Summary of this Example: Area selective CVD from at least $Mo(CO)_6$, $Fe(CO)_5$, and $Ru_3(CO)_{12}$ precursors is disclosed herein: nucleation and growth on, for example, $SiO_2$, $TiO_2$, $Al_2O_3$, and MgO substrates can be inhibited by the addition of a co-flow of inhibitor gas, such as ammonia. In each of these cases, we find it possible to inhibit growth on these oxide substrates for various periods of time, such as up to an hour, whereas metal film grows on conductive surfaces such as freshly deposited Ti and vanadium nitride (and to some extent on $RuO_2$). In some embodiments, the mechanism(s) of inhibition is(are) either site blocking by $NH_3$ and/or inhibition of the complete reaction (decarbonylation) of adsorbed metal carbonyl intermediate groups. This selective growth method also affords a means to achieve the bottom-up fill of deep structures, such as trenches and vias, when the sidewalls are dielectric and the bottom bears a metal nucleation layer.

Example 6: Area Selective Deposition of Cobalt

In an embodiment, the first region of the substrate comprises a metal oxide or a mixed oxide and the second region of the substrate comprises a metal oxide or a mixed oxide, wherein the composition of the first region is different from the composition of the second region. In an embodiment, a method disclosed herein comprises (i) selecting the precursor gas and/or (ii) selecting the composition of the first region and the composition of the second region to provide for selectively forming the layer on the substrate. In other words, in some embodiments, selective formation of a layer may be obtained on an oxide compared to on a different oxide. Here, demonstrates that selective formation of a layer may be achieved via appropriate selection of a precursor gas and/or selection of the oxide. This example demonstrates, in particular, that contacting some oxide substrates with cobalt carbonyl precursor $Co_2(CO)_8$ in the presence of an inhibitor agent may lead to nucleation and growth of a Co layer on the oxide, while contacting other oxide substrates with precursor $Co_2(CO)_8$ in the presence of an inhibitor agent may lead to significantly delayed or substantially no nucleation or growth of a Co layer on those other oxide substrates.

For this example: the precursor is $Co_2(CO)_8$; the inhibitor is $NH_3$, Hacac, or Trimethylamine (TMA); growth temperature is 70° C.; substrate is $Al_2O_3$, $SiO_2$, $WO_3$, $HfO_2$, $TiO_2$, MgO, vanadium nitride, or copper; oxide substrates are cleaned by an acetone-IPA-DI water-IPA-ozone/UV(10 min) cleaning process; vanadium nitride is grown in the chamber by CVD and never exposed to air; copper substrates are cleaned using the same process as for cleaning oxides followed by diluted $H_2SO_4$ (2 mol/L) etching to remove oxide; and cobalt layer thickness is determined with the aid of an X-ray fluorescence (XRF) technique. Note that "TMA" is not trimethylaluminum. Note that the growth temperature is low compared to deposition conditions with other precursors. Note that vanadium nitride and copper are metallic surfaces.

Figure 9:
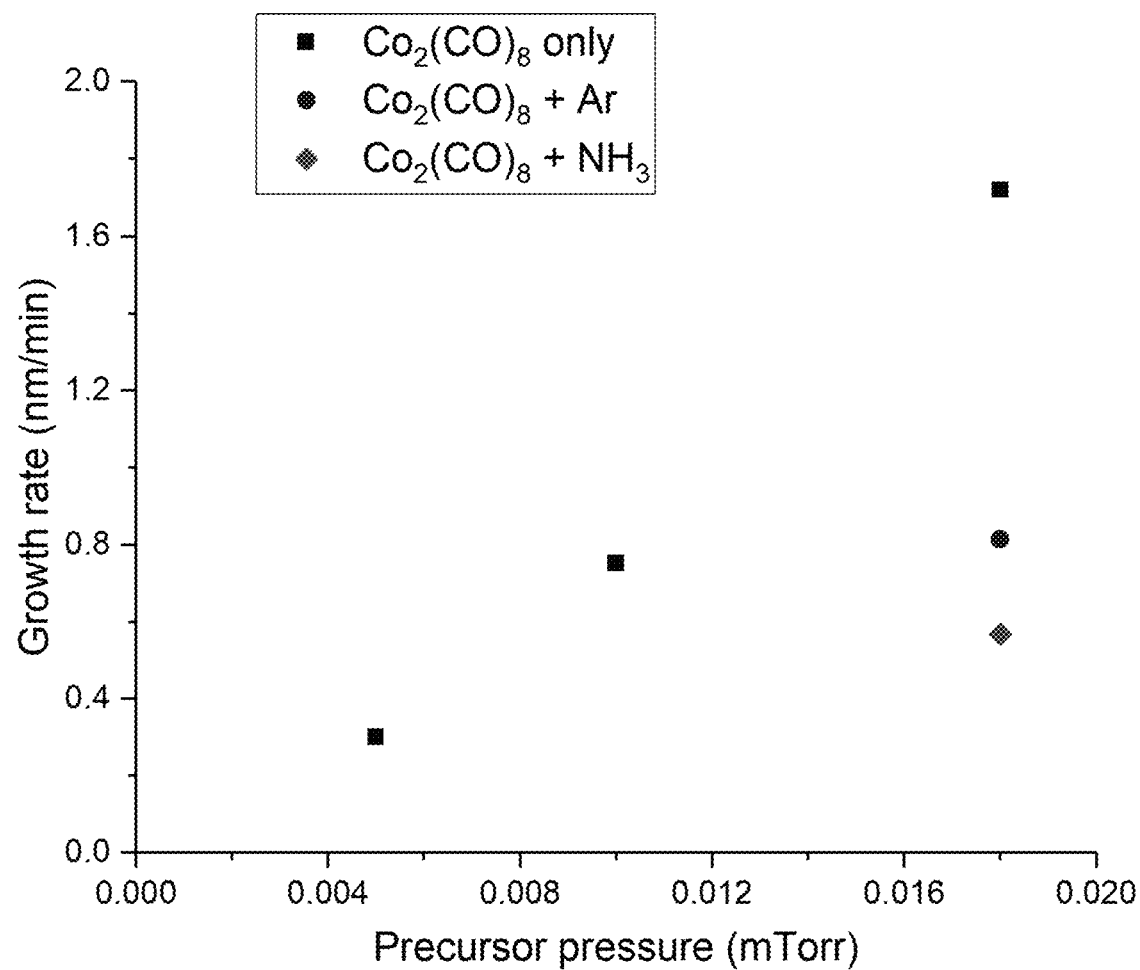
FIG. 9. Plot of growth rate versus precursor pressure corresponding to growth of cobalt (Co) layer on vanadium nitride (VN) surface using different atmospheres. The atmospheres are precursor only, precursor and argon (Ar) gas, or precursor and ammonia (an inhibitor agent) gas.

FIG. 9. Plot of growth rate versus precursor pressure corresponding to growth of cobalt (Co) layer on vanadium nitride (VN) surface using different atmospheres. The atmospheres are precursor only, precursor and argon (Ar) gas, or precursor and ammonia (an inhibitor agent) gas. FIG. 9 demonstrates an effect of precursor pressure and coflow of Ar, $NH_3$ on cobalt growth rate. Ar or $NH_3$ pressure is 3.8 mTorr. Growth rate is calculated by dividing film thickness with growth time. Growth time is 20 to 30 min. The nucleation delay is negligible due to the use of a sub-monolayer of VN on the substrate. A comparison is made with Ar flow in order to observe whether gas scattering effects reduce the flux of precursor to the substrate surface; for many precursors, the nucleation delay (or rate) is strongly pressure-dependent.

Figure 10:
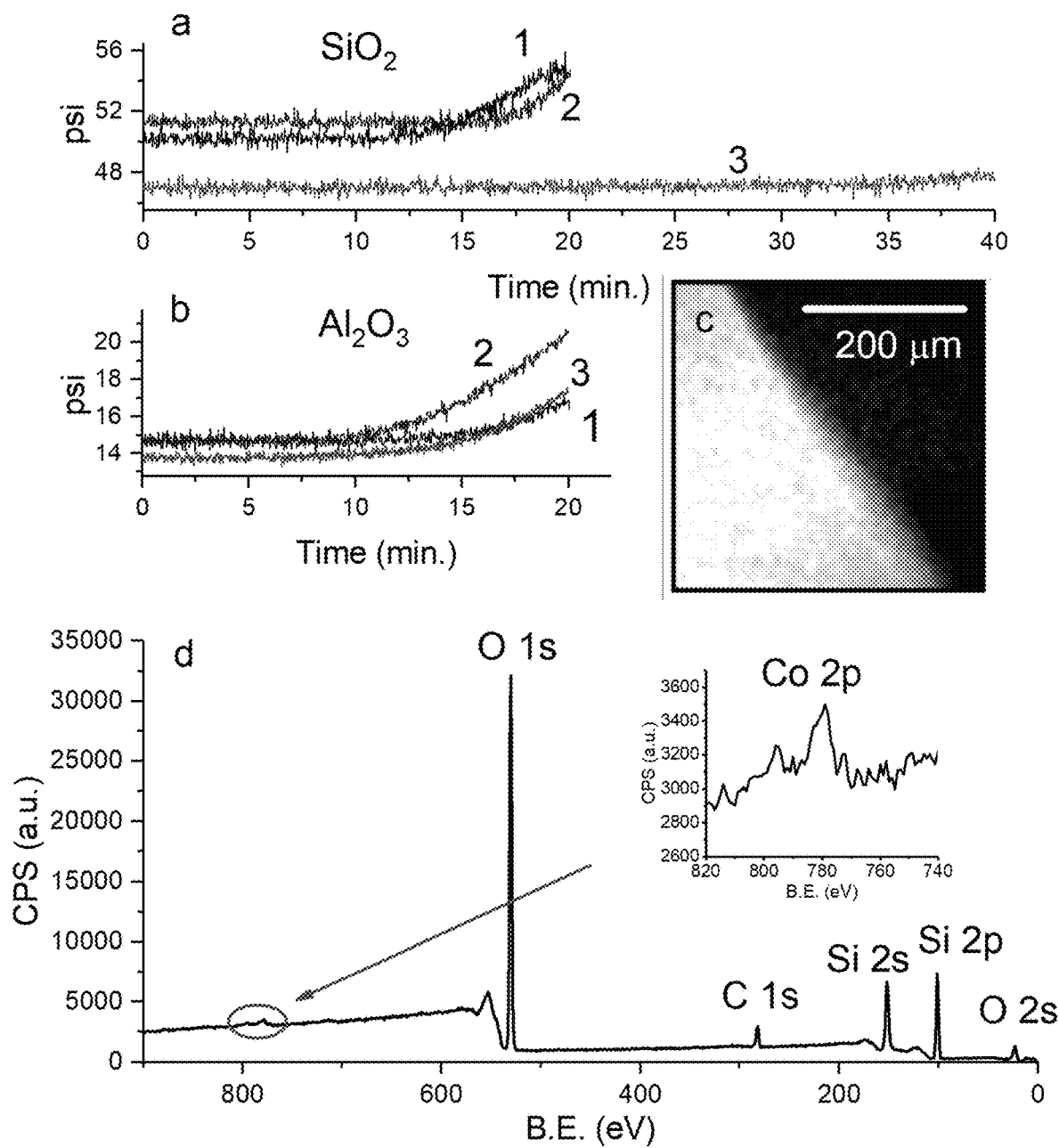
FIG. 10. Panel (a): plot of ellipsometry parameter psi versus experimental time corresponding to real time ellipsometry (at 2.65 eV) measurement of the nucleation and growth of a layer of cobalt on a SiO$_2$ surface. Data set (1) corresponds to 0.010 mTorr of precursor only (result is film thickness: 1.6 nm in 20 min); data set (2) corresponds to 0.018 mTorr of precursor and 3.8 mTorr of Ar (result is film thickness: 0.73 nm in 20 min); data set (3) corresponds to 0.018 mTorr of precursor and 3.8 mTorr of NH$_3$ (result is film thickness: 0.29 nm in 40 min). Note the relatively extended nucleation delay in data set (3) compared to data sets (1) and (2). Panel (b): plot of ellipsometry parameter psi versus experimental time corresponding to real time ellipsometry (at 2.65 eV) measurement of the nucleation and growth of a layer of cobalt on an Al$_2$O$_3$ surface. Data set (1) corresponds to 0.010 mTorr of precursor only (result is film thickness: 2.4 nm in 20 min); data set (2) corresponds to 0.018 mTorr of precursor and 3.8 mTorr of Ar (result is film thickness: 4.6 nm in 20 min); data set (3) corresponds to 0.018 mTorr of precursor and 3.8 mTorr of NH$_3$ (result is film thickness: 3.2 nm in 20 min). Panel (c): X-ray photoelectron spectroscopy (XPS) elemental mapping of cobalt (bright side) on a patterned substrate. Left bottom side of the substrate is Al$_2$O$_3$ and right top side is SiO$_2$. Precursor pressure is 0.018 mTorr and NH$_3$ pressure is 3.8 mTorr, growth time is 30 min. Panel (d): XPS survey on a SiO$_2$ surface (top-right of panel (c)) for the sample in panel (c). Cobalt density is very low—below or substantially at the detection limit (e.g., only slightly above the detection limit)—on SiO$_2$.

FIG. 10. Panel (a): plot of ellipsometry parameter psi versus experimental time corresponding to real time ellipsometry (at 2.65 eV) measurement of the nucleation and growth of a layer of cobalt on a $SiO_2$ surface. The ellipsometry parameter psi is sensitive to an onset of nucleation of the layer [for further detail regarding the interpretation of in-situ ellipsometry data or psi-versus-time data, for example, see also the following publications, which are incorporated herein by reference to the extent not inconsistent herewith: (i) S. Babar, E. Mohimi, B. Trinh, G. S. Girolami, J. R. Abelson, Surface-Selective Chemical Vapor Deposition of Copper Films through the Use of a Molecular Inhibitor, ECS J. Solid State Sci. Technol. 4/7 (2015) N60; (ii) Babar, T. T. Li, J. R. Abelson, Role of nucleation layer morphology in determining the statistical roughness of CVD-grown thin films, Journal of Vacuum Science & Technology A: Vacuum, Surfaces, and Films 32/6 (2014) 060601; and (iii) S. Babar, N. Kumar, P. Zhang, J. R. Abelson, A. C. Dunbar, S. R. Daly, G. S. Girolami, Growth Inhibitor To Homogenize Nucleation and Obtain Smooth $HfB_2$ Thin Films by Chemical Vapor Deposition, Chem. Mat. 25/5 (2013) 662)]. A change in the value of the parameter psi with respect to time may correspond to nucleation of the layer. The amplitude of the change in the value of the parameter psi with respect to time may correspond to the amount of nucleated or deposited material of the layer. Data set (1) corresponds to 0.010 mTorr of precursor only (result is film thickness: 1.6 nm in 20 min); data set (2) corresponds to 0.018 mTorr of precursor and 3.8 mTorr of Ar (result is film thickness: 0.73 nm in 20 min); data set (3) corresponds to 0.018 mTorr of precursor and 3.8 mTorr of $NH_3$ (result is film thickness: 0.29 nm in 40 min). Note the relatively extended nucleation delay in data set (3) compared to data sets (1) and (2). Panel (b): plot of ellipsometry parameter psi versus experimental time corresponding to real time ellipsometry (at 2.65 eV) measurement of the nucleation and growth of a layer of cobalt on an $Al_2O_3$ surface. Data set (1) corresponds to 0.010 mTorr of precursor only (result is film thickness: 2.4 nm in 20 min); data set (2) corresponds to 0.018 mTorr of precursor and 3.8 mTorr of Ar (result is film thickness: 4.6 nm in 20 min); data set (3) corresponds to 0.018 mTorr of precursor and 3.8 mTorr of $NH_3$ (result is film thickness: 3.2 nm in 20 min). Panel (c): X-ray photoelectron spectroscopy (XPS) elemental mapping of cobalt (bright side) on a patterned substrate. Left bottom side of the substrate is $Al_2O_3$ and right top side is $SiO_2$. Precursor pressure is 0.018 mTorr and $NH_3$ pressure is 3.8 mTorr, growth time is 30 min. Panel (d): XPS survey on a $SiO_2$ surface (top-right of panel (c)) for the sample in panel (c). Cobalt density is very low— below or substantially at the detection limit (e.g., only slightly above the detection limit)—on $SiO_2$.

Figure 11:
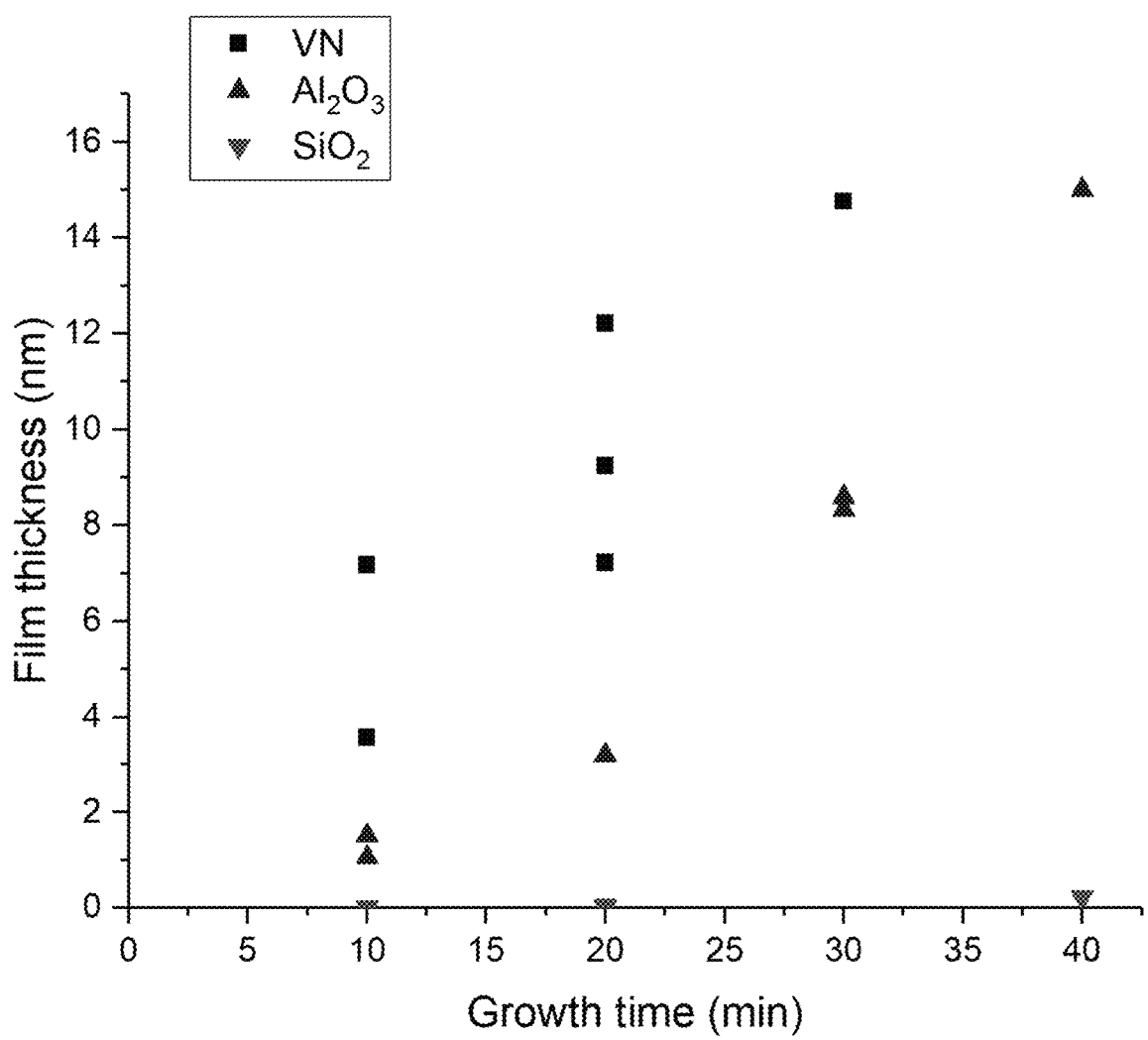
FIG. 11. Plot of Co layer thickness vs. time on VN, Al$_2$O$_3$ or SiO$_2$ surface. Co$_2$(CO)$_8$ precursor pressure is 0.015 mTorr and NH$_3$ pressure is 3.8 mTorr. Co layer selectively forms on VN and Al$_2$O$_3$ compared to SiO$_2$.

FIG. 11. Plot of Co layer thickness vs. time on VN, $Al_2O_3$ or $SiO_2$ surface. $Co_2(CO)_8$ precursor pressure is 0.015 mTorr and $NH_3$ pressure is 3.8 mTorr. Co layer selectively forms on VN and $Al_2O_3$ compared to $SiO_2$.

TABLE 2

Summary of growth of a Co layer on different substrates, and comparison of growth results.

| Growth time | Thickness on $SiO_2$ | Thickness on $Al_2O_3$ | Thickness on VN | Selectivity between $SiO_2$ and $Al_2O_3$ | Selectivity between $SiO_2$ and VN |
|---|---|---|---|---|---|
| 10 min | 0.005 nm | 1.5 nm | 7.17 nm | 99.3% | 99.9% |
| 20 min | 0.027 nm | 3.1(9) nm | 9.24 nm | 98.3% | 99.4% |
| 40 min | 0.223 nm | 15.0(1) nm | | 97.1% | |

Here, selectivity (S) is determined according to the equation, $$S = \frac{n_{GS} - n_{NG}}{n_{GS} + n_{NG}}.$$

Figure 12:
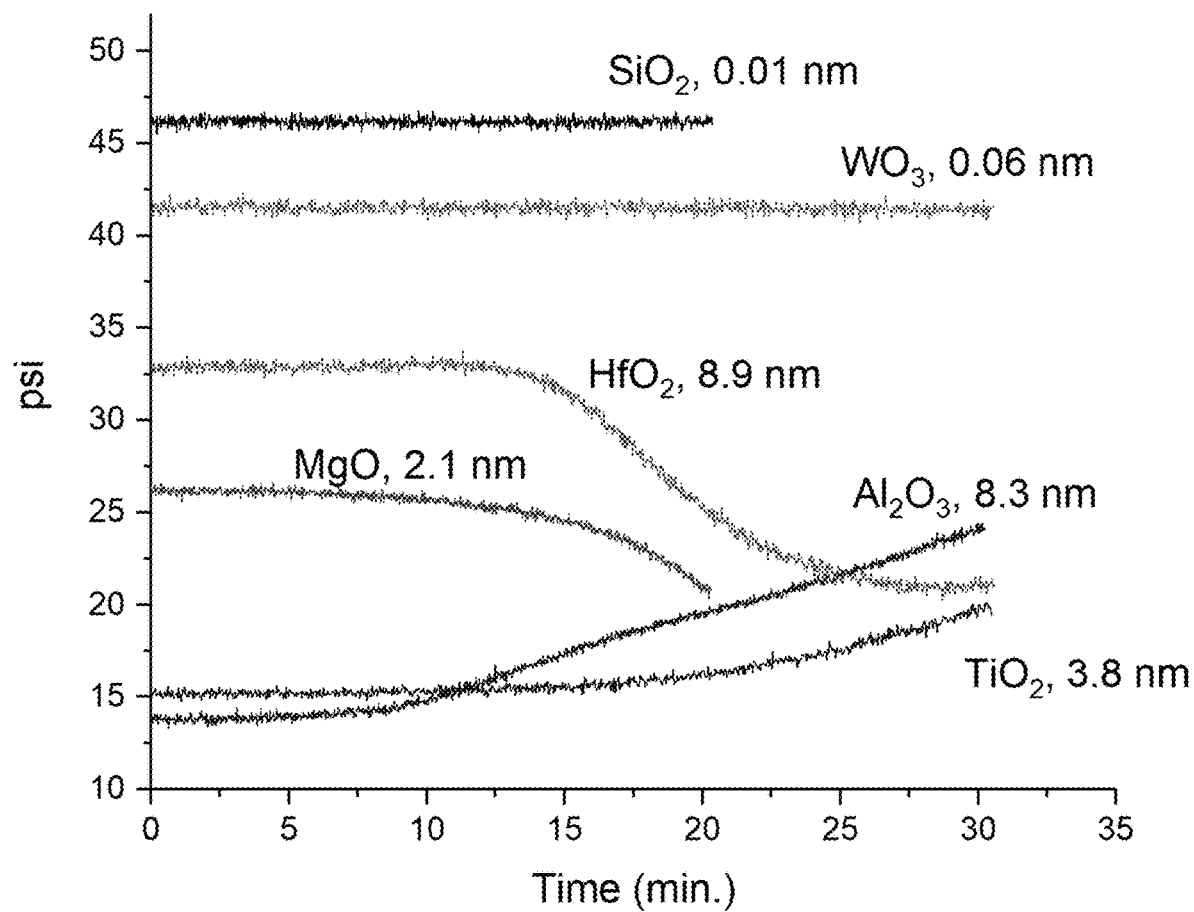
FIG. 12. Ellipsometry curve (psi versus deposition time) of cobalt layer deposition on WO$_3$, SiO$_2$, TiO$_2$, HfO$_2$, Al$_2$O$_3$ or MgO. The value shown above each data set is cobalt layer thicknesses on the respective substrate. Precursor pressure is 0.018 mTorr and NH$_3$ pressure is 3.8 mTorr.

FIG. 12. Ellipsometry curve (psi versus deposition time) of cobalt layer deposition on $WO_3$, $SiO_2$, $TiO_2$, $HfO_2$, $Al_2O_3$ or MgO. The value shown above each data set is cobalt layer thicknesses on the respective substrate. Precursor pressure is 0.018 mTorr and $NH_3$ pressure is 3.8 mTorr. This data demonstrates the nucleation delay on various oxide substrates, or regions thereof, each independently characterized by a different average acidity. In all data sets, the precursor gas was co-flowed with inhibitor agent $NH_3$. The data shows that nucleation of Co from precursor $Co_2(CO)_8$ is fast on more basic oxides, such as $Al_2O_3$ and $HfO_2$; while nucleation is slow on more acidic oxides, such as $SiO_2$ and $WO_3$. Generally, $WO_3$ is more acidic than $SiO_2$, which is more acidic than $TiO_2$, which is more acidic than $HfO_2$, which is more acidic than $Al_2O_3$, which is more acidic than MgO. In an embodiment, the average acidity (IEP) of each of the various oxides is as follows: $WO_3$ (IEP=1.5~2); $SiO_2$ (IEP=2.2); $TiO_2$ (IEP=4~6); $HfO_2$ (IEP=7.5); $Al_2O_3$ (IEP=8~9); MgO (IEP=12).

In some embodiments, a mechanism for selective formation of a layer on one oxide compared to a different oxide comprises one or more of the following features: (i) adsorption of carbonyl precursors on acidic oxides is not as strong as on basic oxides; (ii) adsorption on basic oxides can lead to nucleation; (iii) $NH_3$ adsorption (e.g., on —OH sites) blocks adsorption of precursor; (iv) adsorption of $NH_3$ is better on acidic oxides than basic oxides.

Figure 13A:
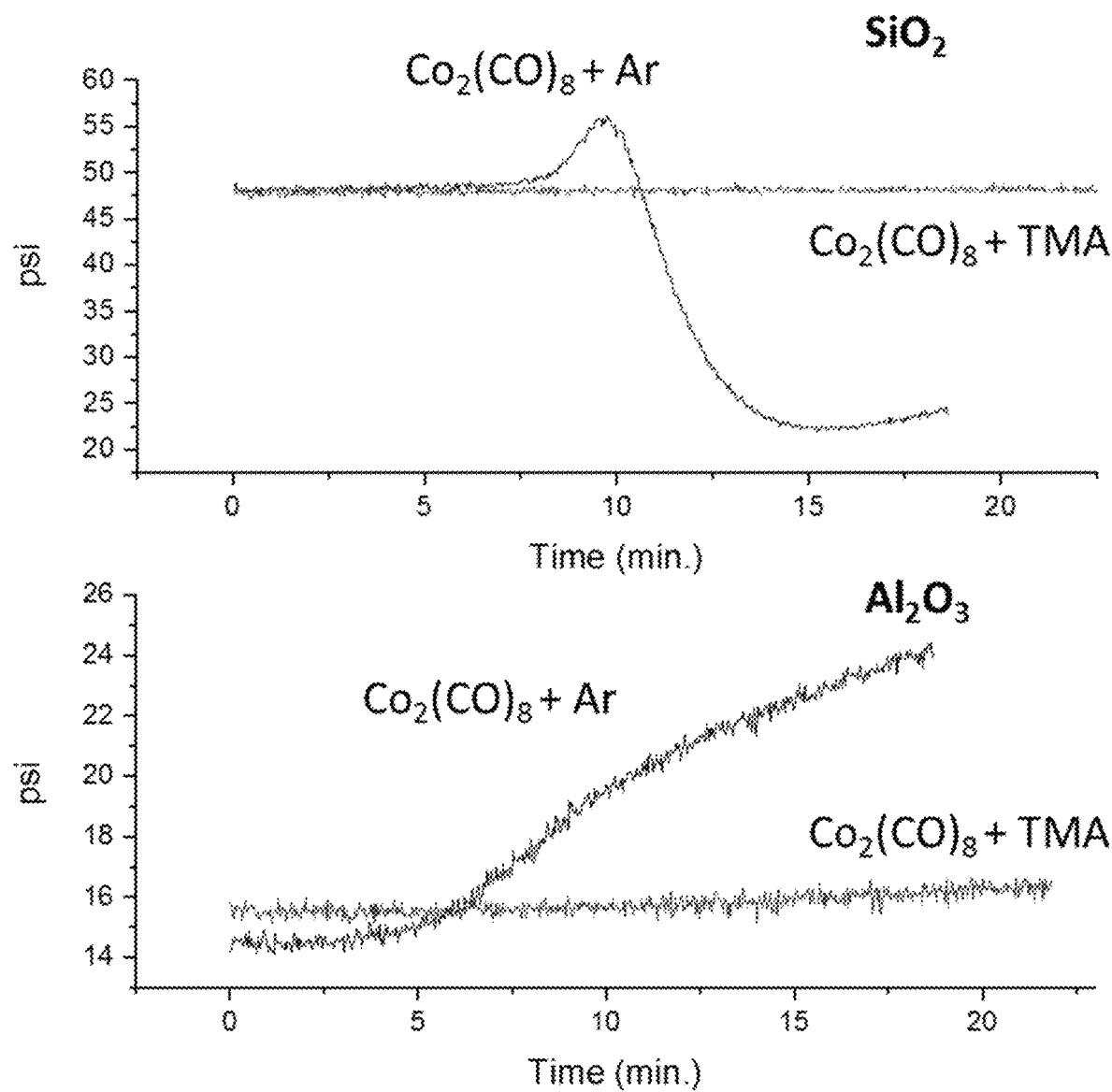
FIGS. 13A-13B. Ellipsometry curve (psi versus deposition time) of cobalt layer deposition on SiO$_2$ (FIG. 13A, top panel, and FIG. 13B, top panel) or Al$_2$O$_3$(FIG. 13A, bottom panel, and FIG. 13B, bottom panel) corresponding to providing precursor (Co$_2$(CO)$_8$) and argon gases compared to providing precursor gas and an inhibitor gas, wherein the inhibitor gas is TMA (FIG. 13A, both panels) or Hacac (FIG. 13B, both panels). For the data in FIG. 13A, the partial pressure of TMA is 2 mTorr, the partial pressure of Ar is 2 mTorr, and the partial pressure of precursor (Co$_2$(CO)$_8$) is 0.018 mTorr. For the data in FIG. 13B, the partial pressure of Hacac is 2 mTorr, the partial pressure of Ar is 2 mTorr, and the partial pressure of precursor (Co$_2$(CO)$_8$) is 0.018 mTorr. Both TMA and Hacac inhibitors slow down nucleation on basic oxide, unlike inhibitor NH$_3$. The inhibition effect on acidic oxide is large.
Figure 13B:
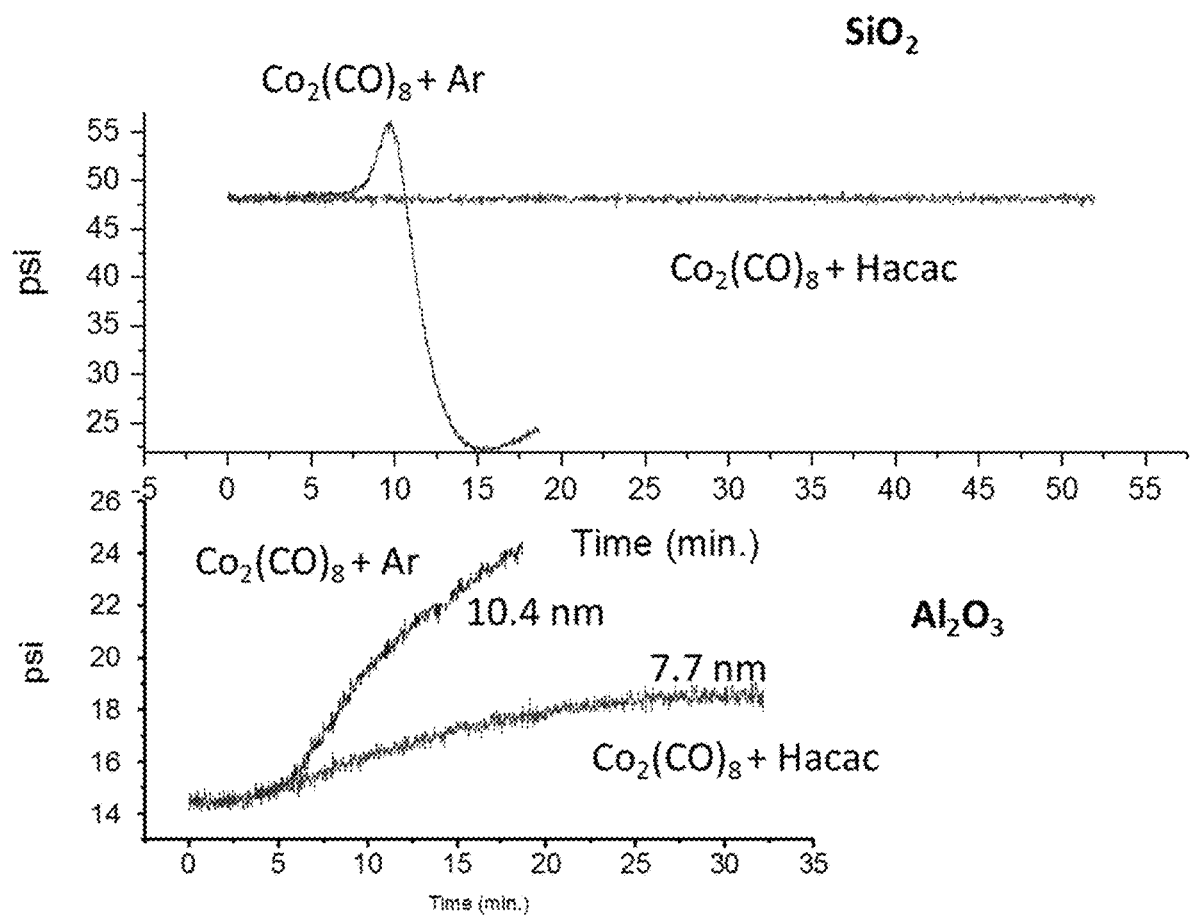

FIGS. 13A-13B. Ellipsometry curve (psi versus deposition time) of cobalt layer deposition on $SiO_2$ (FIG. 13A, top panel, and FIG. 13B, top panel) or $Al_2O_3$ (FIG. 13A, bottom panel, and FIG. 13B, bottom panel) corresponding to providing precursor ($Co_2(CO)_8$) and argon gases compared to providing precursor gas and an inhibitor gas, wherein the inhibitor gas is TMA (FIG. 13A, both panels) or Hacac (FIG. 13B, both panels). For the data in FIG. 13A, the partial pressure of TMA is 2 mTorr, the partial pressure of Ar is 2 mTorr, and the partial pressure of precursor ($Co_2(CO)_8$) is 0.018 mTorr. For the data in FIG. 13B, the partial pressure of Hacac is 2 mTorr, the partial pressure of Ar is 2 mTorr, and the partial pressure of precursor ($Co_2(CO)_8$) is 0.018 mTorr. Both TMA and Hacac inhibitors slow down nucleation on basic oxide, unlike inhibitor $NH_3$. The inhibition effect on acidic oxide is large.

Figure 14:
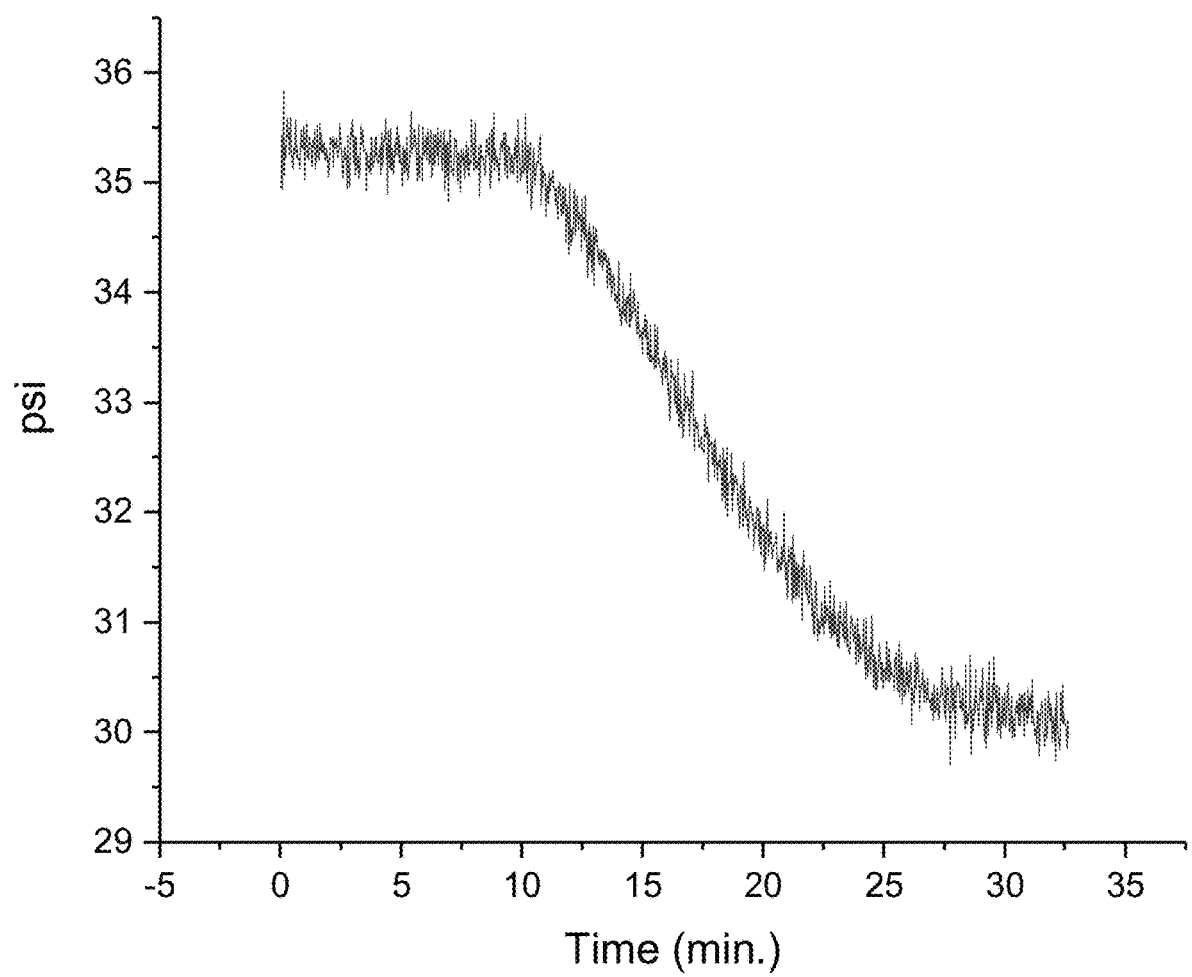
FIG. 14. Ellipsometry curve (psi versus deposition time) of cobalt layer deposition on a metal, such as copper. In an embodiment, deposition of cobalt on metal, such as copper, is not inhibited by exposure of the substrate to inhibitor gas, such as NH$_3$, in the atmosphere. For the data in FIG. 14, the substrate is Cu metal, the partial pressure of NH$_3$ is 3.8 mTorr and the partial pressure of precursor (Co$_2$(CO)$_8$) is 0.018 mTorr.

FIG. 14. Ellipsometry curve (psi versus deposition time) of cobalt layer deposition on a metal, such as copper. In an embodiment, deposition of cobalt on metal, such as copper, is not inhibited by exposure of the substrate to inhibitor gas, such as $NH_3$, in the atmosphere. For the data in FIG. 14, the substrate is Cu metal, the partial pressure of $NH_3$ is 3.8 mTorr and the partial pressure of precursor $(Co_2(CO)_8)$ is 0.018 mTorr.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

Corresponding to Example 1

[1] W. J. Dong, K. N. Zhang, Y. Zhang, T. X. Wei, Y. Sun, X. Chen, N. Dai, Application of three-dimensionally area-selective atomic layer deposition for selectively coating the vertical surfaces of standing nanopillars, Sci Rep 4 (2014) 4.

[2] J. C. Chiou, K. C. Juang, M. C. Chen, The processing windows for selective copper chemical-vapor-deposition from Cu(hexafluoroacetylacetonate)trimethylvinylsilane, Journal of the Electrochemical Society 142/1 (1995) 177.

[3] H. K. Shin, K. M. Chi, M. J. Hampdensmith, T. T. Kodas, J. D. Farr, M. Paffett, Selective low temperature chemical vapor deposition of copper from (hexafluoroacetylacetonato)copper(I)trimethylphosphine, (HFA)CuP(Me)$_3$, Adv. Mater. 3/5 (1991) 246.

[4] Q. Tao, K. Overhage, G. Jursich, C. Takoudis, On the initial growth of atomic layer deposited $TiO_2$ films on silicon and copper surfaces, Thin Solid Films 520/22 (2012) 6752.

[5] N. L. Jeon, P. G. Clem, R. G. Nuzzo, D. A. Payne, Patterning of dielectric oxide thin-layers by microcontact printing of self-assembled monolayers, J. Mater. Res. 10/12 (1995) 2996.

[6] N. L. Jeon, P. Clem, D. Y. Jung, W. B. Lin, G. S. Girolami, D. A. Payne, R. G. Nuzzo, Additive fabrication of integrated ferroelectric thin-film capacitors using self-assembled organic thin-film templates, Adv. Mater. 9/11 (1997) 891.

[7] N. L. Jeon, R. G. Nuzzo, Y. N. Xia, M. Mrksich, G. M. Whitesides, Patterned self-assembled monolayers formed by microcontact printing direct selective metalization by chemical-vapor-deposition on planar and nonplanar substrates, Langmuir 11/8 (1995) 3024.

[8] N. L. Jeon, W. Lin, M. K. Erhardt, G. S. Girolami, R. G. Nuzzo, Selective Chemical Vapor Deposition of Platinum and Palladium Directed by Monolayers Patterned Using Microcontact Printing, Langmuir 13/14 (1997) 3833.

[9] M. J. Hampdensmith, T. T. Kodas, Chemical-vapor-deposition of metals 0.2. Overview of selective cvd of metals, Chem. Vapor Depos. 1/2 (1995) 39.

[10] E. Farm, M. Kemell, E. Santala, M. Ritala, M. Leskela, Selective-Area Atomic Layer Deposition Using Poly(vinyl pyrrolidone) as a Passivation Layer, Journal of the Electrochemical Society 157/1 (2010) K10.

[11] W. L. Gladfelter, Selective metalization by chemical vapor deposition, Chem. Mat. 5/10 (1993) 1372.

[12] W.-H. Kim, F. S. Minaye Hashemi, A. J. M. Mackus, J. Singh, Y. Kim, D. Bobb-Semple, Y. Fan, T. Kaufman-Osborn, L. Godet, S. F. Bent, A Process for Topographically Selective Deposition on 3D Nanostructures by Ion Implantation, ACS Nano 10/4 (2016) 4451.

[13] S. Babar, E. Mohimi, B. Trinh, G. S. Girolami, J. R. Abelson, Surface-Selective Chemical Vapor Deposition of Copper Films through the Use of a Molecular Inhibitor, ECS J. Solid State Sci. Technol. 4/7 (2015) N60.

[14] R. F. Howe, D. E. Davidson, D. A. Whan, Infrared-spectra and catalytic activity of supported molybdenum hexacarbonyl, Journal of the Chemical Society-Faraday Transactions I 68/12 (1972) 2266.

[15] K. P. Reddy, T. L. Brown, Kinetics of Surface Processes for Mo(CO)$_6$ on Partially Dehydroxylated Alumina and Hydroxylated Alumina. Observation of Mo(CO)$_5$ (ads), Journal of the American Chemical Society 117/10 (1995) 2845.

[16] A. Theolier, A. Choplin, L. D'Ornelas, J.-M. Basset, G. Zanderighi, C. Sourisseau, The characterization and thermal stability of a cluster grafted on silica surface, Polyhedron 2/2 (1983) 119.

[17] J. Evans, B. E. Hayden, G. Lu, Adsorption and thermal decomposition of Mo(CO)$_6$ on $TiO_2$(110), J. Chem. Soc.-Faraday Trans. 92/23 (1996) 4733.

[18] S. Jayaraman, Y. Yang, D. Y. Kim, G. S. Girolami, J. R. Abelson, Hafnium diboride thin films by chemical vapor deposition from a single source precursor, Journal of Vacuum Science & Technology A: Vacuum, Surfaces, and Films 23/6 (2005) 1619.

[19] S. Jayaraman, E. J. Klein, Y. Yang, D. Y. Kim, G. S. Girolami, J. R. Abelson, Chromium diboride thin films by low temperature chemical vapor deposition, Journal of Vacuum Science & Technology A: Vacuum, Surfaces, and Films 23/4 (2005) 631.

[20] W. B. Wang, Y. Yang, A. Yanguas-Gil, N. N. Chang, G. S. Girolami, J. R. Abelson, Highly conformal magnesium oxide thin films by low-temperature chemical vapor deposition from Mg(H$_3$BNMe$_2$BH$_3$)$_2$ and water, Applied Physics Letters 102/10 (2013) 101605.

[21] K. A. Gesheva, V. Abrosimova, G. D. Beshkov, CVD CARBONYL THIN-FILMS OF TUNGSTEN AND MOLYBDENUM AND THEIR SILICIDES—A GOOD ALTERNATIVE TO CVD FLUORIDE TUNGSTEN TECHNOLOGY, J. Phys. IV 1/C2 (1991) 865.

[22] F. A. Houle, W. D. Hinsberg, Simulations of Thermal Decomposition and Film Growth from the Group VI Metal Hexacarbonyls, The Journal of Physical Chemistry 99/39 (1995) 14477.

[23] L. H. Kaplan, F. M. Dheurle, DEPOSITION OF MOLYBDENUM AND TUNGSTEN FILMS FROM VAPOR DECOMPOSITION OF CARBONYLS, Journal of the Electrochemical Society 117/5 (1970) 693.

[24] I. M. Watson, J. A. Connor, R. Whyman, Low temperature pyrolysis products of chromium, molybdenum and tungsten hexacarbonyls, Polyhedron 8/13 (1989) 1794.

[25] S. Babar, T. T. Li, J. R. Abelson, Role of nucleation layer morphology in determining the statistical roughness of CVD-grown thin films, Journal of Vacuum Science & Technology A: Vacuum, Surfaces, and Films 32/6 (2014) 060601.

[26] S. Babar, N. Kumar, P. Zhang, J. R. Abelson, A. C. Dunbar, S. R. Daly, G. S. Girolami, Growth Inhibitor To Homogenize Nucleation and Obtain Smooth HfB$_2$ Thin Films by Chemical Vapor Deposition, Chem. Mat. 25/5 (2013) 662.

[27] W. Zheng, T. P. Cotter, P. Kaghazchi, T. Jacob, B. Frank, K. Schlichte, W. Zhang, D. S. Su, F. Schüth, R. Schlögl, Experimental and Theoretical Investigation of Molybdenum Carbide and Nitride as Catalysts for Ammonia Decomposition, Journal of the American Chemical Society 135/9 (2013) 3458.

[28] J. G. Choi, Ammonia decomposition over Mo carbides, J. Ind. Eng. Chem. 10/6 (2004) 967.

[29] S. T. Oyama, Preparation and catalytic properties of transition-metal carbides and nitrides, Catal. Today 15/2 (1992) 179.

[30] L.-H. Liu, D. J. Michalak, T. P. Chopra, S. P. Pujari, W. Cabrera, D. Dick, J.-F. Veyan, R. Hourani, M. D. Halls, H. Zuilhof, Y. J. Chabal, Surface etching, chemical modification and characterization of silicon nitride and silicon oxide-selective functionalization of $Si_3N_4$ and $SiO_2$, Journal of Physics-Condensed Matter 28/9 (2016).

[31] J. C. Lavalley, Infrared spectrometric studies of the surface basicity of metal oxides and zeolites using adsorbed probe molecules, Catal. Today 27/3 (1996) 377.

[32] M. I. Zaki, M. A. Hasan, F. A. Al-Sagheer, L. Pasupulety, In situ FTIR spectra of pyridine adsorbed on $SiO_2$—$Al_2O_3$, $TiO_2$, $ZrO_2$ and $CeO_2$: general considerations for the identification of acid sites on surfaces of finely divided metal oxides, Colloids and Surfaces A: Physicochemical and Engineering Aspects 190/3 (2001) 261.

[33] E. P. Parry, An infrared study of pyridine adsorbed on acidic solids. Characterization of surface acidity, Journal of Catalysis 2/5 (1963) 371.

[34] P. Serp, P. Kalck, R. Feurer, Chemical Vapor Deposition Methods for the Controlled Preparation of Supported Catalytic Materials, Chemical Reviews 102/9 (2002) 3085.

[35] A. Zecchina, C. O. Arean, Structure and reactivity of surface species obtained by interaction of organometallic compounds with oxidic surfaces—IR studies, Catalysis Reviews-Science and Engineering 35/2 (1993) 261.

[36] A. Brenner, Highly active molybdenum catalyst for alkene hydrogenation, Journal of Molecular Catalysis 5/2 (1979) 157.

[37] Y. T. Liu, J. Ding, J. Q. Sun, J. Zhang, J. C. Bi, K. F. Liu, F. H. Kong, H. C. Xiao, Y. P. Sun, J. G. Chen, Molybdenum carbide as an efficient catalyst for low-temperature hydrogenation of dimethyl oxalate, Chem. Commun. 52/28 (2016) 5030.

[38] Y. F. Ma, G. Q. Guan, X. G. Hao, J. Cao, A. Abudula, Molybdenum carbide as alternative catalyst for hydrogen production—A review, Renew. Sust. Energ. Rev. 75 (2017) 1101.

[39] J. A. Lercher, C. Gründling, G. Eder-Mirth, Infrared studies of the surface acidity of oxides and zeolites using adsorbed probe molecules, Catal. Today 27/3 (1996) 353.

[40] G. A. Parks, The Isoelectric Points of Solid Oxides, Solid Hydroxides, and Aqueous Hydroxo Complex Systems, Chemical Reviews 65/2 (1965) 177.

[41] M. G. Barthés-Labrousse, Acid-base characterisation of flat oxide-covered metal surfaces, Vacuum 67/3 (2002) 385.

[42] J. Portier, P. Poizot, G. Campet, M. A. Subramanian, J. M. Tarascon, Acid-base behavior of oxides and their electronic structure, Solid State Sciences 5/5 (2003) 695.

[43] M. Kosmulski, Isoelectric points and points of zero charge of metal (hydr)oxides: 50 years after Parks' review, Advances in Colloid and Interface Science 238 (2016) 1.

[44] M. L. Machesky, Chemical Modeling of Aqueous Systems II, vol. 416, American Chemical Society, 1990, p. 282.

[45] H. H. Kung, Formation of new acid sites in dilute oxide solid solutions: A predictive model, Journal of Solid State Chemistry 52/2 (1984) 191.

[46] H. J. M. Bosman, A. P. Pijpers, A. W. M. A. Jaspers, An X-Ray Photoelectron Spectroscopy Study of the Acidity of $SiO_2$—$ZrO_2$ Mixed Oxides, Journal of Catalysis 161/2 (1996) 551.

[47] N. Cardona-Martinez, J. A. Dumesic, Acid strength of silica-alumina and silica studied by microcalorimetric measurements of pyridine adsorption, Journal of Catalysis 125/2 (1990) 427.

[48] A. Auroux, R. Monaci, E. Rombi, V. Solinas, A. Sorrentino, E. Santacesaria, Acid sites investigation of simple and mixed oxides by TPD and microcalorimetric techniques, Thermochimica Acta 379/1 (2001) 227.

[49] H. G. Ang, K. S. Chan, G. K. Chuah, S. Jaenicke, S. K. Neo, Thermal-reactions of $MO(CO)_6$ on metal-oxide surfaces, Journal of the Chemical Society-Dalton Transactions/23 (1995) 3753.

[50] G. M. Zanderighi, C. Dossi, R. Ugo, R. Psaro, A. Theolier, A. Choplin, L. D'Ornelas, J. M. Basset, Surface supported metal cluster carbonyls. Chemisorption, reactivity, and decomposition of $Ru_3(CO)_{12}$ on silica, Journal of Organometallic Chemistry 296/1 (1985) 127.

[51] K. Asakura, K.-K. Bando, Y. Iwasawa, Structure and behaviour of $Ru_3(CO)_{12}$ supported on inorganic oxide surfaces, studied by EXAFS, infrared spectroscopy and temperature-programmed decomposition, Journal of the Chemical Society, Faraday Transactions 86/14 (1990) 2645.

[52] D. K. Chakrabarty, A. Joshi, S. Unnikrishnan, P. D. Prabhawalkar, Preparation of a $Ru/Al_2O_3$ catalyst from $Ru_3(CO)_{12}$ infrared and XPS study, Reaction Kinetics and Catalysis Letters 26/1 (1984) 143.

[53] F. Hugues, J. M. Bassett, Y. B. Taarit, A. Choplin, M. Primet, D. Rojas, A. K. Smith, Surface organometallic chemistry: formation of $HFe_3(CO)_{11}^+$ from $Fe_3(CO)_{12}$ and $Fe(CO)_5$ on silica, alumina, magnesia, and zinc oxide, Journal of the American Chemical Society 104/25 (1982) 7020.

[54] F. Hugues, A. K. Smith, Y. B. Taarit, J. M. Basset, D. Commereuc, Y. Chauvin, Surface-supported metal carbonyl clusters: formation of $[HFe_3(CO)_{11}]^-$ by interaction of $Fe_3(CO)_{12}$ and $Fe(CO)_5$ with alumina and magnesia, Journal of the Chemical Society, Chemical Communications/2 (1980) 68.

[55] A. A. Tsyganenko, D. V. Pozdnyakov, V. N. Filimonov, Infrared study of surface species arising from ammonia adsorption on oxide surfaces, Journal of Molecular Structure 29/2 (1975) 299.

[56] G. Guiu, P. Grange, Acidic and Catalytic Properties of $SiO_2$—$Ta_2O_5$ Mixed Oxides Prepared by the Sol-Gel Method, Journal of Catalysis 156/1 (1995) 132.

[57] V. Bolis, in: A. Auroux (Ed.), calorimetry and Thermal Methods in Catalysis, Springer Berlin Heidelberg, Berlin, Heidelberg, 2013, p. 3.

[58] A. Auroux, A. Gervasini, Microcalorimetric study of the acidity and basicity of metal oxide surfaces, The Journal of Physical Chemistry 94/16 (1990) 6371.

[59] H. Metiu, S. Chrétien, Z. Hu, B. Li, X. Sun, Chemistry of Lewis Acid-Base Pairs on Oxide Surfaces, The Journal of Physical Chemistry C 116/19 (2012) 10439.

[60] C. Sun, J. C. Berg, A review of the different techniques for solid surface acid-base characterization, Advances in Colloid and Interface Science 105/1 (2003) 151.

[61] M. Argyle, C. Bartholomew, Heterogeneous Catalyst Deactivation and Regeneration: A Review, Catalysts 5/1 (2015) 145.

[62] A. E. Hirschler, The effect of ammonia adsorption on the acidity of silica-alumina and alumina catalysts, Journal of Catalysis 6/1 (1966) 1.

[63] M. Koichi, I. Masanori, I. Toshiaki, T. Jun-ichiro, Y. Yukio, Nature of Catalytically Active Sites over Solid Acids. I. Selective Poisoning of Lewis Acid Sites on Silica-Alumina with Pyridine and Its Application to Olefin Polymerization, Bulletin of the Chemical Society of Japan 49/7 (1976) 1788.

[64] J. W. Klaus, S. M. George, $SiO_2$ chemical vapor deposition at room temperature using $SiCl_4$ and $H_2O$ with an $NH_3$ catalyst, Journal of the Electrochemical Society 147/7 (2000) 2658.

[65] W. Liao, J. G. Ekerdt, Precursor dependent nucleation and growth of ruthenium films during chemical vapor deposition, J. Vac. Sci. Technol. A 34/4 (2016) 7.

[66] L. T. Zhuravlev, The surface chemistry of amorphous silica. Zhuravlev model, Colloids and Surfaces A: Physicochemical and Engineering Aspects 173/1 (2000) 1.

[67] B. Fubini, V. Bolis, A. Cavenago, E. Garrone, P. Ugliengo, Structural and induced heterogeneity at the surface of some silica polymorphs from the enthalpy of adsorption of various molecules, Langmuir 9/10 (1993) 2712.

[68] G. A. Blomfield, L. H. Little, Adsorption of ammonia on oxide surfaces, Journal of Catalysis 21/2 (1971) 149.

[69] M. L. Hair, W. Hertl, Adsorption on hydroxylated silica surfaces, The Journal of Physical Chemistry 73/12 (1969) 4269.

[70] M. Xu, F. Zaera, Mechanistic studies of the thermal decomposition of metal carbonyls on Ni(100) surfaces in connection with chemical vapor deposition processes, Journal of Vacuum Science & Technology A: Vacuum, Surfaces, and Films 14/2 (1996) 415.

[71] S. S. Sung, R. Hoffmann, How carbon monoxide bonds to metal surfaces, Journal of the American Chemical Society 107/3 (1985) 578.

Corresponding to Example 2

[1] W. J. Dong, K. N. Zhang, Y. Zhang, T. X. Wei, Y. Sun, X. Chen, N. Dai, Application of three-dimensionally area-selective atomic layer deposition for selectively coating the vertical surfaces of standing nanopillars, Sci Rep 4 (2014) 4.

[2] J. C. Chiou, K. C. Juang, M. C. Chen, The processing windows for selective copper chemical-vapor-deposition from Cu(hexafluoroacetylacetonate)trimethylvinylsilane, Journal of the Electrochemical Society 142/1 (1995) 177.

[3] H. K. Shin, K. M. Chi, M. J. Hampdensmith, T. T. Kodas, J. D. Farr, M. Paffett, Selective low temperature chemical vapor deposition of copper from (hexafluoroacetylacetonato)-copper(I)trimethylphosphine, $(HFA)CuP(Me)_3$, Adv. Mater. 3/5 (1991) 246.

[4] Q. Tao, K. Overhage, G. Jursich, C. Takoudis, On the initial growth of atomic layer deposited $TiO_2$ films on silicon and copper surfaces, Thin Solid Films 520/22 (2012) 6752.

[5] F. S. Minaye Hashemi, B. R. Birchansky, S. F. Bent, Selective deposition of dielectrics: limits and advantages of Alkanethiol blocking agents on metal-dielectric patterns, ACS applied materials & interfaces 8/48 (2016) 33264.

[6] E. Farm, M. Kemell, E. Santala, M. Ritala, M. Leskela, Selective-Area Atomic Layer Deposition Using Poly(vinyl pyrrolidone) as a Passivation Layer, Journal of the Electrochemical Society 157/1 (2010) K10.

[7] M. J. Hampdensmith, T. T. Kodas, Chemical-vapor-deposition of metals 0.2. Overview of selective cvd of metals, Chem. Vapor Depos. 1/2 (1995) 39.

[8] W. L. Gladfelter, Selective metalization by chemical vapor deposition, Chem. Mat. 5/10 (1993) 1372.

[9] W.-H. Kim, F. S. Minaye Hashemi, A. J. M. Mackus, J. Singh, Y. Kim, D. Bobb-Semple, Y. Fan, T. Kaufman-Osborn, L. Godet, S. F. Bent, A Process for Topographically Selective Deposition on 3D Nanostructures by Ion Implantation, ACS Nano 10/4 (2016) 4451.

[10] S. Babar, E. Mohimi, B. Trinh, G. S. Girolami, J. R. Abelson, Surface-Selective Chemical Vapor Deposition of Copper Films through the Use of a Molecular Inhibitor, ECS J. Solid State Sci. Technol. 4/7 (2015) N60.

[11] S. Jayaraman, Y. Yang, D. Y. Kim, G. S. Girolami, J. R. Abelson, Hafnium diboride thin films by chemical vapor deposition from a single source precursor, Journal of Vacuum Science & Technology A: Vacuum, Surfaces, and Films 23/6 (2005) 1619.

[12] S. Jayaraman, E. J. Klein, Y. Yang, D. Y. Kim, G. S. Girolami, J. R. Abelson, Chromium diboride thin films by low temperature chemical vapor deposition, Journal of Vacuum Science & Technology A: Vacuum, Surfaces, and Films 23/4 (2005) 631.

[13] S. Babar, T. T. Li, J. R. Abelson, Role of nucleation layer morphology in determining the statistical roughness of CVD-grown thin films, Journal of Vacuum Science & Technology A: Vacuum, Surfaces, and Films 32/6 (2014) 060601.

[14] S. Babar, N. Kumar, P. Zhang, J. R. Abelson, A. C. Dunbar, S. R. Daly, G. S. Girolami, Growth Inhibitor To Homogenize Nucleation and Obtain Smooth $HfB_2$ Thin Films by Chemical Vapor Deposition, Chem. Mat. 25/5 (2013) 662.

[15] W. Zheng, T. P. Cotter, P. Kaghazchi, T. Jacob, B. Frank, K. Schlichte, W. Zhang, D. S. Su, F. Schüth, R. Schlögl, Experimental and Theoretical Investigation of Molybdenum Carbide and Nitride as Catalysts for Ammonia Decomposition, Journal of the American Chemical Society 135/9 (2013) 3458.

[16] J. G. Choi, Ammonia decomposition over Mo carbides, J. Ind. Eng. Chem. 10/6 (2004) 967.

[17] S. T. Oyama, Preparation and catalytic properties of transition-metal carbides and nitrides, Catal. Today 15/2 (1992) 179.

[18] J. W. Elam, M. Schuisky, J. D. Ferguson, S. M. George, Surface chemistry and film growth during TiN atomic layer deposition using TDMAT and $NH_3$, Thin Solid Films 436/2 (2003) 145.

[19] R. M. Fix, R. G. Gordon, D. M. Hoffman, Solution-phase reactivity as a guide to the low-temperature chemical vapor deposition of early-transition-metal nitride thin films, Journal of the American Chemical Society 112/21 (1990) 7833.

[20] K. P. Reddy, T. L. Brown, Kinetics of Surface Processes for $Mo(CO)_6$ on Partially Dehydroxylated Alumina and Hydroxylated Alumina. Observation of $Mo(CO)_5$ (ads), Journal of the American Chemical Society 117/10 (1995) 2845.

[21] P. Serp, P. Kalck, R. Feurer, Chemical Vapor Deposition Methods for the Controlled Preparation of Supported Catalytic Materials, Chemical Reviews 102/9 (2002) 3085.

[22] A. Zecchina, C. O. Arean, Structure and reactivity of surface species obtained by interaction of organometallic compounds with oxidic surfaces—IR studies, Catalysis Reviews-Science and Engineering 35/2 (1993) 261.

[23] A. Brenner, Highly active molybdenum catalyst for alkene hydrogenation, Journal of Molecular Catalysis 5/2 (1979) 157.

[24] Y. T. Liu, J. Ding, J. Q. Sun, J. Zhang, J. C. Bi, K. F. Liu, F. H. Kong, H. C. Xiao, Y. P. Sun, J. G. Chen, Molybdenum carbide as an efficient catalyst for low-temperature hydrogenation of dimethyl oxalate, Chem. Commun. 52/28 (2016) 5030.

[25] Y. F. Ma, G. Q. Guan, X. G. Hao, J. Cao, A. Abudula, Molybdenum carbide as alternative catalyst for hydrogen production—A review, Renew. Sust. Energ. Rev. 75 (2017) 1101.

[26] R. F. Howe, D. E. Davidson, D. A. Whan, Infrared-spectra and catalytic activity of supported molybdenum hexacarbonyl, Journal of the Chemical Society-Faraday Transactions I 68/12 (1972) 2266.

[27] M. G. Barthés-Labrousse, Acid-base characterisation of flat oxide-covered metal surfaces, Vacuum 67/3 (2002) 385.

[28] J. A. Lercher, C. Gründling, G. Eder-Mirth, Infrared studies of the surface acidity of oxides and zeolites using adsorbed probe molecules, Catal. Today 27/3 (1996) 353.

[29] J. Portier, P. Poizot, G. Campet, M. A. Subramanian, J. M. Tarascon, Acid-base behavior of oxides and their electronic structure, Solid State Sciences 5/5 (2003) 695.

[30] M. Kosmulski, Isoelectric points and points of zero charge of metal (hydr)oxides: 50 years after Parks' review, Advances in Colloid and Interface Science 238 (2016) 1.

[31] M. L. Machesky, Chemical Modeling of Aqueous Systems II, vol. 416, American Chemical Society, 1990, p. 282.

[32] H. H. Kung, Formation of new acid sites in dilute oxide solid solutions: A predictive model, Journal of Solid State Chemistry 52/2 (1984) 191.

[33] H. J. M. Bosman, A. P. Pijpers, A. W. M. A. Jaspers, An X-Ray Photoelectron Spectroscopy Study of the Acidity of $SiO_2$—$ZrO_2$ Mixed Oxides, Journal of Catalysis 161/2 (1996) 551.

[34] N. Cardona-Martinez, J. A. Dumesic, Acid strength of silica-alumina and silica studied by microcalorimetric measurements of pyridine adsorption, Journal of Catalysis 125/2 (1990) 427.

[35] A. Auroux, R. Monaci, E. Rombi, V. Solinas, A. Sorrentino, E. Santacesaria, Acid sites investigation of simple and mixed oxides by TPD and microcalorimetric techniques, Thermochimica Acta 379/1 (2001) 227.

[36] J. Evans, B. E. Hayden, G. Lu, Adsorption and thermal decomposition of $Mo(CO)_6$ on $TiO_2(110)$, J. Chem. Soc.-Faraday Trans. 92/23 (1996) 4733.

[37] H. G. Ang, K. S. Chan, G. K. Chuah, S. Jaenicke, S. K. Neo, Thermal-reactions of $MO(CO)_6$ on metal-oxide surfaces, Journal of the Chemical Society-Dalton Transactions/23 (1995) 3753.

[38] A. Theolier, A. Choplin, L. D'Ornelas, J.-M. Basset, G. Zanderighi, C. Sourisseau, The characterization and thermal stability of a cluster grafted on silica surface, Polyhedron 2/2 (1983) 119.

[39] G. M. Zanderighi, C. Dossi, R. Ugo, R. Psaro, A. Theolier, A. Choplin, L. D'Ornelas, J. M. Basset, Surface supported metal cluster carbonyls. Chemisorption, reactivity, and decomposition of $Ru_3(CO)_{12}$ on silica, Journal of Organometallic Chemistry 296/1 (1985) 127.

[40] K. Asakura, K.-K. Bando, Y. Iwasawa, Structure and behaviour of $Ru_3(CO)_{12}$ supported on inorganic oxide surfaces, studied by EXAFS, infrared spectroscopy and temperature-programmed decomposition, Journal of the Chemical Society, Faraday Transactions 86/14 (1990) 2645.

[41] D. K. Chakrabarty, A. Joshi, S. Unnikrishnan, P. D. Prabhawalkar, Preparation of a $Ru/Al_2O_3$ catalyst from $Ru_3(CO)_{12}$ infrared and XPS study, Reaction Kinetics and Catalysis Letters 26/1 (1984) 143.

[42] F. Hugues, J. M. Bassett, Y. B. Taarit, A. Choplin, M. Primet, D. Rojas, A. K. Smith, Surface organometallic chemistry: formation of $HFe_3(CO)_{11}$— from $Fe_3(CO)_{12}$ and $Fe(CO)_5$ on silica, alumina, magnesia, and zinc oxide, Journal of the American Chemical Society 104/25 (1982) 7020.

[43] F. Hugues, A. K. Smith, Y. B. Taarit, J. M. Basset, D. Commereuc, Y. Chauvin, Surface-supported metal carbonyl clusters: formation of $[HFe_3(CO)_{11}]$— by interaction of $Fe_3(CO)_{12}$ and $Fe(CO)_5$ with alumina and magnesia, Journal of the Chemical Society, Chemical Communications/2 (1980) 68.

[44] A. A. Tsyganenko, D. V. Pozdnyakov, V. N. Filimonov, Infrared study of surface species arising from ammonia adsorption on oxide surfaces, Journal of Molecular Structure 29/2 (1975) 299.

[45] J. C. Lavalley, Infrared spectrometric studies of the surface basicity of metal oxides and zeolites using adsorbed probe molecules, Catal. Today 27/3 (1996) 377.

[46] G. Guiu, P. Grange, Acidic and Catalytic Properties of $SiO_2$—$Ta_2O_5$ Mixed Oxides Prepared by the Sol-Gel Method, Journal of Catalysis 156/1 (1995) 132.

[47] V. Bolis, in: A. Auroux (Ed.), calorimetry and Thermal Methods in Catalysis, Springer Berlin Heidelberg, Berlin, Heidelberg, 2013, p. 3.

[48] A. Auroux, A. Gervasini, Microcalorimetric study of the acidity and basicity of metal oxide surfaces, The Journal of Physical Chemistry 94/16 (1990) 6371.

[49] D. R. Lide, CRC Handbook of Chemistry and Physics; CRC Press, Boca Raton, Fla, 2003.

[50] M. Argyle, C. Bartholomew, Heterogeneous Catalyst Deactivation and Regeneration: A Review, Catalysts 5/1 (2015) 145.

[51] A. E. Hirschler, The effect of ammonia adsorption on the acidity of silica-alumina and alumina catalysts, Journal of Catalysis 6/1 (1966) 1.

[52] M. Koichi, I. Masanori, I. Toshiaki, T. Jun-ichiro, Y. Yukio, Nature of Catalytically Active Sites over Solid Acids. I. Selective Poisoning of Lewis Acid Sites on Silica-Alumina with Pyridine and Its Application to Olefin Polymerization, Bulletin of the Chemical Society of Japan 49/7 (1976) 1788.

[53] J. W. Klaus, S. M. George, $SiO_2$ chemical vapor deposition at room temperature using $SiCl_4$ and $H_2O$ with an $NH_3$ catalyst, Journal of the Electrochemical Society 147/7 (2000) 2658.

[54] W. Liao, J. G. Ekerdt, Precursor dependent nucleation and growth of ruthenium films during chemical vapor deposition, J. Vac. Sci. Technol. A 34/4 (2016) 7.

[55] B. Fubini, V. Bolis, A. Cavenago, E. Garrone, P. Ugliengo, Structural and induced heterogeneity at the surface of some silica polymorphs from the enthalpy of adsorption of various molecules, Langmuir 9/10 (1993) 2712.

[56] G. A. Blomfield, L. H. Little, Adsorption of ammonia on oxide surfaces, Journal of Catalysis 21/2 (1971) 149.

[57] M. L. Hair, W. Hertl, Adsorption on hydroxylated silica surfaces, The Journal of Physical Chemistry 73/12 (1969) 4269.

[58] H. H. Huang, C. S. Sreekanth, C. S. Seet, X. Jiang, G. Q. Xu, Thermal and photoinduced chemistry of $Mo(CO)_6$ on clean and chemically modified Ru(001), Surface Science 365/3 (1996) 769.

[59] L.-H. Liu, D. J. Michalak, T. P. Chopra, S. P. Pujari, W. Cabrera, D. Dick, J.-F. Veyan, R. Hourani, M. D. Halls, H.

Zuilhof, Y. J. Chabal, Surface etching, chemical modification and characterization of silicon nitride and silicon oxide-selective functionalization of $Si_3N_4$ and $SiO_2$, Journal of Physics-Condensed Matter 28/9 (2016).

Corresponding to Example 3

[42] L.-H. Liu, D. J. Michalak, T. P. Chopra, S. P. Pujari, W. Cabrera, D. Dick, J.-F. Veyan, R. Hourani, M. D. Halls, H. Zuilhof, Y. J. Chabal, Surface etching, chemical modification and characterization of silicon nitride and silicon oxide-selective functionalization of $Si_3N_4$ and $SiO_2$, Journal of Physics-Condensed Matter 28/9 (2016).

[43] P. Serp, P. Kalck, R. Feurer, Chemical vapor deposition methods for the controlled preparation of supported catalytic materials, Chemical Reviews 102/9 (2002) 3085.

Corresponding to Example 4

1. S. Babar, E. Mohimi, B. Trinh, G. S. Girolami and J. R. Abelson, "Surface-selective chemical vapor deposition of copper films through the use of a molecular inhibitor," ECS J. Solid State Sci. Tech. 4(7), N60-63 (2015)

Corresponding to Example 5

1 W. Dong, K. Zhang, Y. Zhang, T. Wei, Y. Sun, X. Chen and N. Dai, Sci Rep 4, 4458 (2014).
2 J.-C. Chiou, J Electrochem Soc 142 (1), 177 (1995).
3 H. K. Shin, K. M. Chi, M. J. Hampdensmith, T. T. Kodas, J. D. Farr and M. Paffett, Adv. Mater. 3 (5), 246-248 (1991).
4 Q. Tao, K. Overhage, G. Jursich and C. Takoudis, Thin Solid Films 520 (22), 6752-6756 (2012).
5 N. L. Jeon, P. G. Clem, R. G. Nuzzo and D. A. Payne, J Mater Res 10 (12), 2996-2999 (2011).
6 N. L. Jeon, P. Clem, D. Y. Jung, W. Lin, G. S. Girolami, D. A. Payne and R. G. Nuzzo, Adv. Mater. 9 (11), 891-895 (1997).
7 N. L. Jeon, R. G. Nuzzo, Y. Xia, M. Mrksich and G. M. Whitesides, Langmuir 11 (8), 3024-3026 (1995).
8 .N. L. Jeon, W. Lin, M. K. Erhardt, G. S. Girolami and R. G. Nuzzo, Langmuir 13 (14), 3833-3838 (1997).
9 M. J. Hampden-Smith and T. T. Kodas, Chem Vapor Depos 1 (2), 39-48 (1995).
10 E. Färm, M. Kemell, E. Santala, M. Ritala and M. Leskelä, J Electrochem Soc 157 (1), K10 (2010).
11 W. L. Gladfelter, Chem. Mater. 5 (10), 1372-1388 (1993).
12 W. H. Kim, F. S. Minaye Hashemi, A. J. Mackus, J. Singh, Y. Kim, D. Bobb-Semple, Y. Fan, T. Kaufman-Osborn, L. Godet and S. F. Bent, ACS Nano 10 (4), 4451-4458 (2016).
13 S. Babar, E. Mohimi, B. Trinh, G. S. Girolami and J. R. Abelson, Ecs J Solid State Sc 4 (7), N60-N63 (2015).
14 S. Jayaraman, Y. Yang, D. Y. Kim, G. S. Girolami and J. R. Abelson, J Vac Sci Technol A 23 (6), 1619-1625 (2005).
15 S. Jayaraman, E. J. Klein, Y. Yang, D. Y. Kim, G. S. Girolami and J. R. Abelson, J Vac Sci Technol A 23 (4), 631-633 (2005).
16 W. B. Wang, Y. Yang, A. Yanguas-Gil, N. N. Chang, G. S. Girolami and J. R. Abelson, Appl Phys Lett 102 (10), 101605 (2013).
17 R. Fix, R. G. Gordon and D. M. Hoffman, Chem. Mater. 5 (5), 614-619 (1993).
18 K. A. Gesheva, V. Abrosimova and G. D. Beshkov, J. Phys. IV 1 (C2), 865-871 (1991).
19 F. A. Houle and W. D. Hinsberg, The Journal of Physical Chemistry 99 (39), 14477-14485 (1995).
20 L. H. Kaplan and F. M. Dheurle, J Electrochem Soc 117 (5), 693-& (1970).
21 I. M. Watson, J. A. Connor and R. Whyman, Polyhedron 8 (13), 1794-1796 (1989).
22 S. Babar, T. T. Li and J. R. Abelson, J Vac Sci Technol A 32 (6), 060601 (2014).
23 S. Babar, N. Kumar, P. Zhang, J. R. Abelson, A. C. Dunbar, S. R. Daly and G. S. Girolami, Chem. Mater. 25 (5), 662-667 (2013).
24 W. Zheng, T. P. Cotter, P. Kaghazchi, T. Jacob, B. Frank, K. Schlichte, W. Zhang, D. S. Su, F. Schuth and R. Schlogl, J Am Chem Soc 135 (9), 3458-3464 (2013).
25 J. G. Choi, J Ind Eng Chem 10 (6), 967-971 (2004).
26 S. T. Oyama, Catal Today 15 (2), 179-200 (1992).
27 E. Mohimi, Z. Zhang, J. L. Mallek, B. L. Trinh, P. Shetty, G. S. Girolami and J. R. Abelson (in preparation)
28 L. H. Liu, D. J. Michalak, T. P. Chopra, S. P. Pujari, W. Cabrera, D. Dick, J. F. Veyan, R. Hourani, M. D. Halls, H. Zuilhof and Y. J. Chabal, J Phys Condens Matter 28 (9), 094014 (2016).
29 K. P. Reddy and T. L. Brown, J Am Chem Soc 117 (10), 2845-2854 (1995).
30 P. Serp, P. Kalck and R. Feurer, Chem Rev 102 (9), 3085-3128 (2002).
31 A. Zecchina and C. O. Aréan, Catal Rev 35 (2), 261-317 (1993).
32 A. Brenner, J Mol Catal 5 (2), 157-161 (1979).
33 Y. Liu, J. Ding, J. Sun, J. Zhang, J. Bi, K. Liu, F. Kong, H. Xiao, Y. Sun and J. Chen, Chem. Commun. 52 (28), 5030-5032 (2016).
34 Y. Ma, G. Guan, X. Hao, J. Cao and A. Abudula, Renew Sust Energ Rev 75, 1101-1129 (2017).
35 R. F. Howe, D. E. Davidson and D. A. Whan, J Chem Soc Farad T 1 68 (0), 2266 (1972).
36 J. A. Lercher, C. Gründling and G. Eder-Mirth, Catal Today 27 (3-4), 353-376 (1996).
37 G. A. Parks, Chemical Reviews 65 (2), 177-198 (1965).
38 M. G. Barthés-Labrousse, Vacuum 67 (3-4), 385-392 (2002).
39 J. Portier, P. Poizot, G. Campet, M. A. Subramanian and J. M. Tarascon, Solid State Sci 5 (5), 695-699 (2003).
40 M. Kosmulski, Adv Colloid Interface Sci 238, 1-61 (2016).
41 M. L. Machesky, in Chemical Modeling of Aqueous Systems II (American Chemical Society, 1990), Vol. 416, pp. 282-292.
42 J. Evans, B. E. Hayden and G. Lu, J Chem Soc Faraday T 92 (23), 4733 (1996).
43 K. Oshikawa, M. Nagai and S. Omi, J. Phys. Chem. B 105 (38), 9124-9131 (2001).
44 H.-G. Ang, K.-S. Chan, G.-K. Chuah, S. Jaenicke and S.-K. Neo, J Chem Soc Dalton (23), 3753 (1995).
45 A. Theolier, A. Choplin, L. D'Ornelas, J.-M. Basset, G. Zanderighi and C. Sourisseau, Polyhedron 2 (2), 119-121 (1983).
46 G. M. Zanderighi, C. Dossi, R. Ugo, R. Psaro, A. Theolier, A. Choplin, L. D'Ornelas and J. M. Basset, J Organomet Chem 296 (1-2), 127-146 (1985).
47 K. Asakura, K.-K. Bando and Y. Iwasawa, J Chem Soc Faraday T 86 (14), 2645 (1990).
48 D. K. Chakrabarty, A. Joshi, S. Unnikrishnan and P. D. Prabhawalkar, React Kinet Catal L 26 (1-2), 143-147 (1984).

49 F. Hugues, J. M. Bassett, Y. B. Taarit, A. Choplin, M. Primet, D. Rojas and A. K. Smith, J Am Chem Soc 104 (25), 7020-7024 (1982).

50 F. o. Hugues, A. K. Smith, Y. B. Taarit, J. M. Basset, D. Commereuc and Y. Chauvin, J Chem Soc Chem Comm (2), 68 (1980).

51 J. W. Klaus and S. M. George, J Electrochem Soc 147 (7), 2658 (2000).

52 W. Liao and J. G. Ekerdt, J Vac Sci Technol A 34 (4), 041514 (2016).

53 M. Xu and F. Zaera, J Vac Sci Technol A 14 (2), 415-424 (1996).

54 S. S. Sung and R. Hoffmann, J Am Chem Soc 107 (3), 578-584 (1985).

We claim:

1. A method for selectively forming a layer on a substrate, said method comprising:
providing a said substrate having a receiving surface with a first region and a second region;
preparing the first region of said receiving surface to provide for a first surface of said first region having a plurality of hydroxyl groups characterized by an average acidity;
exposing said receiving surface to an inhibitor agent, wherein:
at least a fraction of said inhibitor agent is accommodated by said first region; and
said at least a fraction of said inhibitor agent accommodated by said first region changes the average acidity of said first surface; and
contacting said receiving surface with a precursor gas, wherein:
accommodation of said precursor gas by said receiving surface results in selective formation of said layer on said second region; and
wherein said first region comprises a first portion having a primary plurality of hydroxyl groups characterized by a primary average acidity and a second portion having a secondary plurality of hydroxyl groups characterized by a secondary average acidity; and wherein said layer is formed on said first portion at a first growth rate and said layer is formed on said second portion at a second growth rate, and wherein said first growth rate is substantially different from said second growth rate; thereby selectively forming said layer on said substrate.

2. The method of claim 1, wherein said at least a fraction of said inhibitor agent accommodated by said first region reduces the average acidity of said first surface.

3. The method of claim 1, wherein said inhibitor agent comprises a substituted or an unsubstituted amine group, a substituted or an unsubstituted pyridyl group, a carbonyl group, a ketone group, a diketone group, or any combination of these.

4. The method of claim 1, wherein said first region has a composition different from that of said second region.

5. The method of claim 1, wherein said step of preparing comprises depositing a precursor layer on at least a portion of said first region.

6. The method of claim 5, said step of preparing further comprising converting at least a fraction of said precursor layer to a native oxide layer.

7. The method of claim 1, wherein said step of preparing comprises exposing said first region to a pretreatment solution.

8. The method of claim 1, said first surface of said first region having said plurality of hydroxyl groups characterized by said average acidity.

9. The method of claim 1, wherein the step of preparing comprises modifying said first region of said receiving surface via at least one treatment selected from the group consisting of chemical processing, mechanical processing, photochemical processing, electrochemical processing, thermal processing, plasma processing, and any combination thereof.

10. The method of claim 1, wherein said step of preparing comprises increasing, decreasing, or increasing and decreasing sequentially in any order a concentration of said plurality of hydroxyl groups on said first region of said receiving surface.

11. The method of claim 1, wherein the step of preparing comprises increasing, decreasing, or increasing and decreasing sequentially in any order said acidity of said plurality of hydroxyl groups.

12. The method of claim 1, wherein said first region comprises a native oxide.

13. The method of claim 1, wherein at least a portion of said first region is prepared by oxidation of a metal, metal alloy, metalloid, or alloy comprising a plurality of metalloids, or any combination of these; and wherein said first region comprises at least one: metal oxide, nonmetal oxide, mixed oxide, metal oxynitride, nonmetal oxynitride, mixed oxynitride, or any combination of these.

14. The method of claim 1, wherein at least a portion of said first region is prepared by nitridation of a metal, metal alloy, metalloid, or alloy comprising a plurality of metalloids, or any combination of these; and wherein said first region comprises at least one: metal nitride, nonmetal nitride, mixed nitride, metal oxynitride, nonmetal oxynitride, mixed oxynitride, or any combination of these.

15. The method of claim 1, wherein no detectable formation of said layer occurs on said first region.

16. The method of claim 1, wherein said average acidity of said plurality of hydroxyl groups is characterized by an isoelectric point selected from the range of 0 to 16.

17. The method of claim 1, wherein said inhibitor agent is a gas.

18. The method of claim 1, wherein said at least a fraction of said inhibitor agent remains accommodated by said first region for 0.5 to 30 minutes after said step of exposing is stopped.

19. The method of claim 1, wherein said inhibitor agent is selected from the group consisting of ammonia, dimethyl amine, methyl amine, trimethylamine, pyridine, acetylacetone, and any combination thereof.

20. The method of claim 1, wherein said second region comprises at least one of silicon, a metal, and a nitride.

21. The method of claim 1, wherein said second region further comprises a seed layer having a thickness of less than 10 nm.

22. The method of claim 1, wherein said precursor gas comprises a ligand selected from the group consisting of a CO ligand, an allyl group, an alkyl group, a cyclopentadienyl (Cp), and any combination thereof.

23. The method of claim 22, wherein said precursor gas comprises at least one metal atom.

24. The method of claim 1, wherein said precursor gas comprises a compound selected from the group consisting of $Mo(CO)_6$, $Fe(CO)_5$, $Ru_3(CO)_{12}$, $Cr(CO)_6$, $W(CO)_6$, $V(CO)_6$, $Co_2(CO)_8$, $Re_2(CO)_{10}$, $Mn_2(CO)_{10}$, $Tc_2(CO)_{10}$, $Ni(CO)_4$, $Rh(\eta_3-C_3H_5)_3$, $Rh(allyl)_3$, $Pt(allyl)_2$, $Pt(allyl)Cp$, $Ir(allyl)_3$, $Pd(allyl)_2$, $Pd(allyl)Cp$, $PtCp(CH_3)_3$, and any combination thereof.

25. The method of claim 1, wherein said layer is formed on said first region at a growth rate of at least 1 nm/min after a nucleation delay time after said step of contacting is initiated; wherein said nucleation delay time is at least 20 minutes.

26. The method of claim 1, wherein said layer comprises Fe, Mo, Ru, Ti, Cu, Al, Co, Mn, W, $MoC_xN_y$, or any combination thereof, and wherein x is a number selected from the range of 0.01 to 1 and y is a number selected from the range of 0 to 0.5.

27. The method of claim 1, wherein said layer is a diffusion barrier layer in an electronic device, a gate dielectric layer in an electronic device, an electromigration cap layer, a metal contact, or a combination of these.

28. The method of claim 1, wherein said steps of exposing and contacting are performed simultaneously.

29. The method of claim 1, wherein said precursor gas has a partial pressure less than or equal to 100 mTorr.

30. The method of claim 1, wherein said inhibitor agent has a partial pressure less than or equal to 300 mTorr.

31. The method of claim 1, wherein said inhibitor agent is characterized by a pKa greater than or substantially equal to 9.

32. The method of claim 1, wherein at least a fraction of said inhibitor agent is accommodated by said first region via reversible adsorption.

33. The method of claim 1, wherein at least a fraction of said inhibitor agent is accommodated by said first region via physisorption or chemisorption.

34. The method of claim 1, wherein at least a fraction of said inhibitor agent accommodated by said first region undergoes hydrogen bonding with said plurality of hydroxyl groups.

35. The method of claim 1, wherein at least a fraction of said inhibitor agent accommodated by said first region changes the amount of nucleation sites available for nucleation of the layer via the precursor gas.

36. The method of claim 1, wherein said steps of exposing and contacting are performed sequentially.

* * * * *